United States Patent
Hosoi et al.

(10) Patent No.: US 8,497,492 B2
(45) Date of Patent: Jul. 30, 2013

(54) VARIABLE RESISTIVE ELEMENT, AND ITS MANUFACTURING METHOD

(75) Inventors: Yasunari Hosoi, Fukuyama (JP); Kazuya Ishihara, Kurashiki (JP); Takahiro Shibuya, Fukuyama (JP); Tetsuya Ohnishi, Ikoma-gun (JP); Takashi Nakano, Fukuyama (JP)

(73) Assignee: Xenogenic Development Limited Liability Company, Wilmington, DE (US)

( * ) Notice: Subject to any disclaimer, the term of this patent is extended or adjusted under 35 U.S.C. 154(b) by 417 days.

(21) Appl. No.: 12/298,818

(22) PCT Filed: Feb. 23, 2007

(86) PCT No.: PCT/JP2007/053358
§ 371 (c)(1),
(2), (4) Date: Oct. 28, 2008

(87) PCT Pub. No.: WO2007/125674
PCT Pub. Date: Nov. 8, 2007

(65) Prior Publication Data
US 2009/0200640 A1    Aug. 13, 2009

(30) Foreign Application Priority Data

Apr. 28, 2006    (JP) .................................. 2006-125432

(51) Int. Cl.
*H01L 47/00*    (2006.01)
(52) U.S. Cl.
USPC ............ 257/4; 257/5; 257/751; 257/E29.326; 257/E45.002; 257/E21.004

(58) Field of Classification Search
USPC .......................... 257/4–5, 751; 333/4–5, 751
See application file for complete search history.

(56) References Cited

U.S. PATENT DOCUMENTS

| | | | |
|---|---|---|---|
| 6,031,287 | A | 2/2000 | Harshfield |
| 6,204,139 | B1 | 3/2001 | Liu et al. |

(Continued)

FOREIGN PATENT DOCUMENTS

| | | |
|---|---|---|
| JP | 2002-537627 | 11/2002 |
| JP | 2003-332530 | 11/2003 |

(Continued)

OTHER PUBLICATIONS

International Search Report for PCT/JP2007/053358 mailed May 15, 2007.

(Continued)

*Primary Examiner* — Ahmed Sefer

(57) ABSTRACT

A variable resistive element comprising a configuration that an area of an electrically contributing region of a variable resistor body is finer than that constrained by an upper electrode or a lower electrode and its manufacturing method are provided. A bump electrode material is formed on a lower electrode arranged on a base substrate. The bump electrode material is contacted to a variable resistor body at a surface different from a contact surface to the lower electrode. The variable resistor body is contacted to an upper electrode at a surface different from a contact surface to the bump electrode material. Thus, a cross point region between the bump electrode material (the variable resistor body) and the upper electrode becomes an electrically contributing region of the variable resistor body, and then an area thereof can be reduced compared with that of the region regarding the conventional variable resistive element.

21 Claims, 46 Drawing Sheets

U.S. PATENT DOCUMENTS

| | | |
|---|---|---|
| 6,605,821 B1 | 8/2003 | Lee et al. |
| 6,815,744 B1 | 11/2004 | Beck et al. |
| 7,115,973 B1 * | 10/2006 | Naem .......................... 257/621 |
| 7,696,508 B2 * | 4/2010 | Song et al. ........................ 257/4 |
| 7,943,502 B2 * | 5/2011 | Park et al. ..................... 438/597 |
| 8,115,586 B2 * | 2/2012 | Hosoi et al. ..................... 338/20 |
| 2003/0047764 A1 * | 3/2003 | Joo .............................. 257/295 |
| 2004/0245557 A1 | 12/2004 | Seo et al. |
| 2005/0167645 A1 * | 8/2005 | Kim et al. ......................... 257/2 |
| 2006/0011902 A1 * | 1/2006 | Song et al. ........................ 257/4 |
| 2006/0113520 A1 * | 6/2006 | Yamamoto et al. ............... 257/3 |
| 2006/0125108 A1 * | 6/2006 | Gutsche et al. ................ 257/774 |
| 2007/0025226 A1 * | 2/2007 | Park et al. ..................... 369/100 |
| 2007/0040203 A1 * | 2/2007 | Lee et al. ....................... 257/303 |
| 2007/0096074 A1 * | 5/2007 | Asano et al. ...................... 257/4 |
| 2007/0158633 A1 * | 7/2007 | Lai et al. ........................... 257/4 |
| 2008/0157053 A1 * | 7/2008 | Lai et al. ........................... 257/4 |
| 2009/0236581 A1 * | 9/2009 | Yoshida et al. ................... 257/2 |

FOREIGN PATENT DOCUMENTS

| | | |
|---|---|---|
| JP | 2004-241535 | 8/2004 |
| JP | 2004-241535 A | 8/2004 |
| JP | 2004-363604 | 12/2004 |
| JP | 2005-120421 | 5/2005 |
| JP | 2005-120421 A | 5/2005 |

OTHER PUBLICATIONS

S.Q. Liu et al. "Electic-Pulse-Induced Reversible Resistance Change Effect in Magnetoresistive Films", Applied Physics Letters, vol. 76, pp. 2749-2751 (2000).

H. Pagnia et al., "Bistable Switching in Electroformed Metal-Insulator-Metal Devices", Phys. Stat. Sol. (a), vol. 108, pp. 11-65 (1988).

I.G. Baek et al., "Highly Scalable Non-Volatile Resistive Memory Using Simple Binary Oxide Driven by Asymmetric Unipolar Voltage Pulses", IEDM 04, pp. 587-590 (2004).

Y.H. Ha et al., "An Edge Contact Type Cell for Phase Change RAM Featuring Very Low Power Consumption", 2003 Symposium on VLSI Technology Digest of Technical Papers, Jun. 2003.

* cited by examiner

Fig. 3A
Cross-sectional View along the Line X-X'
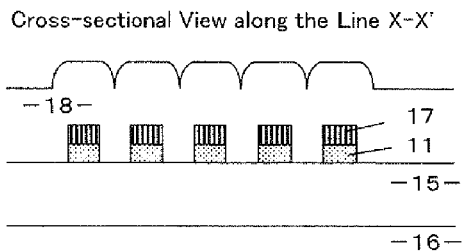
Cross-sectional View along the Line Y-Y'
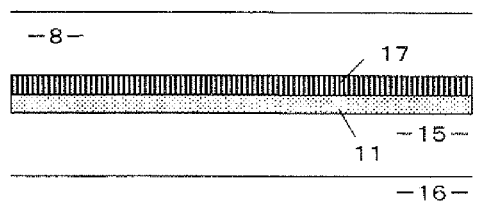
Fig. 3B
Cross-sectional View along the Line X-X'
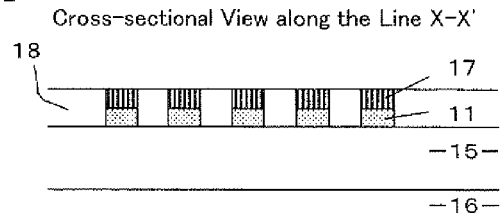
Cross-sectional View along the Line Y-Y'
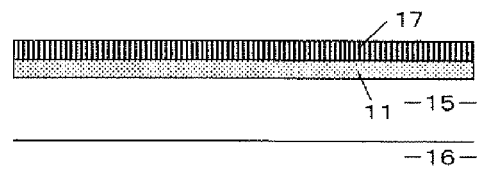
Fig. 3C
Cross-sectional View along the Line X-X'
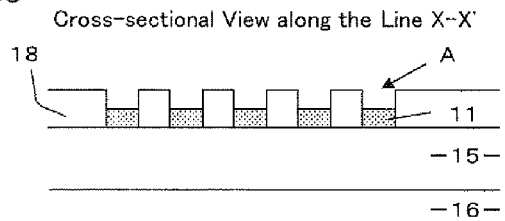
Cross-sectional View along the Line Y-Y'
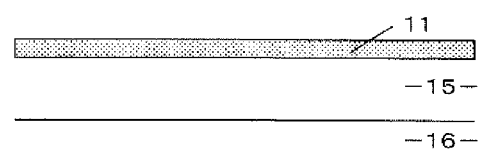
Fig. 3D
Cross-sectional View along the Line X-X'
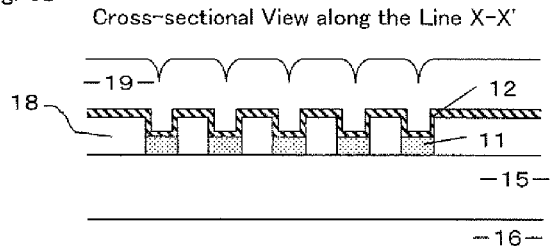
Cross-sectional View along the Line Y-Y'
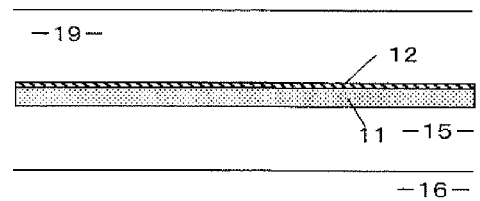

Fig. 4E
Cross-sectional View along the Line X-X'
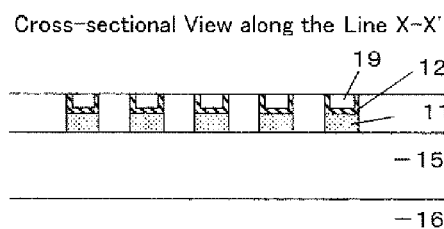
Cross-sectional View along the Line Y-Y'
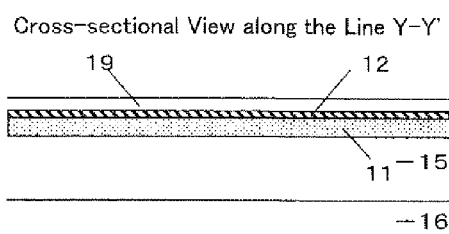
Fig. 4F
Cross-sectional View along the Line X-X'
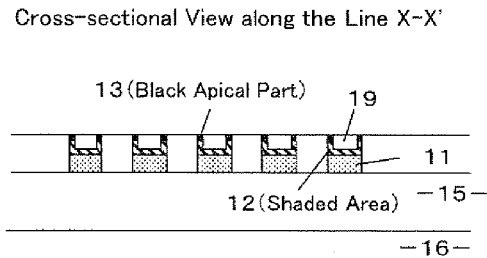
Cross-sectional View along the Line Y-Y'
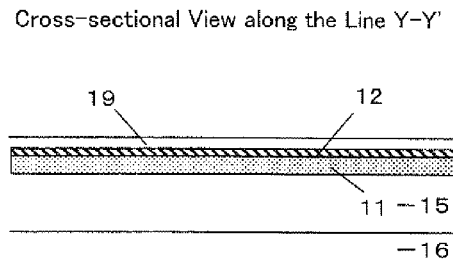
Fig. 4G
Cross-sectional View along the Line X-X'
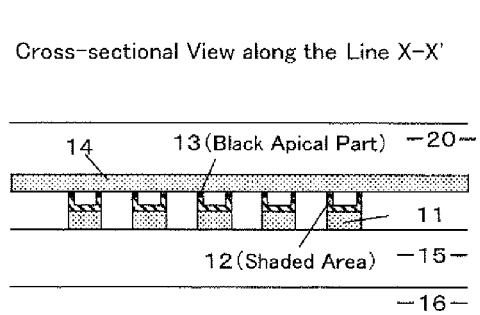
Cross-sectional View along the Line Y-Y'
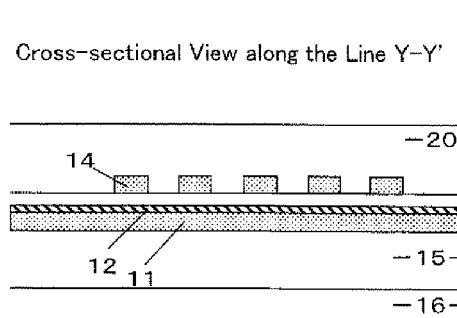

Fig. 7A
Cross-sectional View along the Line X-X'
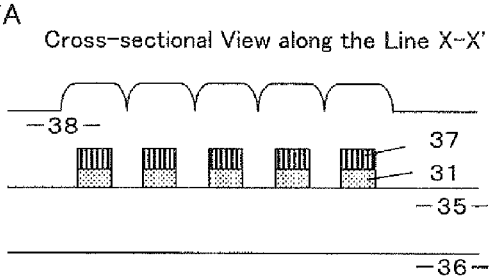
Cross-sectional View along the Line Y-Y'
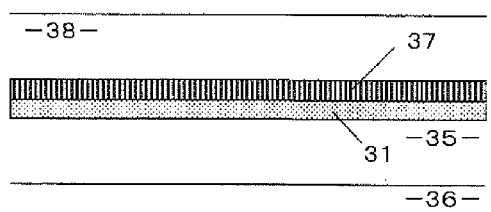
Fig. 7B
Cross-sectional View along the Line X-X'
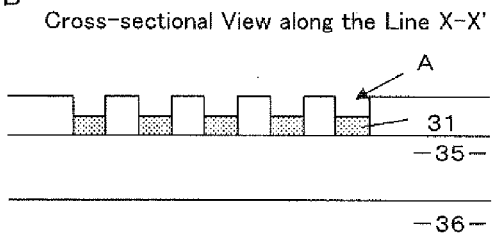
Cross-sectional View along the Line Y-Y'
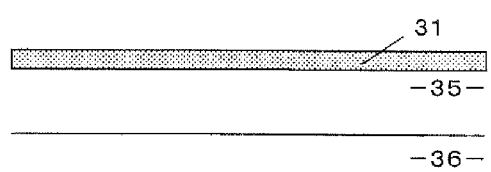
Fig. 7C
Cross-sectional View along the Line X-X'
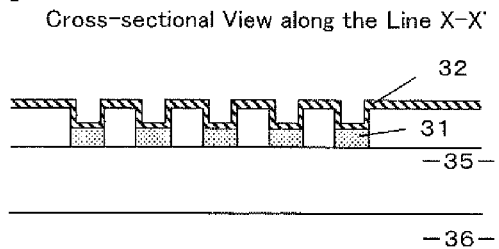
Cross-sectional View along the Line Y-Y'
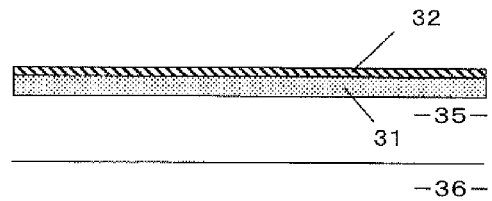
Fig. 7D
Cross-sectional View along the Line X-X'
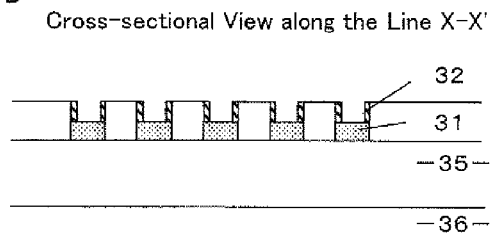
Cross-sectional View along the Line Y-Y'
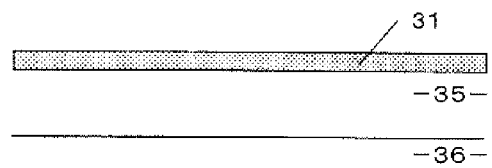

Fig. 8E
Cross-sectional View along the Line X-X'
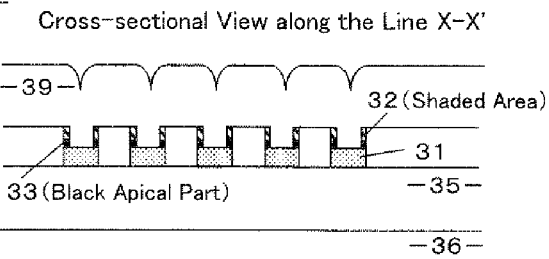
Cross-sectional View along the Line Y-Y'
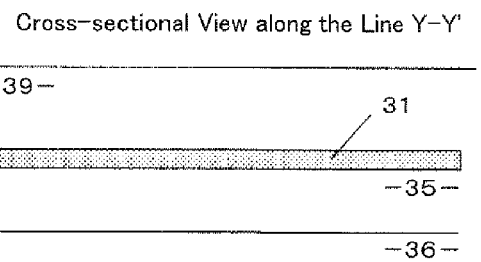
Fig. 8F
Cross-sectional View along the Line X-X'
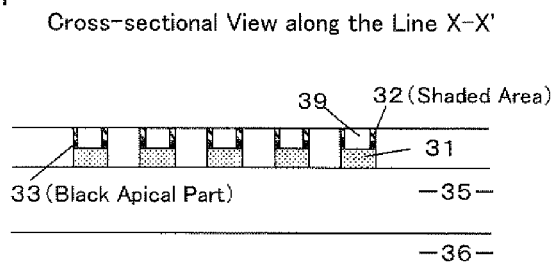
Cross-sectional View along the Line Y-Y'
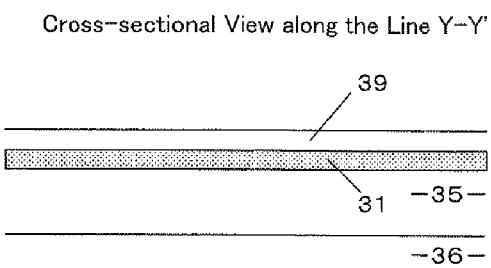
Fig. 8G
Cross-sectional View along the Line X-X'
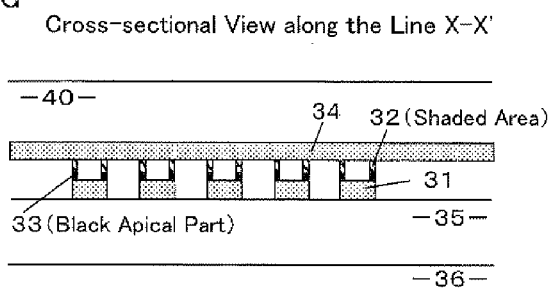
Cross-sectional View along the Line Y-Y'
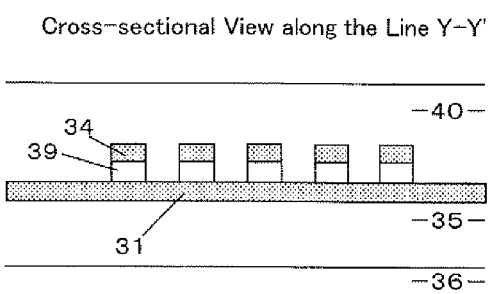

Fig. 10A
Cross-sectional View along the Line X-X'
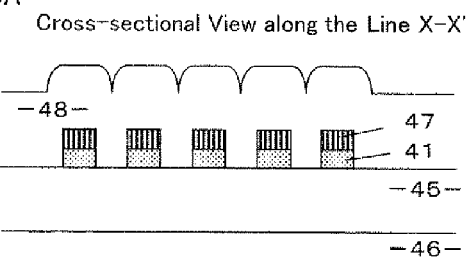
Cross-sectional View along the Line Y-Y'
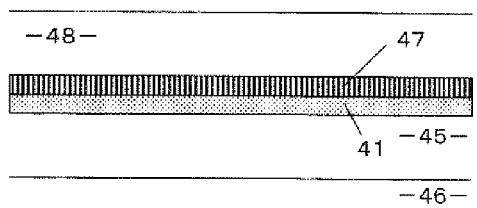
Fig. 10B
Cross-sectional View along the Line X-X'
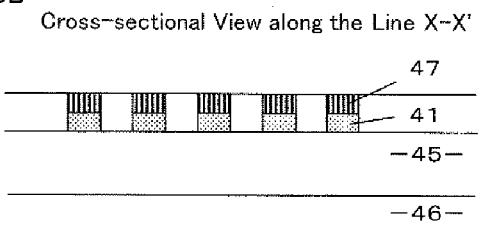
Cross-sectional View along the Line Y-Y'
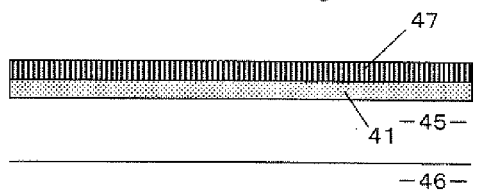
Fig. 10C
Cross-sectional View along the Line X-X'
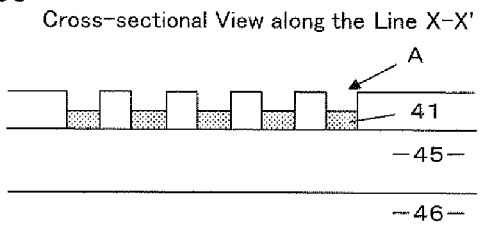
Cross-sectional View along the Line Y-Y'
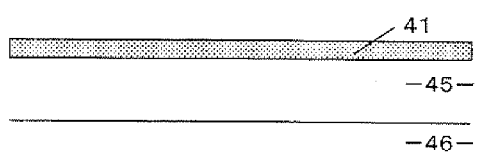
Fig. 10D
Cross-sectional View along the Line X-X'
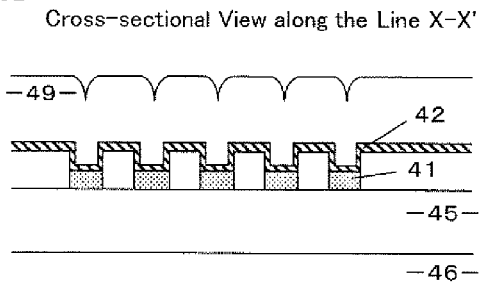
Cross-sectional View along the Line Y-Y'
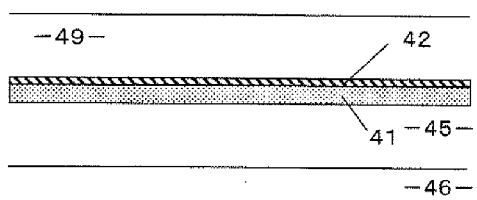

Fig. 11E
Cross-sectional View along the Line X-X'
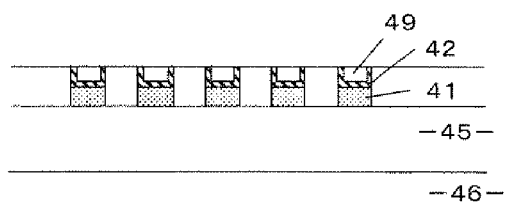
Cross-sectional View along the Line Y-Y'
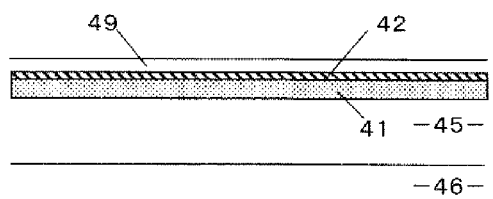
Fig. 11F
Cross-sectional View along the Line X-X'
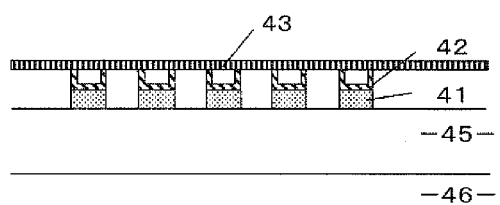
Cross-sectional View along the Line Y-Y'
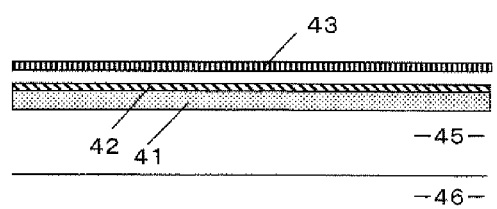
Fig. 11G
Cross-sectional View along the Line X-X'
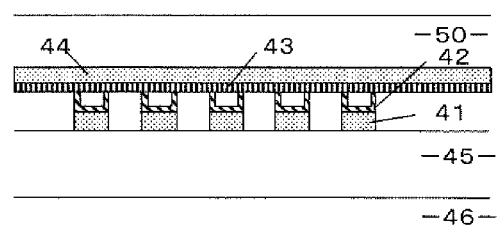
Cross-sectional View along the Line Y-Y'
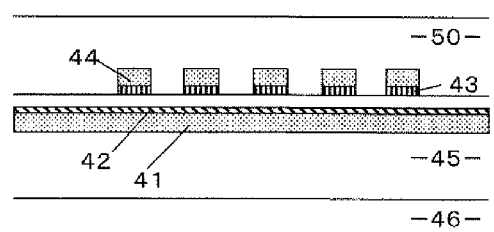

Fig. 13A
Cross-sectional View along the Line X-X'
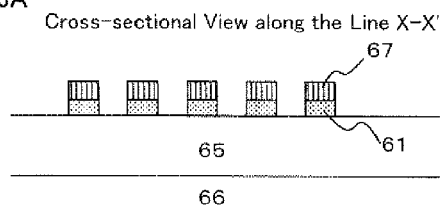
Cross-sectional View along the Line Y-Y'
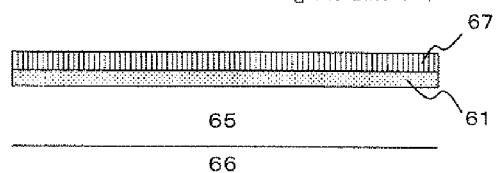
Fig. 13B
Cross-sectional View along the Line X-X'
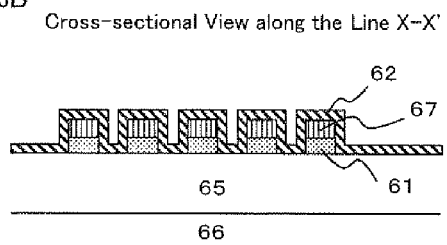
Cross-sectional View along the Line Y-Y'
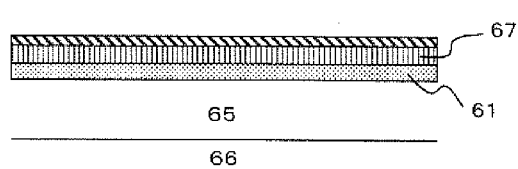
Fig. 13C
Cross-sectional View along the Line X-X'
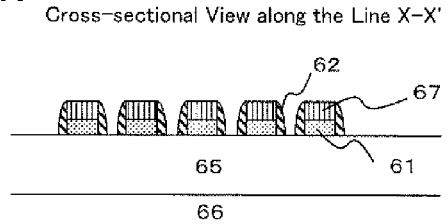
Cross-sectional View along the Line Y-Y'
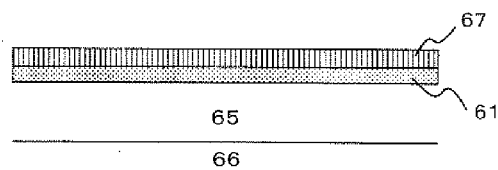
Fig. 13D
Cross-sectional View along the Line X-X'
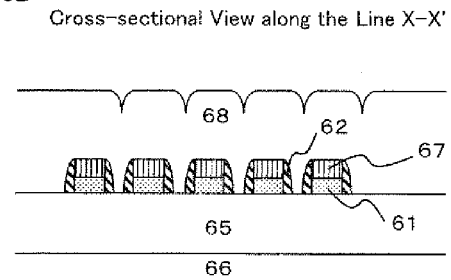
Cross-sectional View along the Line Y-Y'
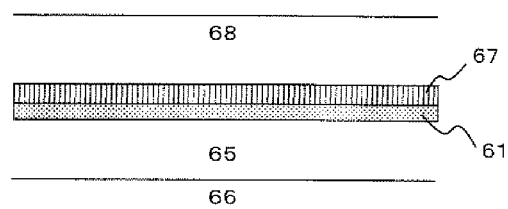

Fig. 14E
Cross-sectional View along the Line X-X'
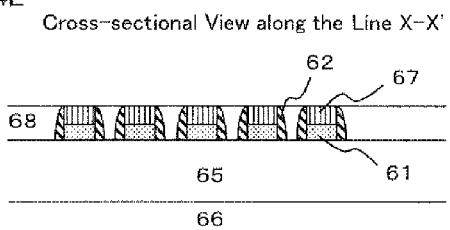
Cross-sectional View along the Line Y-Y'
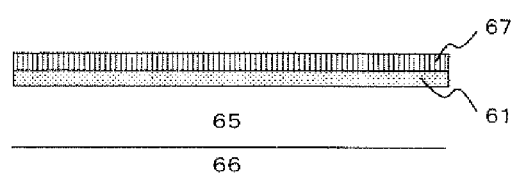
Fig. 14F
Cross-sectional View along the Line X-X'
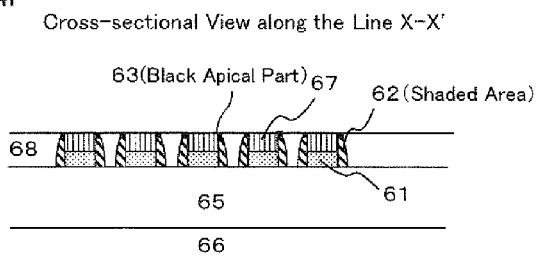
Cross-sectional View along the Line Y-Y'
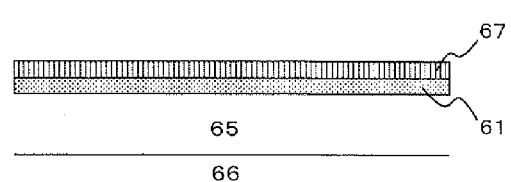
Fig. 14G
Cross-sectional View along the Line X-X'
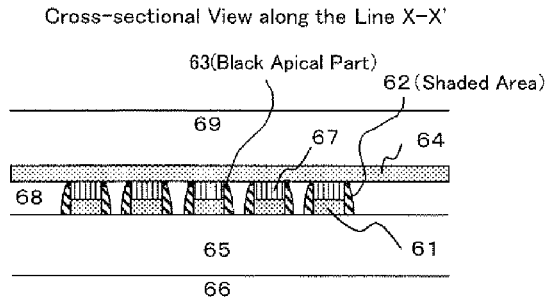
Cross-sectional View along the Line Y-Y'
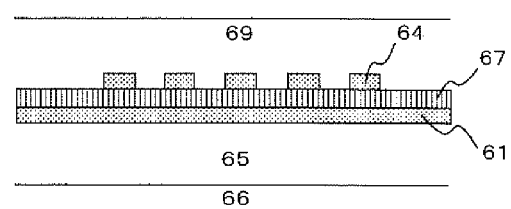

Fig. 20A
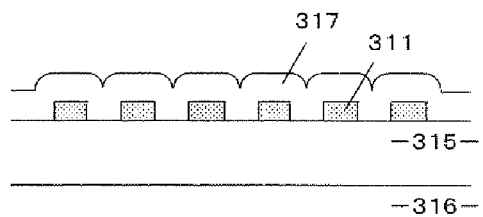
Cross-sectional View along the Line X-X'
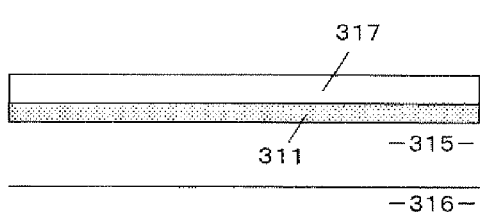
Cross-sectional View along the Line Y-Y'
Fig. 20B
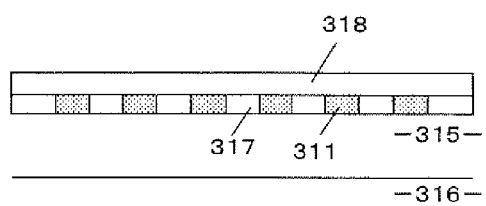
Cross-sectional View along the Line X-X'
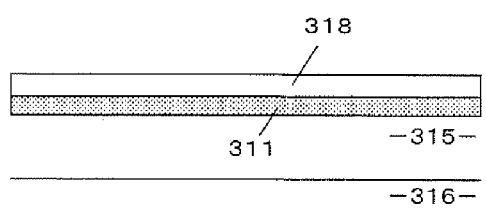
Cross-sectional View along the Line Y-Y'
Fig. 20C
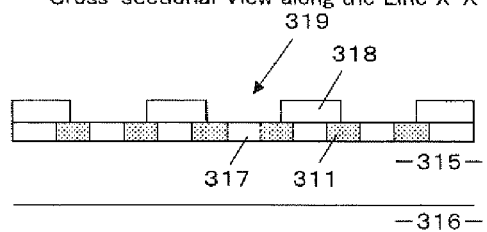
Cross-sectional View along the Line X-X'
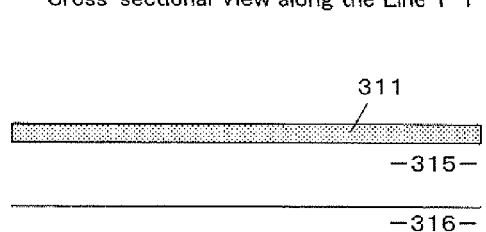
Cross-sectional View along the Line Y-Y'
Fig. 20D
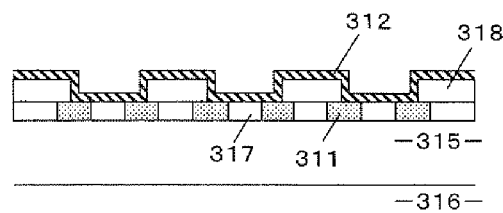
Cross-sectional View along the Line X-X'
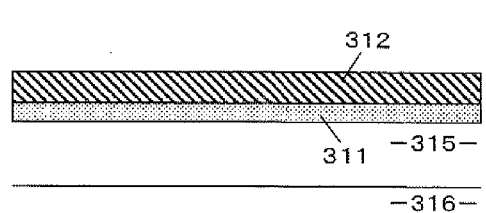
Cross-sectional View along the Line Y-Y'

Fig. 21E  Cross-sectional View along the Line X-X'       Cross-sectional View along the Line Y-Y'
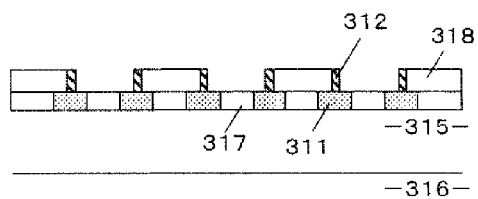 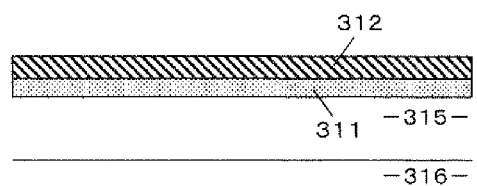
Fig. 21F  Cross-sectional View along the Line X-X'       Cross-sectional View along the Line Y-Y'
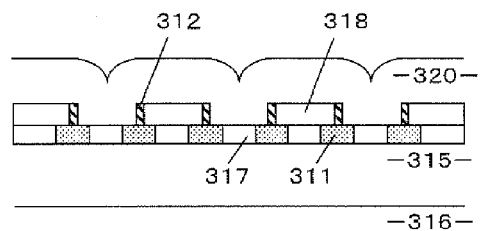 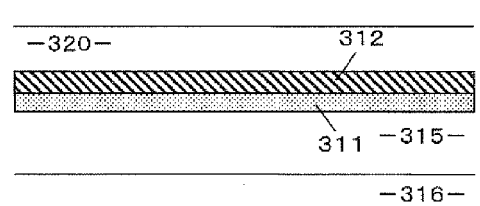
Fig. 21G  Cross-sectional View along the Line X-X'       Cross-sectional View along the Line Y-Y'
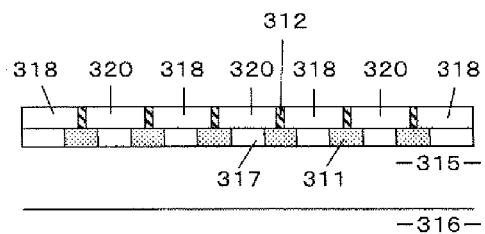 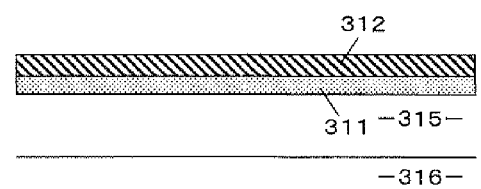
Fig. 21H  Cross-sectional View along the Line         Cross-sectional View along the Line Y-Y'
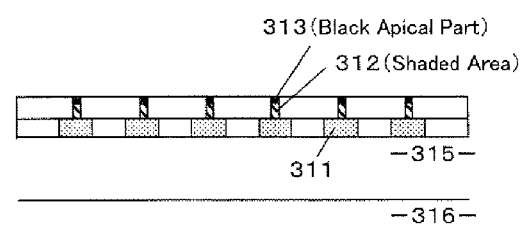 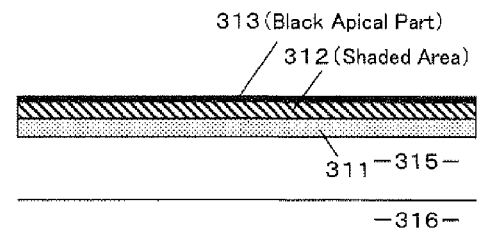

Fig. 22I
Cross-sectional View along the Line X-X'
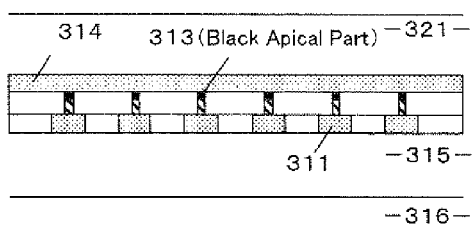
Cross-sectional View along the Line Y-Y'
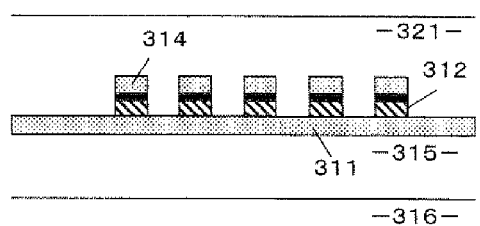

Fig. 26A   Cross-sectional View along the Line X-X'   Cross-sectional View along the Line Y-Y'
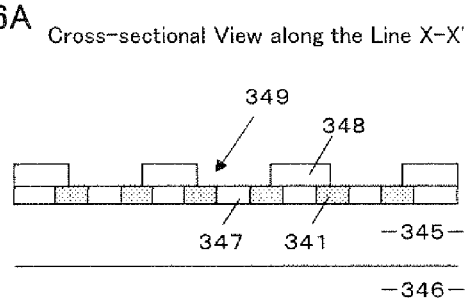
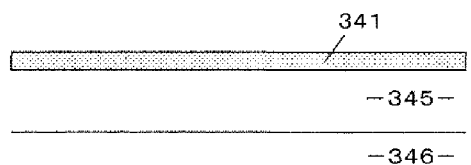
Fig. 26B   Cross-sectional View along the Line X-X'   Cross-sectional View along the Line Y-Y'
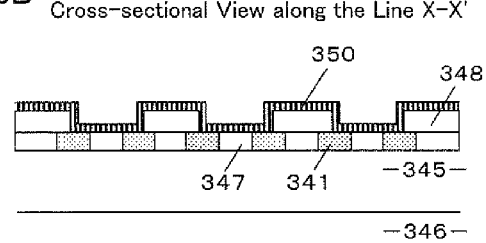
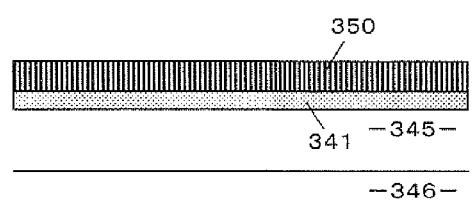
Fig. 26C   Cross-sectional View along the Line X-X'   Cross-sectional View along the Line Y-Y'
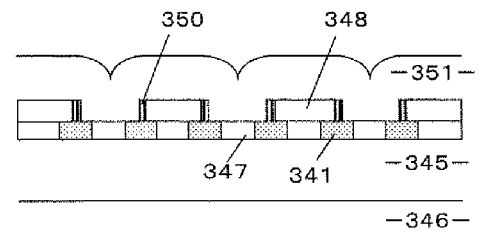
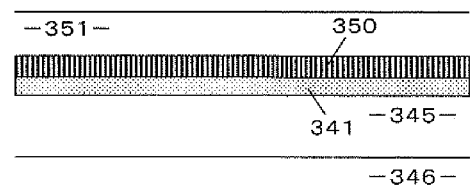
Fig. 26D   Cross-sectional View along the Line X-X'   Cross-sectional View along the Line Y-Y'
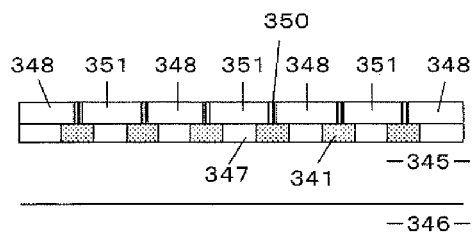
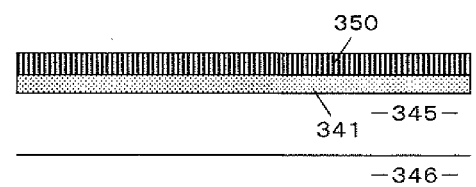

Fig. 27E
Cross-sectional View along the Line X-X'
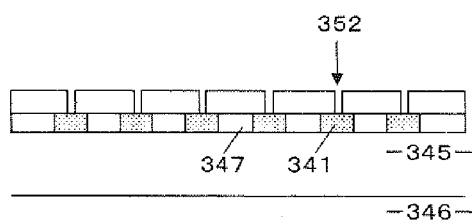
Cross-sectional View along the Line Y-Y'
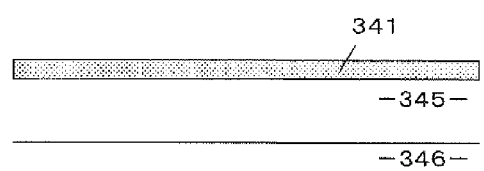
Fig. 27F
Cross-sectional View along the Line X-X'
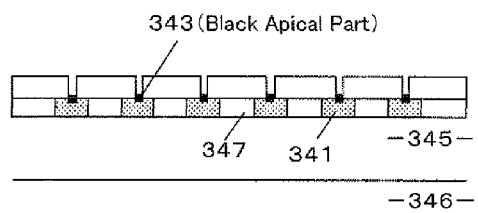
Cross-sectional View along the Line Y-Y'
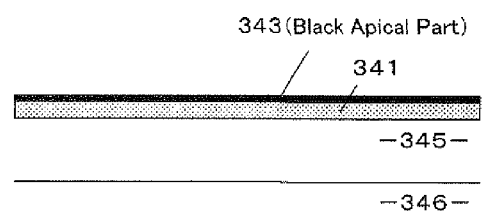
Fig. 27G
Cross-sectional View along the Line X-X'
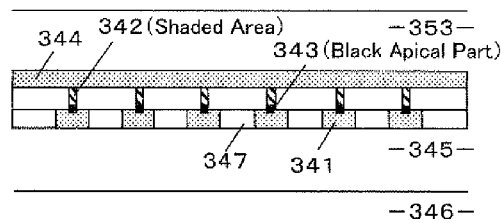
Cross-sectional View along the Line Y-Y'
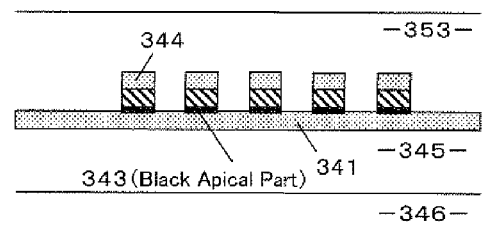

Fig. 29A
Cross-sectional View along the Line X-X'
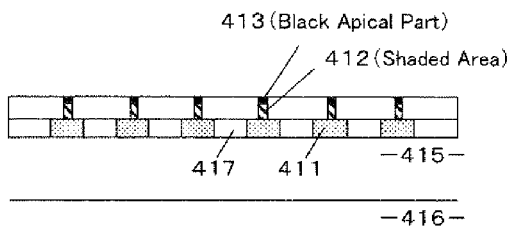
Cross-sectional View along the Line Y-Y'
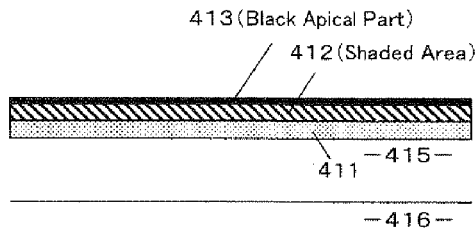
Fig. 29B
Cross-sectional View along the Line X-X'
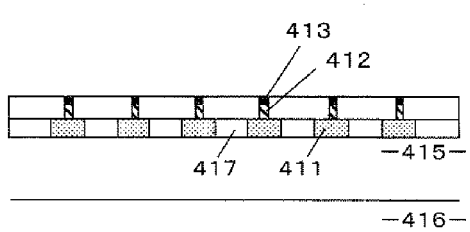
Cross-sectional View along the Line Y-Y'
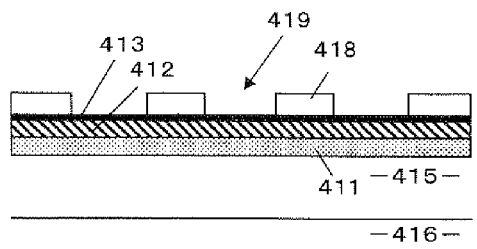
Fig. 29C
Cross-sectional View along the Line X-X'
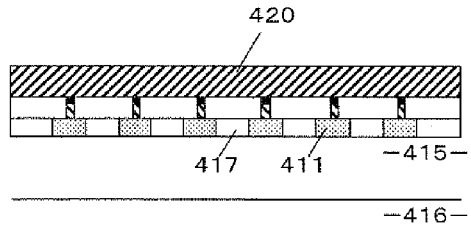
Cross-sectional View along the Line Y-Y'
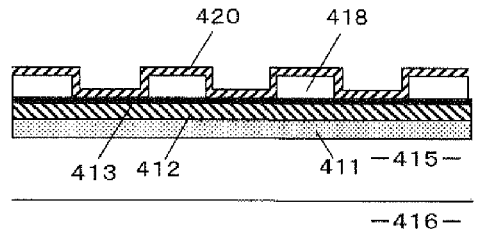
Fig. 29D
Cross-sectional View along the Line X-X'
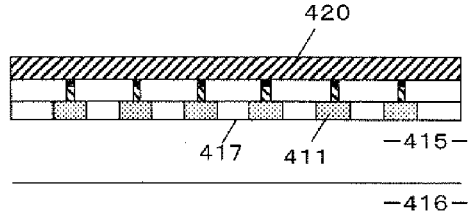
Cross-sectional View along the Line Y-Y'
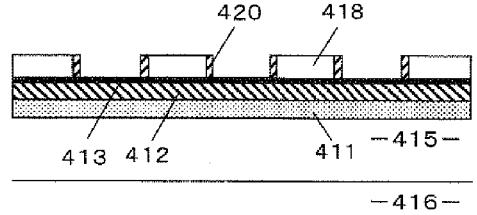

Fig. 30E  Cross-sectional View along the Line X-X'    Cross-sectional View along the Line Y-Y'
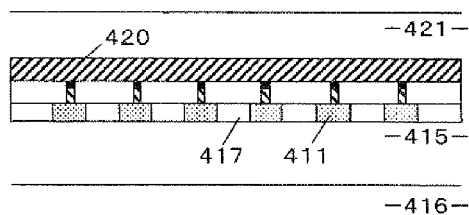
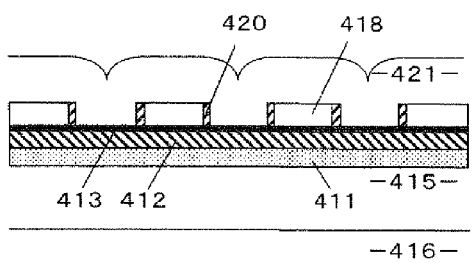
Fig. 30F  Cross-sectional View along the Line X-X'    Cross-sectional View along the Line Y-Y'
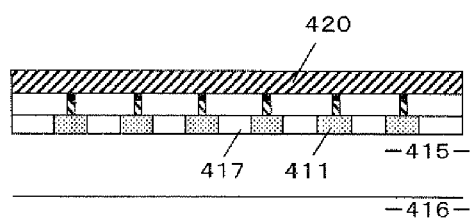
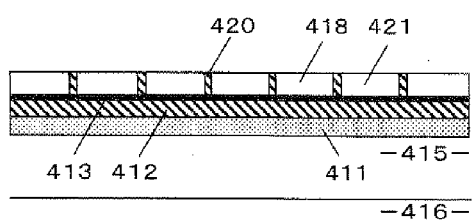
Fig. 30G  Cross-sectional View along the Line X-X'    Cross-sectional View along the Line Y-Y'
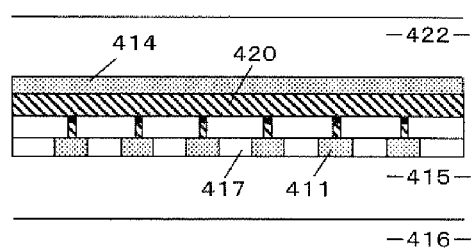
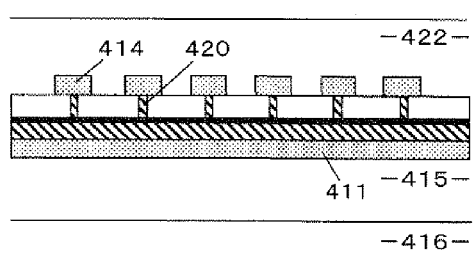

Fig. 33A  Cross-sectional View along the Line X-X'    Cross-sectional View along the Line Y-Y'
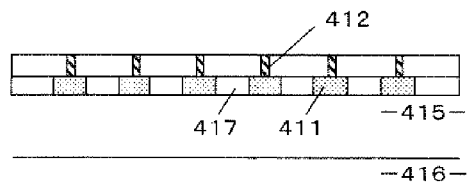 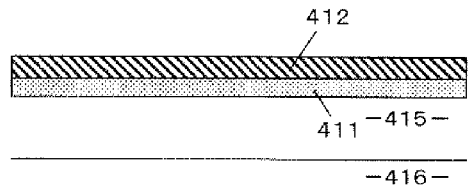
Fig. 33B  Cross-sectional View along the Line X-X'    Cross-sectional View along the Line Y-Y'
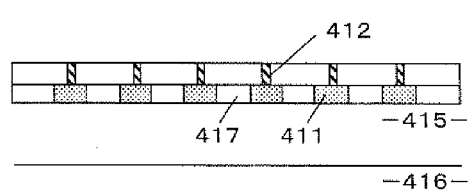 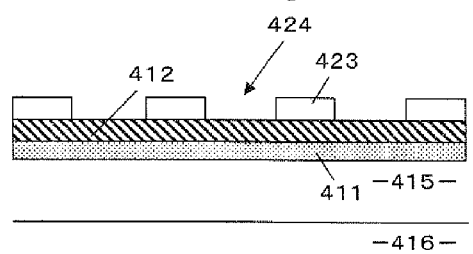
Fig. 33C  Cross-sectional View along the Line X-X'    Cross-sectional View along the Line Y-Y'
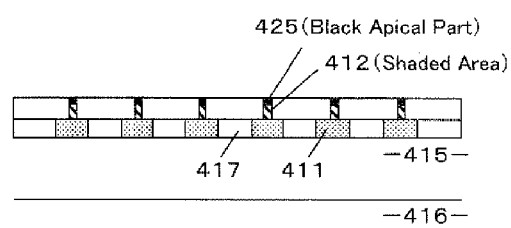 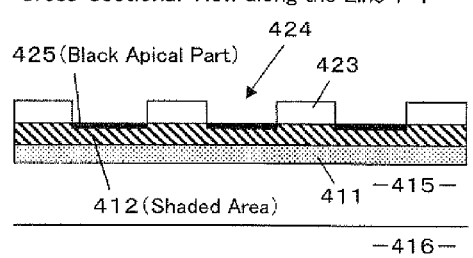
Fig. 33D  Cross-sectional View along the Line X-X'    Cross-sectional View along the Line Y-Y'
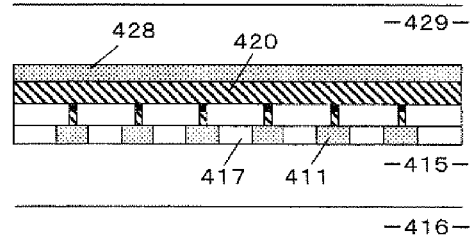 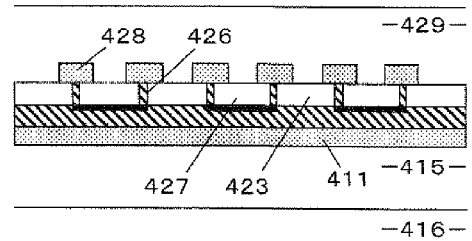

Fig. 35A
Cross-sectional View along the Line X-X'        Cross-sectional View along the Line Y-Y'
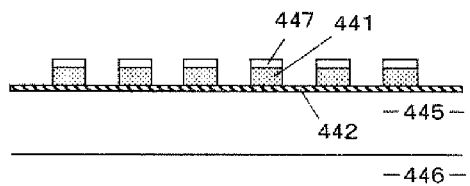
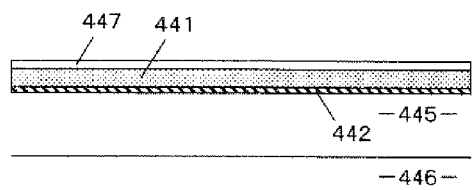
Fig. 35B
Cross-sectional View along the Line X-X'        Cross-sectional View along the Line Y-Y'
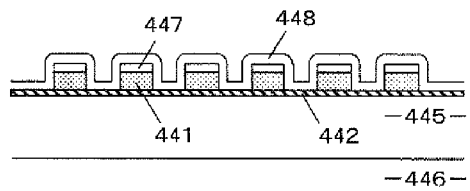
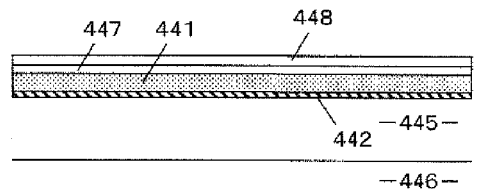
Fig. 35C
Cross-sectional View along the Line X-X'        Cross-sectional View along the Line Y-Y'
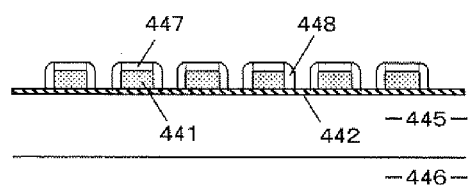
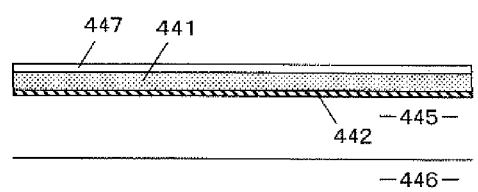
Fig. 35D
Cross-sectional View along the Line X-X'        Cross-sectional View along the Line Y-Y'
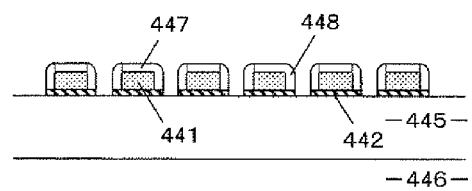
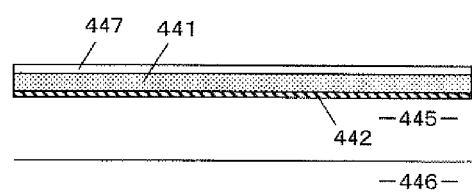

Fig. 36E  Cross-sectional View along the Line X-X'     Cross-sectional View along the Line Y-Y'
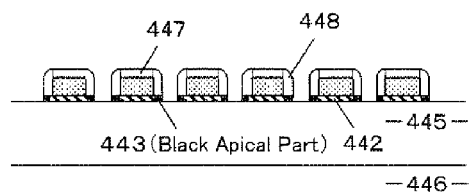
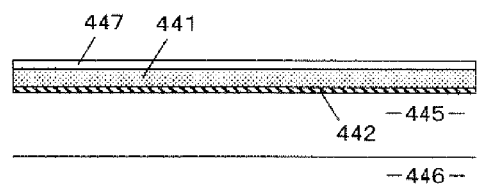
Fig. 36F  Cross-sectional View along the Line X-X'     Cross-sectional View along the Line Y-Y'
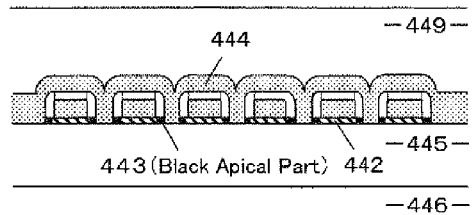
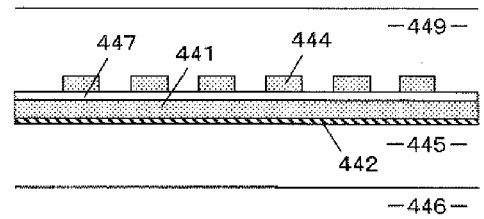

Fig. 39A
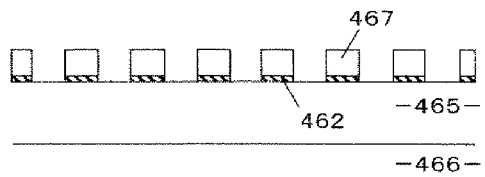
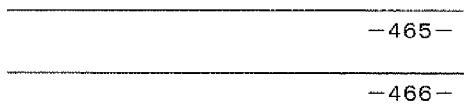
Fig. 39B
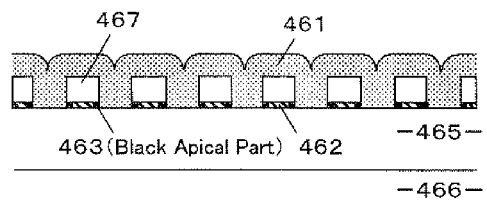
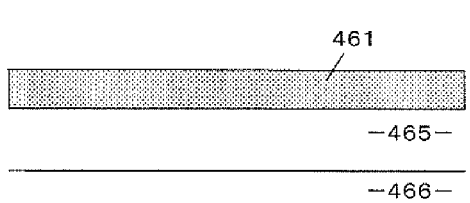
Fig. 39C
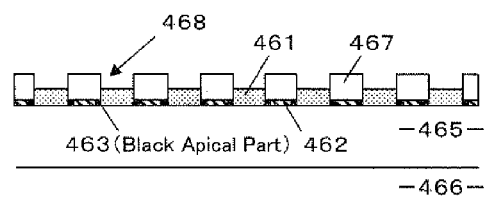
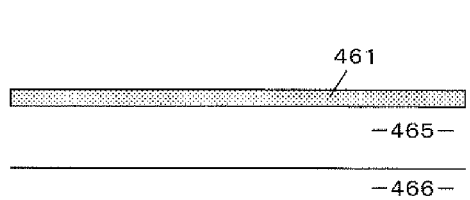
Fig. 39D
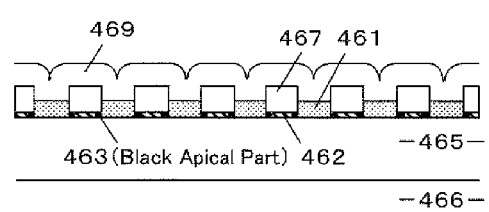
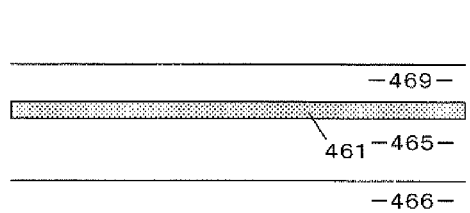

Fig. 40E    Cross-sectional View along the Line X-X'         Cross-sectional View along the Line Y-Y'
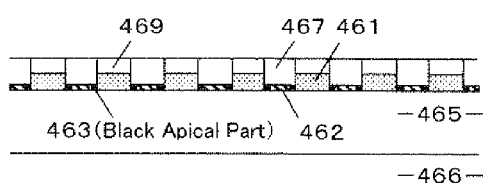
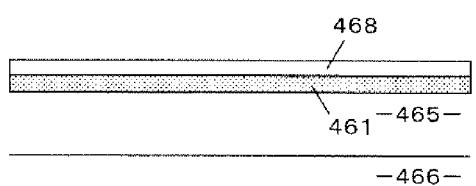
Fig. 40F    Cross-sectional View along the Line X-X'         Cross-sectional View along the Line Y-Y'
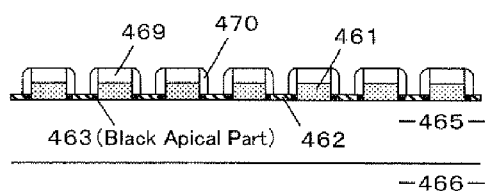
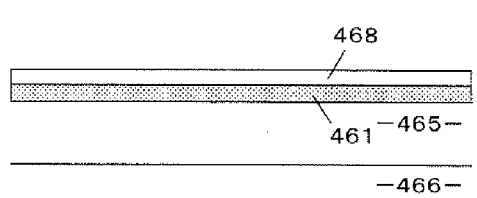
Fig. 40G    Cross-sectional View along the Line X-X'         Cross-sectional View along the Line Y-Y'
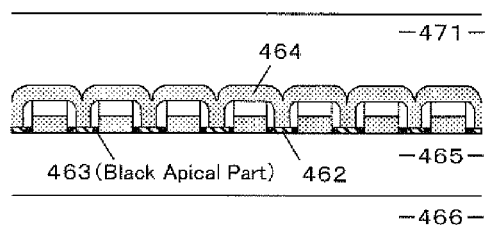
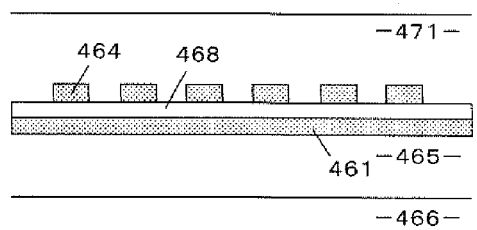

VARIABLE RESISTIVE ELEMENT, AND ITS MANUFACTURING METHOD

CROSS-REFERENCE TO RELATED APPLICATIONS

This application is a National Phase filing under 35 U.S.C. §371 of International Application No. PCT/JP2007/053358 filed on Feb. 23, 2007, and which claims priority to Japanese Patent Application No. 2006-125432 filed on Apr. 28, 2006.

TECHNICAL FIELD

The present invention relates to a variable resistive element comprising an electrode, another electrode and a variable resistor body, wherein the variable resistor body is provided between the one electrode and the other electrode, and an electrical resistance of the variable resistive element is changed by applying a voltage pulse between both of the electrodes, and relates to its manufacturing method.

BACKGROUND ART

In recent years, a variety of device structures are presented, such as a ferroelectric random access memory (FeRAM), a magnetic RAM (MRAM), a phase change RAM (PRAM), or the like, as a next generation nonvolatile RAM (NVRAM) for fast operation possible taking the place of a flash memory. And then a keen development race is performed from points of view of a higher performance, a higher reliability, a lower cost and a higher integrity of manufacturing processes. However, each of such the current memory devices has both advantages and disadvantages respectively, and it is still a long way away from realizing an ideal universal memory having every advantage of a static RAM (SRAM), a dynamic RAM (DRAM) and the flash memory.

On the contrary to such the conventional technologies, there is presented a nonvolatile resistive random access memory (RRAM) using a variable resistive element wherein an electrical resistance of the variable resistive element is changed reversibly by applying a voltage pulse thereto. Here, a configuration of such the conventional variable resistive element is shown in FIG. 42.

Such the variable resistive element comprising the conventional configuration includes a structure that a lower electrode 203, a variable resistor body 202 and an upper electrode 201 are layered in order, and has a property that a resistance value is changed reversibly by applying the voltage pulse between the upper electrode 201 and the lower electrode 203, as shown in FIG. 42. And then it comprises a configuration for being able to realize a novel nonvolatile semiconductor memory device by reading out the resistance value to be changed by such the operation of reversible changing in electrical resistance (referred to as a switching operation hereinafter).

Such the nonvolatile semiconductor memory device is comprised by forming a memory cell array with arranging each of a plurality of memory cells comprising a variable resistive element for each in a row direction and a column direction as a matrix form, and by arranging peripheral circuits to control programming, erasing and reading out operations for each of the memory cell in such the memory cell array. Moreover, for such the memory cell, there is provided such as a memory cell comprised of one selective transistor (T) and one variable resistive element (R) as it is called an 1T/1R type, a memory cell comprised of one variable resistive element (R) as it is called an 1R type, or the like, from a point of view of configuration element difference thereof. Here, a configuration example of the memory cell of 1T/1R type is shown in FIG. 43.

FIG. 43 is an equivalent circuit diagram showing one configuration example of a memory cell array using memory cells of 1T/1R type. In each of the memory cells, a gate electrode of the selective transistor (T) is connected to each of word lines WL1 to WLn respectively, and a source region of the selective transistor (T) is connected to each of source lines SL1 to SLn respectively, as (n) is a natural number. Moreover, one electrode of the variable resistive element (R) in each of the memory cells is connected to a drain region of the selective transistor (T) respectively, and another electrode of the variable resistive element (R) is connected to each of bit lines BL1 to BLm respectively, as (m) is a natural number.

Moreover, each of the word lines WL1 to WLn is connected to a word line decoder 206 respectively, each of the source lines SL1 to SLn is connected to a source line decoder 207 respectively, and each of the bit lines BL1 to BLm is connected to a bit line decoder 205 respectively. Furthermore, there is provided a configuration that a predetermined bit line, word line, or source line is to be selected corresponding to an address input (not shown) for a programming operation, an erasing operation, or a reading out operation respectively, regarding a predetermined memory cell in a memory cell array 204.

FIG. 44 is a cross sectional pattern diagram showing one memory cell comprising the memory cell array 204 as shown in FIG. 43. According to the present configuration, one memory cell is to be comprised of one selective transistor (T) and one variable resistive element (R). Moreover, the selective transistor (T) is comprised of a gate insulating film 213, a gate electrode 214, a drain diffusion layer region 215 and a source diffusion layer region 216, and then it is formed on a top surface of a semiconductor substrate 211 where an element isolation region 212 is formed. Furthermore, the variable resistive element (R) is comprised of a lower electrode 218, a variable resistor body 219 and an upper electrode 220. According to the present embodiment, the variable resistor body 219 is arranged inside an open part arranged between the lower electrode 218 and the upper electrode 220, however, it may also available that such the elements are arranged in order from the top to be a terraced structure as shown in FIG. 42.

Moreover, the gate electrode 214 in the transistor (T) comprises a word line, and a source line wiring 224 is electrically connected to the source diffusion layer region 216 in the transistor (T) via a contact plug 222. Furthermore, a bit line wiring 223 is electrically connected to the upper electrode 220 in the variable resistive element (R) via a contact plug 221, meanwhile, the lower electrode 218 is electrically connected to the drain diffusion layer region 215 in the transistor (T) via a contact plug 217.

Thus, there is provided a configuration that the transistor becomes to be an on state in the selected memory cell using a change in electric potential of the word line, and it becomes able to program or erase selectively regarding the variable resistive element (R) in the selected memory cell using the change in electric potential of the bit line, by arranging the selective transistor (T) and the variable resistive element (R) as a series connection.

FIG. 45 is an equivalent circuit diagram showing one configuration example of a memory cell array using memory cells of 1R type. Each of the memory cells consists of one variable resistive element (R), wherein one electrode in each of the variable resistive elements (R) is connected to each of word lines WL1 to WLn respectively, and another electrode is connected to each of bit lines BL1 to BLm respectively. Moreover, each of the word lines WL1 to WLn is connected to a word line decoder 233 respectively, and each of the bit lines BL1 to BLm is connected to a bit line decoder 232 respectively. Furthermore, there is provided a configuration that a predetermined bit line or word line is to be selected corresponding to an address input (not shown) for a programming operation, an erasing operation, or a reading out operation respectively, regarding a predetermined memory cell in a memory cell array 231.

FIG. 46 is a diagrammatic perspective view schematically showing one example of a memory cell comprising the memory cell array 231 shown in FIG. 45. As shown in FIG. 46, an upper electrode wiring 243 and a lower electrode wiring 241 are arranged for crossing respectively, and then one of the electrode wirings forms a bit line, and the other forms a word line. Moreover, there is provided a configuration that a variable resistor body 242 is arranged in a region at the intersection of the electrode wirings as it is normally called a cross point. Here, the upper electrode wiring 243 and the resistor body 242 are manufactured in a similar shape according to the example shown in FIG. 46, however, a part electrically contributing to a switching operation in the variable resistor body 242 is to be the region as the cross point at the intersection of the upper electrode wiring 243 and the lower electrode wiring 241.

Regarding a variable resistor body material to be used for the above mentioned variable resistor body 219 shown in FIG. 44 or the variable resistor body 242 shown in FIG. 46, there is disclosed a technology in the following patent document 1 and a nonpatent document 1 by Shangquing Liu, Alex Ignatiev et al., University of Houston, USA, that an electrical resistance is changed reversibly by applying a voltage pulse to a perovskite material known for having a colossal magnetoresistance effect. Such the technology is extremely revolutionary as a change in electrical resistance appears in a wide range of several orders of magnitude even at room temperature without applying a magnetic field, even with using the perovskite material known for having the colossal magnetoresistance effect. Here, a crystalline praseodymium calcium manganese oxide (PCMO: $Pr_{1-x}Ca_xMnO_3$) film as a perovskite-type oxide is used as the material for variable resistor body according to the element structure embodied in the patent document 1.

Moreover, according to a nonpatent document 2 and a patent document 2, it is known that an oxide of transition metal elements, such as a titanium oxide ($TiO_2$) film, a nickel oxide (NiO) film, a zinc oxide (ZnO) film, a niobium oxide ($Nb_2O_5$) film, or the like, shows a reversible change in electrical resistance as other materials for variable resistor body. Furthermore, there is reported in detail in a nonpatent document 3 regarding a phenomenon in a switching operation using the NiO film among such the materials.

Patent document 1: U.S. Pat. No. 6,204,139
Nonpatent document 1: S. Q. Liu et al., "Electric-pulse-induced reversible Resistance change effect in magnetoresistive films", Applied Physics Letters, vol. 76, pp. 2749-2751 (2000)
Nonpatent document 2: H. Pagnia et al., "Bistable Switching in Electroformed Metal-Insulator-Metal Devices", Phys. Stat. Sol. (a), vol. 108, pp. 11-65 (1988)
Patent document 2: Japanese published patent publication 2002-537627
Nonpatent document 3: I. G. Baek et al., "Highly Scalable Non-volatile Resistive Memory using Simple Binary Oxide Driven by Asymmetric Unipolar Voltage Pulses", IEDM 04, pp. 587-590 (2004)

DISCLOSURE OF THE INVENTION

Problems to be Solved by the Invention

At the period of writing operation regarding data in the above mentioned nonvolatile memory device, that is to say, in the period from starting applying an electric pulse between the upper electrode and the lower electrode to reaching a predetermined resistance value regarding the variable resistor body, a transient current flows through the variable resistive element (R). Such the current is called a programming current or an erasing current corresponding to a direction of change regarding the electrical resistance respectively. For example, in the case of using the oxide of transition metal element as the material for variable resistor body, there is reported in the nonpatent document 3 wherein the NiO film is used that the programming current and the erasing current for an electrode surface area of $0.3 \times 0.7 \square m^2$ are approximately 1 mA respectively. Both amounts of such the currents correspond to an area of an electrically contributing region in the variable resistor body, and then it is able to suppress the programming current and the erasing current by decreasing such the area, and it becomes able to suppress a current consumption in the nonvolatile memory device as well.

Moreover, it is able to manufacture a memory element reproducibly with a stable switching operation in the case of excellent crystalline for the variable resistor body generally, however, an improvement of such the crystalline cannot help but cause a relative decrease in a resistance value regarding the variable resistor body. Moreover, the resistance value regarding the variable resistor body is inversely proportional to an area of the electrically contributing region in the variable resistor body, and then the electrical resistance of the variable resistive element (R) becomes smaller in the case of such the area becoming larger. In such the case, regarding the memory cell of 1T/1R type, there is occurred a problem, such as a programming impossible or the like, because a sufficient voltage is not applied to the variable resistor body in the case of the electrical resistance of the variable resistive element (R) becoming considerably smaller than an on resistance of a control transistor (T). Furthermore, even for the memory cell of 1R type, a parasitic current flowing through any other cells except the selected cell becomes larger, that are connected to a selected bit wiring or word wiring, and then there is occurred the similar problem as the programming impossible due to an applying voltage becoming insufficient.

Therefore, it is able to suppress the current consumption and it becomes possible to manufacture the memory element reproducibly with a stable switching operation without becoming the programming impossible if it is able to manufacture in a smaller size regarding the area of the electrically contributing region in the variable resistor body. However, regarding the above mentioned conventional memory cell, the area of the electrically contributing region in the variable resistor body is specified, for example, by an area of the variable resistor body 219 part shown in FIG. 44 or by a size of the upper electrode 201 shown in FIG. 42 regarding the memory cell of 1T/1R type, and by an area of the cross point region at the intersection of the upper electrode wiring 243 and the lower electrode wiring 241 shown in FIG. 46 regarding the memory cell of 1R type. Hence, the area of the electrically contributing region in the variable resistor body is constrained by formative areas for such the electrodes and the like. And then the area to be able to realize has a lower limit against reducing thereof.

The present invention is presented with having regard to the above mentioned problems, and an object is to provide a variable resistive element comprising a configuration that an area of an electrically contributing region in a variable resistor body is finer than the areas specified by the upper electrode, the lower electrode and the like, and to provide its manufacturing method.

Means for Solving the Problem

For achieving the above mentioned object, a variable resistive element according to a first feature of the present invention comprises: a variable resistor body provided between two electrodes, in which an electrical resistance of between the two electrodes is changed by applying a voltage pulse between the two electrodes; and a bump electrode material contacting to either one of the two electrodes and extending toward the other one of the electrodes, wherein the variable resistor body is formed between the bump electrode material and the other one of the electrodes.

According to the first feature construction regarding the variable resistive element according to the present invention, there is provided the configuration in that the bump electrode material contacting to either one of the two electrodes is provided and such the bump electrode material is extended toward the other one of the electrodes, further, the variable resistor body is provided at an apical part thereof, and then it is to be connected to the other one of the electrodes via such the variable resistor body. Hence, it is able to obtain an area of an electrically contributing region of a variable resistor body smaller than a formative area specified by manufacturing processes. Here, it is able to form the bump electrode material with an area of a fine region by using a self-aligned process, without depending only on a fine processing which is constrained by an exposure technology. Thus, it becomes able to reduce the current consumption at the period of programming or erasing thereby, and it becomes able to manufacture a memory element reproducibly with a stable switching operation without occurring a programming impossible due to a low electrical resistance thereof.

Moreover, the variable resistive element according to the present invention is characterized as a second feature in addition to the first feature construction in that the bump electrode material is extended along a sidewall of an insulating film formed between the two electrodes, and formed so as to project toward the other one of the two electrodes with an annular or a plurally-separated linear shape.

Further, the variable resistive element according to the present invention is characterized as a third feature in addition to the first feature construction in that the bump electrode material is extended along a sidewall of an insulating film formed between the two electrodes, and formed so as to project toward the other one of the two electrodes with one linear shape.

Still further, the variable resistive element according to the present invention is characterized as a fourth feature in addition to the second or the third feature construction in that the insulating film comprises an open part to expose whole or a part of a top surface of a lower electrode as the electrode formed at a lower region regarding the two electrodes, and the bump electrode material is extended along an inner sidewall of the open part.

Still further, the variable resistive element according to the present invention is characterized as a fifth feature in addition to the second or the third feature construction by further comprising the insulating film on the lower electrode as the electrode formed at the lower region regarding the two electrodes, wherein the bump electrode material is extended along an outer sidewall of the insulating film.

Still further, the variable resistive element according to the present invention is characterized as a sixth feature in addition to the first feature construction by further comprising: a first bump electrode material contacting to either one of the two electrodes and extending toward the other one of the two electrodes along a sidewall of a first insulating film formed between the two electrodes; and a second bump electrode material contacting to the other one of the two electrodes and extending toward the one of the two electrodes along a sidewall of a second insulating film formed between the two electrodes, wherein the variable resistor body is formed between the first bump electrode and the second bump electrode.

Still further, the variable resistive element according to the present invention is characterized as a seventh feature in addition to any one of the feature constructions from the first trough the sixth in that the lower electrode as the electrode formed at the lower region regarding the two electrodes is a diffusion layer formed on a semiconductor substrate.

Still further, the variable resistive element according to the present invention is characterized as an eighth feature in addition to the first feature construction by further comprising a base insulating film deposited in parallel to a surface of a substrate, wherein the bump electrode material is formed along a top surface of the base insulating film, either one of the two electrodes is formed on a top surface of the bump electrode material, the other one of the two electrodes is formed on the top surface of the base insulating film, and the variable resistor body is formed between the bump electrode material and the other one of the two electrodes.

Still further, the variable resistive element according to the present invention is characterized as a ninth feature in addition to any one of the feature constructions from the first trough the eighth in that the bump electrode material is formed using a transition metal or a nitride of a transition metal element.

Furthermore, the variable resistive element according to the present invention is characterized as a tenth feature in addition to the ninth feature construction in that the bump electrode material is a titanium nitride.

According to the tenth feature construction regarding the variable resistive element according to the present invention, it becomes easy for designing processes because it is available to use a titanium based material for the bump electrode material, which has been conventionally used in general purpose in semiconductor processes.

Moreover, the variable resistive element according to the present invention is characterized as an eleventh feature in addition to any one of the feature constructions from the first through the tenth in that the variable resistor body is formed by oxidizing a part of the bump electrode material.

According to the eleventh feature construction regarding the variable resistive element according to the present invention, it is able to form a variable resistor body film by thermal processing steps of oxidation as a general process in manufacturing processes for semiconductor, and then it is possible to realize with using a conventional equipment as it is not required a particular equipment for a deposition of such the film.

Moreover, for achieving the above mentioned object, a variable resistive element according to a twelfth feature of the present invention comprises a variable resistor body provided between two electrodes, in which the electrical resistance of between the two electrodes is changed by applying a voltage pulse between the two electrodes, wherein a line width of a contact surface of between the variable resistor body and at least one of the two electrodes is formed to be narrower than the line width of any of the two electrodes.

Further, for achieving the above mentioned object, a variable resistive element according to a thirteenth feature of the present invention comprises a variable resistor body provided between two electrodes, in which the electrical resistance of between the two electrodes is changed by applying a voltage pulse between the two electrodes, wherein a line width of a contact surface of between the variable resistor body and at least one of the two electrodes is formed to be smaller than a value of a film thickness for any of the two electrodes.

According to the twelfth or the thirteenth feature construction regarding the variable resistive element according to the present invention, it is able to obtain an area of an electrically contributing region of a variable resistor body smaller than a formative area specified by manufacturing processes.

Moreover, the variable resistive element according to the present invention is characterized as a fourteenth feature in addition to the twelfth or the thirteenth feature construction in that a shape of a contact surface of between the variable resistor body and at least one of the two electrodes is an annular or a plurally-separated linear shape.

Further, the variable resistive element according to the present invention is characterized as a fifteenth feature in addition to the twelfth or the thirteenth feature construction in that a shape of a contact surface of between the variable resistor body and at least one of the two electrodes is one linear shape.

Still further, the variable resistive element according to the present invention is characterized as a sixteenth feature in addition to any one of the feature constructions from the twelfth through the fifteenth in that a planar shape of the variable resistor body in each of the variable resistive elements is an annular or a plurally-separated linear shape.

According to the sixteenth feature construction regarding the variable resistive element according to the present invention, it is able to obtain an area of an electrically contributing region of a variable resistor body smaller than a formative area specified by manufacturing processes.

Moreover, the variable resistive element according to the present invention is characterized as a seventeenth feature in addition to any one of the feature constructions from the twelfth through the fifteenth in that a planar shape of the variable resistor body in each of the variable resistive elements is one linear shape.

Further, the variable resistive element according to the present invention is characterized as an eighteenth feature in addition to any one of the feature constructions from the first trough the seventeenth in that the variable resistor body is formed of an oxide of a transition metal element or an oxynitride of a transition metal element.

Still further, the variable resistive element according to the present invention is characterized as a nineteenth feature in addition to the eighteenth feature construction in that the variable resistor body is a titanium oxide or a titanium oxynitride.

According to the nineteenth feature construction regarding the variable resistive element according to the present invention, it becomes easy for designing processes because it is available to use a titanium based material for the variable resistor body, which has been conventionally used in general purpose in semiconductor processes.

Moreover, for achieving the above mentioned object, a manufacturing method for a variable resistive element according to a first feature of the present invention is a manufacturing method for the variable resistive element comprising the first feature construction or the second feature construction, comprises: a first step of forming a lower electrode as the electrode to be formed at a lower region regarding the two electrodes by depositing an electrode material onto a substrate to layer a first electrode film; a second step of forming a first insulating film on the lower electrode, the first insulating film having an open part reaching a top surface of the lower electrode; a third step of forming a bump electrode material contacting to at least a partial region of the lower electrode and extending upward along an inner sidewall of the open part formed at the second step; a fourth step of forming the variable resistor body at an apical part of the bump electrode material; and a fifth step of forming an upper electrode to be formed at an upper region regarding the two electrodes by depositing an electrode material to layer a second electrode film.

According to the first feature regarding the manufacturing method for a variable resistive element according to the present invention, the variable resistor body is formed at the apical part of the bump electrode material extending from the lower electrode in a direction toward the upper electrode, and then the bump electrode material and the upper electrode are to be connected via the variable resistor body. That is to say, it becomes able to manufacture a variable resistive element with being reduced an area of electrically contributing region of a variable resistor body.

Here, the first step may comprise the steps of depositing the first electrode film configuring the lower electrode, depositing a second insulating film onto the first electrode film, and processing the first electrode film and the second insulating film.

Moreover, the second step may comprise the steps of depositing the first insulating film, flattening the first insulating film until a top surface of the second insulating film becomes exposed, and forming the open part in the first insulating film so that the open part penetrates it and reaches a top surface of the lower electrode.

Further, the manufacturing method for a variable resistive element according to the present invention is characterized as a second feature in addition to the first feature in that the third step comprises the steps of: forming an electrode film for a bump electrode material by depositing an electrically conductive material onto the open part and the first insulating film; depositing a third insulating film onto the electrode film for the bump electrode material; removing the third insulating film until a top surface of the electrode film for the bump electrode material is exposed; and forming the bump electrode material connecting to the lower electrode inside the open part by removing the electrode film for the bump electrode material layered at a region other than a region on the open part.

Still further, the manufacturing method for a variable resistive element according to the present invention is characterized as a third feature in addition to the first feature in that the third step further comprises: a sixth step of forming an electrode film for a bump electrode material by depositing an electrically conductive material onto the open part and the first insulating film; and a step of forming the bump electrode material along a sidewall of the open part by removing the electrode film for the bump electrode material layered on the first insulating film.

Still further, the manufacturing method for a variable resistive element according to the present invention is characterized as a fourth feature in addition to the third feature in that the sixth step includes depositing the electrode film for the bump electrode material inside the open part so that a film thickness of the electrode film for the bump electrode material becomes thinner toward a top surface of the lower electrode.

Furthermore, the manufacturing method for a variable resistive element according to the present invention is characterized as a fifth feature in addition to the fourth feature in that the fourth step comprises a step of forming a third insulating film on the open part and the first insulating film, and the step of forming the third insulating film includes forming the variable resistor body by oxidizing a region of the bump electrode material formed along the sidewall of the open part at the third step, the region having a thin film thickness in a vicinity of a top surface of the lower electrode.

Moreover, for achieving the above mentioned object, a manufacturing method for a variable resistive element according to a sixth feature of the present invention is a manufacturing method for the variable resistive element comprising the first feature construction or the second feature construction, and comprises: a first step of forming a lower electrode as an electrode to be formed at a lower region regarding the two electrodes by depositing the first electrode film, which is to be the lower electrode, onto a substrate, by depositing a first insulating film onto the first electrode film, and by processing the first electrode film and the first insulating film; a second step of forming a bump electrode material contacting to at least a partial region of the lower electrode and extending upward along an outer sidewall of the lower electrode and an outer sidewall of the first insulating film; a third step of forming the variable resistor body at an apical part of the bump electrode material; and a fourth step of forming an upper electrode as an electrode to be formed at an upper region regarding the two electrodes by depositing an electrode material to layer a second electrode film.

According to the sixth feature regarding the manufacturing method for a variable resistive element according to the present invention, the variable resistor body is formed at the apical part of the bump electrode material extended from the lower electrode in a direction toward the upper electrode, and then the bump electrode material and the upper electrode are to be connected via the variable resistor body. That is to say, it becomes able to manufacture a variable resistive element with being reduced an area of electrically contributing region of a variable resistor body.

Moreover, the manufacturing method for a variable resistive element according to the present invention is characterized as a seventh feature in addition to the sixth feature in that the second step comprises the steps of: forming an electrode film for a bump electrode material by depositing an electrically conductive material over the whole surface including a top surface of the first insulating film; and forming the bump electrode material along the outer sidewall of the first electrode film and the outer sidewall of the first insulating film by removing the electrode film for the bump electrode material formed at a region other than the outer sidewall of the first electrode film and the outer sidewall of the first insulating film.

Further, the manufacturing method for a variable resistive element according to the present invention is characterized as an eighth feature in addition to the sixth or the seventh feature in that the third step comprises the steps of: depositing a second insulating film over the whole surface including the top surface of the first insulating film; and flattening the second insulating film until a top surface of the electrode film for the bump electrode material is exposed.

Moreover, for achieving the above mentioned object, a manufacturing method for a variable resistive element according to a ninth feature of the present invention is a manufacturing method for the variable resistive element comprising the third feature construction, and comprises: a first step of forming a plurality of lower electrodes, each of which is an electrode to be formed at a lower region regarding the two electrodes, by depositing an electrode material onto a substrate to layer a first electrode film; a second step of depositing a first insulating film having an open part, the open part opening for both of any adjacent pair of the lower electrodes and penetrating the first insulating film so as to reach at least a part of each top surface of the lower electrodes; a third step of forming a bump electrode material contacting to at least a partial region of the lower electrodes and extending upward along an inner sidewall of the open part by depositing an electrically conductive material to layer an electrode film for the bump electrode material and by processing the electrode film for the bump electrode material; a fourth step of filling an inside of the open part with a second insulating film by depositing the second insulating film and processing the second insulating film; a fifth step of forming the variable resistor body at an apical part of the bump electrode material; and a sixth step of forming an upper electrode as an electrode to be formed at an upper region regarding the two electrodes by depositing an electrode material to layer a second electrode film.

Moreover, for achieving the above mentioned object, a manufacturing method for a variable resistive element according to a tenth feature of the present invention is a manufacturing method for the variable resistive element comprising the third feature construction, and comprises: a first step of forming a plurality of lower electrodes, each of which is an electrode to be formed at a lower region regarding the two electrodes, by depositing an electrode material onto a substrate to layer a first electrode film; a second step of depositing a first insulating film having a first open part, the first open part opening for both of any adjacent pair of the lower electrodes and penetrating the first insulating film so as to reach at least a part of each top surface of the lower electrodes; a third step of forming a dummy film contacting to a partial region of the lower electrodes and extending upward along an inner sidewall of the first open part by depositing a dummy film material and by processing the dummy film material; a fourth step of filling an inside of the first open part with a second insulating film by depositing the second insulating film and by processing the second insulating film; a fifth step of forming a second open part so that a part of a top surface of the lower electrode is exposed by removing the dummy film; a sixth step of forming the variable resistor body and the bump electrode material at an inside of the second open part; and a seventh step of forming an upper electrode as an electrode to be formed at an upper region regarding the two electrodes by depositing an electrode material to layer a second electrode film, the upper electrode comprising an electrode of bump shape at the inside of the second open part.

According to the ninth or the tenth feature regarding the manufacturing method for a variable resistive element according to the present invention, the variable resistor body is to be formed at the apical part of the bump electrode material extending as a linear shape from the lower electrode in a direction toward the upper electrode, and then the bump electrode material and the upper electrode are to be connected via the variable resistor body. That is to say, it becomes able to manufacture a variable resistive element with being reduced an area of electrically contributing region of a variable resistor body.

Moreover, the manufacturing method for a variable resistive element according to the present invention is characterized as an eleventh feature in addition to the tenth feature in that the dummy film is comprised of a material different from any materials for the first insulating film, the second insulating film and for the first electrode film, and the fifth step includes removing only the dummy film selectively for the first insulating film, the second insulating film and for the first electrode film, by using an etching method.

Further, the manufacturing method for a variable resistive element according to the present invention is characterized as a twelfth feature in addition to the tenth or the eleventh feature in that the sixth step includes forming the variable resistor body by oxidizing a top surface of the lower electrode formed at the inside of the second open part.

Moreover, for achieving the above mentioned object, a manufacturing method for a variable resistive element according to a thirteenth feature of the present invention is a manufacturing method for the variable resistive element comprising the sixth feature construction, and comprises: a first step of forming a plurality of lower electrodes, each of which is an electrode to be formed at a lower region regarding the two electrodes, by depositing an electrode material onto a substrate to layer a first electrode film; a second step of depositing a first insulating film having a first open part, the first open part opening for both of any adjacent pair of the lower electrodes and penetrating the first insulating film so as to reach at least a part of each top surface of the lower electrodes; a third step of forming a first bump electrode material contacting to at least a partial region of the lower electrodes and extending upward along an inner sidewall of the first open part by depositing an electrically conductive material to layer an electrode film for the first bump electrode material and by processing the electrode film for the first bump electrode material; a fourth step of filling an inside of the first open part with a first filler insulating film by depositing the first filler insulating film and by processing the first filler insulating film; a fifth step of forming the variable resistor body at an apical part of the first bump electrode material; a sixth step of depositing a second insulating film having a second open part at a region over the first insulating film, the first filler insulating film and the variable resistor body, the second open part penetrating the second insulating film so as to reach at least a part of a top surface of the variable resistor body and extending in a second direction intersecting the lower electrodes extending in a first direction from a top surface view point position; a seventh step of forming a second bump electrode material extending upward along an inner sidewall of the second open part by depositing an electrically conductive material to layer an electrode film for the second bump electrode material and by processing the electrode film for the second bump electrode material; an eighth step of filling an inside of the second open part with a second filler insulating film by depositing the second filler insulating film and by processing the second filler insulating film; and a ninth step of forming an upper electrode as an electrode to be formed at an upper region regarding the two electrodes by depositing an electrode material to layer a second electrode film and by processing the second electrode film so that the second electrode film contacts to a top surface of the second bump electrode material and extends in the second direction.

Moreover, for achieving the above mentioned object, a manufacturing method for a variable resistive element according to a fourteenth feature of the present invention is a manufacturing method for the variable resistive element comprising the sixth feature construction, and comprises: a first step of forming a plurality of lower electrodes, each of which is an electrode to be formed at a lower region regarding the two electrodes, by depositing an electrode material onto a substrate to layer a first electrode film; a second step of depositing a first insulating film having a first open part, the first open part opening for both of any adjacent pair of the lower electrodes and penetrating the first insulating film so as to reach at least a part of each top surface of the lower electrodes; a third step of forming a first bump electrode material contacting to at least a partial region of the lower electrodes and extending upward along an inner sidewall of the first open part by depositing an electrically conductive material to layer an electrode film for the first bump electrode material and by processing the electrode film for the first bump electrode material; a fourth step of filling an inside of the first open part with a first filler insulating film by depositing the first filler insulating film and by processing the first filler insulating film; a fifth step of depositing a second insulating film having a second open part at a region over the first insulating film, the first filler insulating film and the variable resistor body, the second open part penetrating the second insulating film so as to reach at least a part of a top surface of the variable resistor body and extending in a second direction intersecting the lower electrodes extending in a first direction from a top surface view point position; a sixth step of forming the variable resistor body at an apical part of the first bump electrode material formed at an inside of the second open part; a seventh step of forming the second bump electrode material extending upward along an inner sidewall of the second open part by depositing an electrically conductive material to layer an electrode film for the second bump electrode material and by processing the electrode film for the second bump electrode material; a eighth step of filling an inside of the second open part with a second filler insulating film by depositing the second filler insulating film and by processing the second filler insulating film; and a ninth step of forming an upper electrode as an electrode to be formed at an upper region regarding the two electrodes by depositing an electrode material to layer a second electrode film and by processing the second electrode film so that the second electrode film contacts to a top surface of the second bump electrode material and extends in the second direction.

According to the thirteenth or the fourteenth feature regarding the manufacturing method for a variable resistive element according to the present invention, the first bump electrode material extending as a linear shape from the lower electrode in a direction toward the upper electrode and the second bump electrode material extending as a linear shape from the upper electrode in a direction toward the lower electrode are to be electrically connected via the variable resistor body. That is to say, it becomes able to manufacture a variable resistive element with being reduced an area of electrically contributing region of a variable resistor body.

Moreover, for achieving the above mentioned object, a manufacturing method for a variable resistive element according to a fifteenth feature of the present invention is a manufacturing method for the variable resistive element comprising the eighth feature construction, and comprises: a first step of layering an electrode film for a bump electrode material by depositing the base insulating film on a substrate and depositing an electrically conductive material onto the base insulating film; a second step of forming a lower electrode as the electrode to be formed at a lower region regarding the two electrodes by depositing an electrode material onto the electrode film for the bump electrode material to layer a first electrode film, by depositing a first insulating film onto the first electrode film, and by processing the first electrode film and the first insulating film; a third step of forming a sidewall film along an outer sidewall of the lower electrode and an outer sidewall of the first insulating film by depositing a second insulating film and by processing the second insulating film; a fourth step of forming the bump electrode material contacting to at least a partial region of the lower electrode and extending along a top surface of the base insulating film;

a fifth step of forming the variable resistor body at an apical part of the bump electrode material; and a sixth step of forming an upper electrode as an electrode to be formed at an upper region regarding the two electrodes by depositing an electrode material to layer a second electrode film.

According to the fifteenth feature regarding the manufacturing method for a variable resistive element according to the present invention, the variable resistor body is to be formed at the apical part of the bump electrode material extending from either one of the electrodes in a direction toward another one of the electrodes as a linear shape on the base insulating film, and then the bump electrode material and the other one of the electrodes are to be connected via the variable resistor body. That is to say, it becomes able to manufacture a variable resistive element with being reduced an area of electrically contributing region of a variable resistor body.

Moreover, the manufacturing method for a variable resistive element according to the present invention is characterized as a sixteenth feature in addition to the fifteenth feature in that the fourth step includes forming the bump electrode material by removing the electrode film for the bump electrode material formed at a region other than regions under the lower electrode and the sidewall film.

Moreover, for achieving the above mentioned object, a manufacturing method for a variable resistive element according to a seventeenth feature of the present invention is a manufacturing method for the variable resistive element comprising the eighth feature construction, and comprises a first step of layering an electrode film for a bump electrode material by depositing the base insulating film on a substrate and depositing an electrically conductive material onto the base insulating film; a second step of forming the bump electrode material extending along a top surface of the base insulating film by depositing a dummy film onto the electrode film for the bump electrode material and by processing the electrode film for the bump electrode material and the dummy film; a third step of forming the variable resistor body at an apical part of the bump electrode material; a fourth step of forming a lower electrode as the electrode to be formed at a lower region regarding the two electrodes by depositing an electrode material to layer a first electrode film, the lower electrode contacting to the bump electrode material; a fifth step of forming an open part to expose a top surface of the bump electrode material by depositing a first insulating film onto the lower electrode, by processing the first insulating film, and by removing the dummy film; a sixth step of depositing a second insulating film for a region including at least a sidewall of the lower electrode; and a seventh step of forming an upper electrode as the electrode to be formed at an upper region regarding the two electrodes by depositing an electrode material to layer a second electrode film in an outer region of the second insulating film, on the first insulating film and on the bump electrode material.

According to the seventeenth feature regarding the manufacturing method for a variable resistive element according to the present invention, the variable resistor body is to be formed at the apical part of the bump electrode material extending from either one of the electrodes in a direction toward another one of the electrodes as a linear shape on the base insulating film, and then the bump electrode material and the other one of the electrodes are to be connected via the variable resistor body. That is to say, it becomes able to manufacture a variable resistive element with being reduced an area of electrically contributing region of a variable resistor body.

Moreover, the manufacturing method for a variable resistive element according to the present invention is character-ized as an eighteenth feature in addition to the seventeenth feature in that the dummy film is formed of a material different from any materials for the first insulating film, the electrode film for the bump electrode material and for the first electrode film, and the fifth step includes removing only the dummy film selectively for the first insulating film, the electrode film for the bump electrode material and for the first electrode film, by using an etching method.

Further, a manufacturing method for a variable resistive element according to a nineteenth feature of the present invention in addition to any one of the features from the first through the third, from the sixth through the tenth, and from the fifteenth through the eighteenth further comprises a step of forming the variable resistor body by forming the bump electrode material and depositing a variable resistor body material onto at least the bump electrode material to layer a variable resistor body film.

Here, it may also available to layer the variable resistor body film by depositing the variable resistor body material using either one of a spattering method or a CVD method.

Moreover, a manufacturing method for a variable resistive element according to a twentieth feature of the present invention in addition to any one of the features from the first through the eleventh and from the thirteenth through the eighteenth further comprises a step of forming the variable resistor body by forming the bump electrode material and oxidizing an exposed part of the bump electrode material.

According to the twentieth feature regarding the manufacturing method for a variable resistive element according to the present invention, it is able to realize a variable resistive element by using an extremely simple process, because the variable resistor body is to be formed by oxidizing the exposed part of the bump electrode material. Here, it is available to use such as a (high temperature) thermal oxidation method, an oxygen plasma oxidation method, an ozone oxidation method, or the like, as an oxidation method therefor.

Moreover, the manufacturing method for a variable resistive element according to the present invention is characterized as a twenty-first feature in addition to any one of the features from the first through the twentieth in that the bump electrode material is a titanium nitride.

According to the twenty-first feature construction regarding the variable resistive element according to the present invention, it becomes easy for designing processes because it is available to use a titanium based material for the bump electrode material, which has been conventionally used in general purpose in semiconductor processes.

Moreover, the manufacturing method for a variable resistive element according to the present invention is characterized as a twenty-second feature in addition to any one of the features from the first through the twenty-first in that the variable resistor body is a titanium oxide or a titanium oxynitride.

Effects of the Invention

According to the variable resistive element of the present invention, an area of an electrically contributing region of a variable resistor body is not to be constrained by a formative area specified by manufacturing processes, because a shape of a contact surface of between the variable resistor body and either one of electrodes or the other one of the electrodes is an annular or a plurally-separated linear shape. Hence, it becomes able to obtain the area of the electrically contributing region of the variable resistor body smaller than the formative area specified by the manufacturing processes. Therefore, it becomes able to reduce the current consumption at a period of programming or erasing thereby, and then it becomes able to manufacture a memory element reproducibly with a stable switching operation without occurring a programming impossible due to a low electrical resistance thereof. Moreover, according to the manufacturing method for a variable resistive element regarding the present invention, it becomes able to manufacture such as the above mentioned variable resistive element which is able to obtain the area of the electrically contributing region of the variable resistor body smaller than the formative area specified by the manufacturing processes.

BRIEF DESCRIPTION OF THE DRAWINGS

FIG. 3 is a brief cross sectional view showing a variable resistive element according to the first embodiment of the present invention in order of manufacturing process.

FIG. 4 is a brief cross sectional view showing the variable resistive element according to the first embodiment of the present invention in order of manufacturing process.

FIG. 7 is a brief cross sectional view showing a variable resistive element according to the second embodiment of the present invention in order of manufacturing process.

FIG. 8 is a brief cross sectional view showing the variable resistive element according to the second embodiment of the present invention in order of manufacturing process.

FIG. 10 is a brief cross sectional view showing a variable resistive element according to the third embodiment of the present invention in order of manufacturing process.

FIG. 11 is a brief cross sectional view showing the variable resistive element according to the third embodiment of the present invention in order of manufacturing process.

FIG. 13 is a brief cross sectional view showing a variable resistive element according to the fourth embodiment of the present invention in order of manufacturing process.

FIG. 14 is a brief cross sectional view showing the variable resistive element according to the fourth embodiment of the present invention in order of manufacturing process.

FIG. 20 is a brief cross sectional view showing a variable resistive element according to the seventh embodiment of the present invention in order of manufacturing process.

FIG. 21 is a brief cross sectional view showing the variable resistive element according to the seventh embodiment of the present invention in order of manufacturing process.

FIG. 22 is a brief cross sectional view showing the variable resistive element according to the seventh embodiment of the present invention in order of manufacturing process.

FIG. 26 is a brief cross sectional view showing a variable resistive element according to the eighth embodiment of the present invention in order of manufacturing process.

FIG. 27 is a brief cross sectional view showing the variable resistive element according to the eighth embodiment of the present invention in order of manufacturing process.

FIG. 29 is a brief cross sectional view showing a variable resistive element according to the ninth embodiment of the present invention in order of manufacturing process.

FIG. 30 is a brief cross sectional view showing the variable resistive element according to the ninth embodiment of the present invention in order of manufacturing process.

FIG. 33 is a brief cross sectional view showing a variable resistive element according to a modified example regarding the ninth embodiment of the present invention in order of manufacturing process.

FIG. 35 is a brief cross sectional view showing a variable resistive element according to the tenth embodiment of the present invention in order of manufacturing process.

FIG. 36 is a brief cross sectional view showing the variable resistive element according to the tenth embodiment of the present invention in order of manufacturing process.

FIG. 39 is a brief cross sectional view showing a variable resistive element according to the eleventh embodiment of the present invention in order of manufacturing process.

FIG. 40 is a brief cross sectional view showing the variable resistive element according to the eleventh embodiment of the present invention in order of manufacturing process.

EXPLANATION OF REFERENCES

Figure 1:
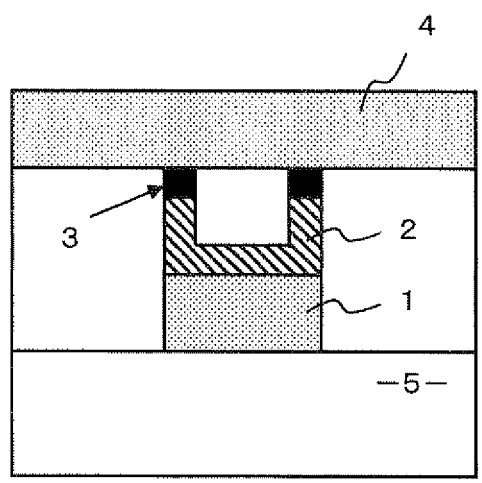
FIG. 1 is a brief cross sectional view showing a configuration of a variable resistive element according to the first embodiment of the present invention.

R: Variable Resistive Element
T: Selective Transistor
TE, 4, 14, 24, 34, 44, 54, 64, 95, 122, 124, 126, 130, 132, 136, 138, 201, 220, 243, 304, 314, 334, 344, 404, 414, 428, 434, 444, 454, 464: Upper Electrode
BE, 1, 11, 21, 31, 41, 51, 61, 89, 111, 121, 123, 125, 129, 131, 135, 137, 203, 218, 241, 301, 311, 331, 341, 401, 411, 431, 441, 451, 461: Lower Electrode
2, 22, 32, 42, 52, 62, 92, 108, 302, 312, 332, 342, 426, 432, 442, 452, 462: Bump Electrode Material
133, 402, 412: First Bump Electrode Material
134, 406, 420: Second Bump Electrode Material
3, 23, 33, 43, 53, 63, 94, 110, 202, 219, 242, 303, 313, 333, 343, 403, 413, 425, 433, 443, 453, 463: Variable Resistor Body
A, 91, 128, 319, 349, 352, 419, 424: Open Part
468: Stepped Part
5, 25, 55, 244, 305, 405, 435, 455: Base Substrate
16, 36, 46, 66, 81, 101, 211, 316, 346, 416, 446, 466: Semiconductor Substrate
15, 35, 45, 65, 87, 107, 315, 345, 415, 445, 465: Base Insulating Film
17, 37, 47, 67: SiN Film
18, 19, 20, 38, 39, 40, 48, 49, 50, 68, 69, 90, 93, 96, 109, 112, 317, 320, 321, 347, 350, 353, 417, 421, 422, 427, 429, 447, 448, 449, 469, 470, 471: $SiO_2$ Film
318, 351, 467: SiN Film
348, 418, 423: $Al_2O_3$ Film
WBE, WTE: Open Part Pattern
RBE: Wiring Pattern
82, 102, 212: Element Isolation Region
83, 103, 213: Gate Insulating Film
84, 104, 214: Gate Electrode
85, 105, 215: Drain Region
86, 106, 216: Source Region
88, 97, 98, 113, 114, 217, 221, 222: Contact Plug
99, 115, 223: Bit Wiring
100, 116, 224: Source Wiring
127: Open Part or Electrode Size
S1, S2, S3, S4, S5, S6, S7, S8, S9: Electrically Contributing Region in the variable resistor body
204, 231: Memory Cell Array
205, 232: Bit Line Decoder
206, 233: Word Line Decoder
207: Source Line Decoder
BL1, BL2, ..., BLm: Bit Line
WL1, WL2, ..., WLn: Word Line
SL1, SL2, ..., SLn: Source Line

BEST MODE FOR CARRYING OUT THE INVENTION

Preferred embodiments will be described in detail below with reference to the drawings regarding a variable resistive element (properly referred to as the present invention element hereinafter) and its manufacturing method (properly referred to as the present invention method hereinafter) according to the present invention.

The present invention element comprises a configuration that a connection is performed between an upper electrode and a lower electrode via a variable resistor body, wherein the configuration is that a bump electrode material is provided to be electrically connected to either one of the electrodes, in order to make a contact area between either one of the electrodes and the variable resistor body be narrower than that of the conventional configuration. The following description is to be focused in particular regarding manufacturing processes of such the bump electrode material.

The First Embodiment

The first embodiment according to the present invention element and the present invention method (properly referred to as the present embodiment hereinafter) will be described in detail below with reference to FIG. 1 to FIG. 5.

FIG. 1 is a brief cross sectional view showing the present invention element according to the present embodiment. The present invention element according to the present embodiment comprises a configuration that a lower electrode wiring 1 and an upper electrode wiring 4 are formed on a base substrate 5, and a variable resistor body 3 as a memory material body is formed between the upper and the lower electrode wirings, wherein a bump electrode material 2 comprised of any of electrically conductive materials is electrically connected to the lower electrode wiring 1, and the variable resistor body 3 is formed on an apical part of the bump electrode material 2, as shown in FIG. 1.

Figure 2:
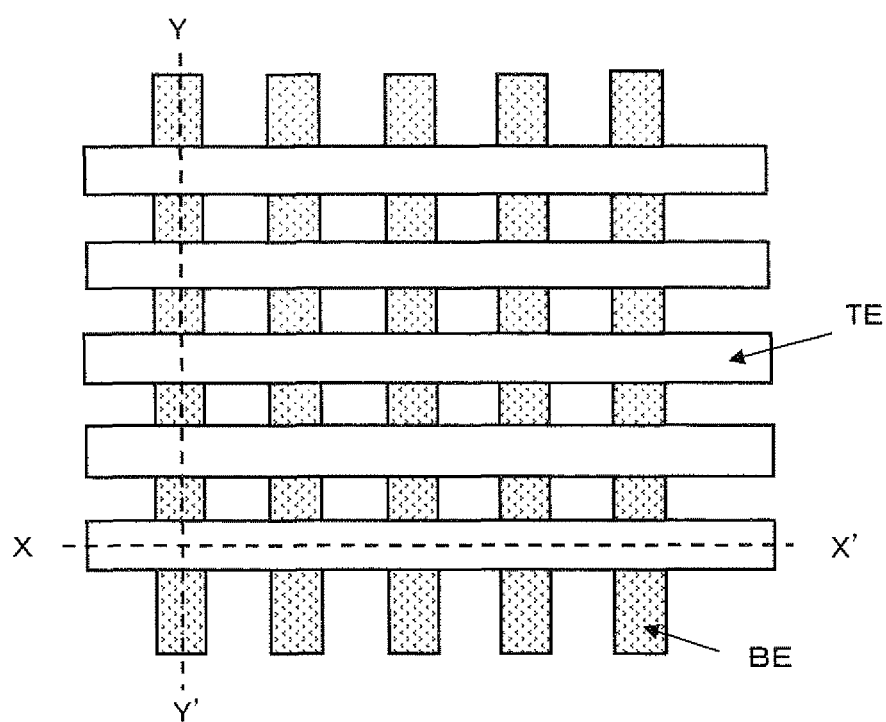
FIG. 2 is a plane pattern diagram showing a memory cell array of an 1R configuration.

The following is a description as an example for the case of applying the present invention element comprised of such the configuration to a memory cell of 1R type. FIG. 2 is a plane pattern diagram showing a memory cell array of an 1R configuration. Moreover, FIG. 3 and FIG. 4 are views showing manufacturing processes for the present invention element according to the present embodiment, as shown by FIG. 3A to FIG. 4G in order of each manufacturing process (Those are separated into two views for convenience' sake due to page space). In FIG. 3 and FIG. 4, a cross sectional pattern diagram along an X-X' dashed line in FIG. 2, that is to say, along the upper electrode wiring TE, and the cross sectional pattern diagram along an Y-Y' dashed line therein, that is to say, along the lower electrode wiring BE are shown at the left side and the right side respectively therein.

Manufacturing processes for the present invention element according to the present embodiment will be described in detail below with reference to FIG. 3 and FIG. 4.

First, a base insulating film 15 is to be formed on a semiconductor substrate 16 where peripheral circuits and the like (not shown) are properly formed on. According to the present embodiment, after depositing the base insulating film 15 of borophosphosilicate glass (BPSG) with a thickness of 1500 nm, a surface of such the film is flattened by polishing the surface of the BPSG film 15 on a top surface of the semiconductor substrate 16 to be the thickness of 800 nm using a so-called chemical mechanical polishing (CMP) method. Next, a material film (a first electrode film) 11 to be a lower electrode wiring is to be deposited thereon. According to the present embodiment, a Ti film of 5 nm thickness, a TiN film of 20 nm thickness, an Al—Cu film of 200 nm thickness, another Ti film of 5 nm thickness, and another TiN film of 100 nm thickness are to be deposited in order using a spattering method respectively, as a multilayer structure of TiN/Ti/Al—Cu/TiN/Ti. Moreover, an SiN film (a second insulating film) 17 is to be deposited with the thickness of 150 nm on the material film 11 to be the lower electrode wiring using a chemical vapor deposition (CVD) method. Next, the lower electrode wiring is to be formed by etching the SiN film 17 and the material film 11 to be the lower electrode wiring using a photolithography method with a resist as a mask (not shown) patterned as a line and space (L/S) shape shown as the lower electrode wiring BE in FIG. 2. And then as shown in FIG. 3A, an $SiO_2$ film (a first insulating film) 18 is to be deposited with the thickness of 600 nm using the CVD method thereunto.

Next, the $SiO_2$ film 18 is to be flattened and a top surface of the SiN film 17 is to be exposed by polishing the $SiO_2$ film 18 to the top surface level of the SiN film 17 using the CMP method, as shown in FIG. 3B. Here, the flattening method is not limited to the CMP method, as it may be also available to use any proper flattening technology including such as a spin-on method, the spin-on method combined with an etch back method, or the like.

Next, an open part A is to be formed by removing the SiN film 17 selectively for the $SiO_2$ film 18 and for the material film 11 to be the lower electrode wiring, using a dry etching method with an $NF_3$ plasma of downstream type, as shown in FIG. 3C. Here, the removing method for the SiN film 17 is not limited to the dry etching method, as it may be removed using a wet etching method with a heated phosphor treatment as well.

Next, a TiN film (an electrode film for a bump electrode material) 12 as one example of the material film to be a bump electrode material is to be deposited with the thickness of 40 nm using the spattering method over the surface thereof, as shown in FIG. 3D. In this case, it is able to form the TiN film 12 along an inner sidewall in the open part A with the thickness of 20 nm for example. Moreover, an $SiO_2$ film (a third insulating film) 19 is to be deposited over the surface with the thickness of 600 nm using the CVD method thereafter. Here, the TiN film 12 is formed along the open part A, so that the inside of the open part A may be not to be filled therewith.

Next, the $SiO_2$ film 19 is to be flattened and a top surface of the TiN film 12 is to be exposed by polishing the $SiO_2$ film 19 using the CMP method to the top surface level of the TiN film 12. And then the bump electrode material 12 is to be formed by removing the TiN film 12 on the $SiO_2$ film 18 except that inside the open part A using the etch back method thereafter, as shown in FIG. 4E.

Next, a $TiO_2$ film 13 is to be formed by thermal oxidation in an atmosphere including oxygen at a temperature of between 250 and 450° C. as one example of the variable resistor body formed by oxidizing an exposed apical part of the bump electrode material 12 comprised of the TiN film, as shown in FIG. 4F. According to the present embodiment, the variable resistor body is to be the $TiO_2$ film, however, it is also possible to form a $TiO_{2-x}N_x$ film having a characteristic of variable electrical resistance by controlling properly an oxidation condition, such as an oxidation temperature, an oxygen concentration, or the like.

Next, a material film (a second electrode film) 14 to be an upper electrode wiring is to be formed over the surface thereof. According to the present embodiment, a TiN film of 20 nm thickness, an Al—Cu film of 200 nm thickness, a Ti film of 5 nm thickness, and another TiN film of 100 nm thickness are to be deposited in order using the spattering method respectively, as a multilayer structure of TiN/Ti/Al—Cu/TiN. Next, the upper electrode wiring 14 is to be formed by etching the material film 14 to be the upper electrode wiring, with the resist as the mask (not shown) patterned as the line and space (L/S) shape shown as the upper electrode wiring TE in FIG. 2, using the photolithography method. Moreover, an interlayer insulating film 20 is to be deposited thereunto, and then a contact wiring (not shown) and a metal wiring (not shown) are to be formed for the upper electrode wiring 14 and the lower electrode wiring 11 respectively, as shown in FIG. 4G.

Regarding such the variable resistive element formed thereby, it becomes able to reduce an area of a contact surface between the variable resistor body and any of the electrodes comparing to that of the conventional configurations. The following is a detailed description in this regard with reference to the drawings.

Figure 5A:
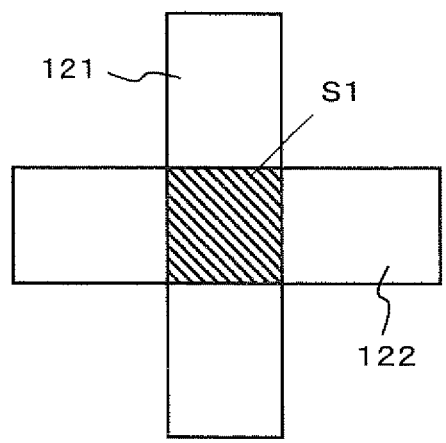
FIG. 5 is a plane pattern diagram showing electrically contributing regions in variable resistor bodies according to a conventional configuration and the first embodiment of the present invention, respectively.
Figure 5B:
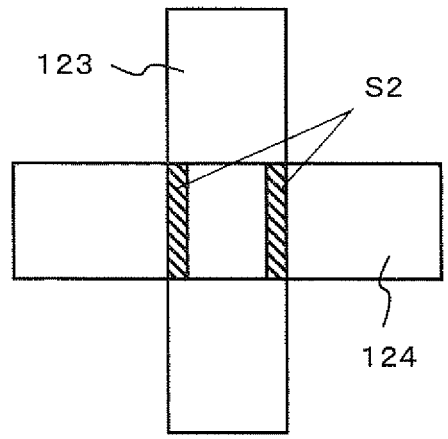

FIG. 5 is a plane pattern diagram of the variable resistive element according to the present embodiment comparing to a variable resistive element of a conventional configuration. FIG. 5A shows the one of the conventional configuration, and FIG. 5B shows regarding the configuration according to the present embodiment.

Regarding the conventional memory cell of 1R type, a cross point region as a region S1 (a shaded area in the figure) at an intersection of an lower electrode wiring 121 and an upper electrode wiring 122 is the electrically contributing region in the variable resistor body, as shown in FIG. 5A.

On the contrary, according to the variable resistive element regarding the present embodiment, there is provided the configuration that the bump electrode material is to be formed only in a partial region at an interface side on a lower electrode wiring 123 and to be electrically connected to an upper electrode wiring. And then the cross point region as a region S2 (a shaded area in the figure) at the intersection of such the bump electrode material and the upper electrode wiring 124 is to be the electrically contributing region in the variable resistor body.

The region S2 has a band shape with a width of at least the film thickness of the bump electrode material, and it is able to reduce the area comparing to the region S1 regarding the conventional variable resistive element. Moreover, it is able to form the bump electrode material using a self-aligned process, and then it is able to change arbitrarily such the area by controlling the film thickness thereof.

That is to say, it is able to reduce a contact area according to the configuration regarding the present embodiment comparing to the contact area of the conventional configuration. Thus, it becomes able to reduce a current consumption, and it becomes possible to manufacture a memory element reproducibly with a stable switching operation without becoming a programming impossible, by configuring a nonvolatile memory device using such the variable resistive element.

Here, the deposited insulating films are to be the $SiO_2$ film 18 and the $SiO_2$ film 19 in the above description, however, the insulating film is not limited to such the $SiO_2$ film; it may be also available to use any of proper insulating films including such as an SiN film, a polyimide film, an SiOF film, or the like. Moreover, regarding the deposition of the insulating films, it may be deposited using any proper deposition technology including such as a pulsed laser deposition, an rf-spattering, an electron beam evaporation, a thermal evaporation, an organo-metal deposition, a spin-on deposition, a metalorganic chemical vapor deposition, or the like. Ditto regarding each of the following embodiments.

The Second Embodiment

The second embodiment according to the present invention element and the present invention method (properly referred to as the present embodiment hereinafter) will be described in detail below with reference to FIG. 6 to FIG. 9. Here, a detailed description for a process which duplicates that of the first embodiment is properly omitted with mentioning that effect.

Moreover, the description as a first insulating film or a second insulating film is named for an insulating film for convenience' sake in order of depositing thereof for each of the embodiments, and it is to be used independently for each of the embodiment except a case of mentioning in particular. Ditto regarding each of the following embodiments.

Figure 6:
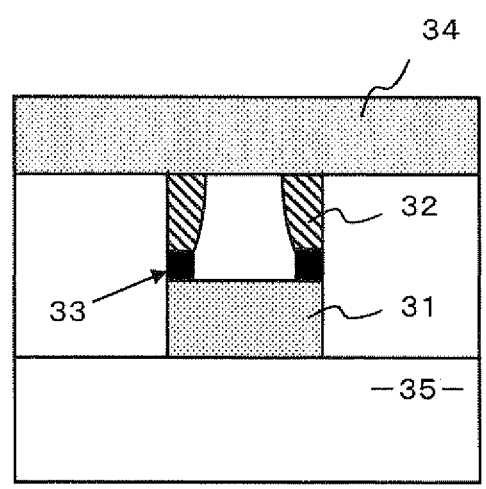
FIG. 6 is a brief cross sectional view showing a configuration of a variable resistive element according to the second embodiment of the present invention.

FIG. 6 is a cross sectional pattern diagram showing the present invention element according to the present embodiment. The present invention element according to the present embodiment comprises a configuration that a lower electrode wiring 31 and an upper electrode wiring 34 are formed on a base substrate 35, and a variable resistor body 33 as a memory material body is formed between the upper and the lower electrodes, wherein a bump electrode material 32 comprised of an electrically conductive material is connected to the upper electrode 34, and the bump electrode material 32 is connected to the lower electrode 31 via the variable resistor body 33, as shown in FIG. 6.

Next, the manufacturing method for a variable resistive element according to the present embodiment will be described in detail below, as an example for the case of applying to a memory cell of 1R type. FIG. 7 and FIG. 8 are views showing manufacturing processes for the present invention element according to the present embodiment, as shown by FIG. 7A to FIG. 8G in order of each manufacturing process (Those are separated into two views for convenience' sake due to page space). In FIG. 7 and FIG. 8, a cross sectional pattern diagram along the X-X' dashed line, that is to say, along the upper electrode wiring TE in FIG. 2 for showing the memory cell array of the 1R configuration, and a cross sectional pattern diagram along the Y-Y' dashed line therein, that is to say, along the lower electrode wiring BE are shown at the left side and the right side respectively therein. Moreover, FIG. 9 is a view showing the enlarged pattern diagram as shown in FIG. 7 or FIG. 8 for describing one process in the manufacturing processes.

Manufacturing processes for the present invention element according to the present embodiment will be described in detail below with reference to FIG. 7 to FIG. 9.

First, by performing the processes as completely similar to that of the first embodiment as shown in FIG. 3A, a material film (a first electrode film) 31 to be a lower electrode wiring processed using a pattern of lower electrode wiring BE and an SiN film (a second insulating film) 37 are to be formed onto a base insulating film 35 on a semiconductor substrate 36, as shown in FIG. 7A. Moreover, an $SiO_2$ film (a first insulating film) 38 is to be deposited over the surface thereof.

Next, an open part A is to be formed on the lower electrode wiring 31 as shown in FIG. 7B, by performing the processes as completely similar to that of the first embodiment as shown in FIG. 3B and FIG. 3C.

Figure 9A:
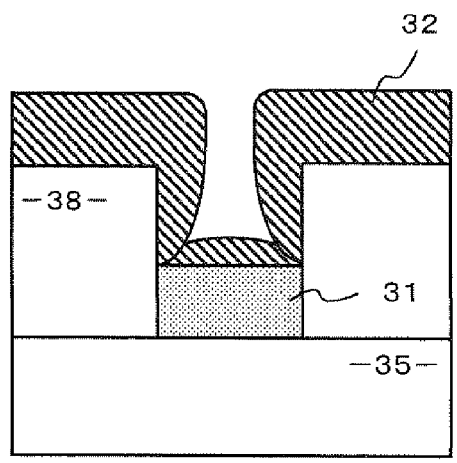
FIG. 9 is a brief cross sectional view showing the enlarged cross sectional views along the X-X' dashed line for FIG. 7C, FIG. 7D and FIG. 8E.

Next, a TiN film (an electrode film for a bump electrode material) 32 is to be deposited over the surface thereof as one example for a material film to be a bump electrode material, as shown in FIG. 7C. The following is a description regarding a deposition method therefor, with reference to an enlarged view. FIG. 9A is a view showing by enlarging the cross sectional view along the X-X' dashed line as shown in FIG. 7C.

As shown in FIG. 9A, the TiN film 32 is deposited using the spattering method so that the TiN film 32 at an open part A becomes an overhang shape. For example, in a case of assuming a thickness of the TiN film 32 at a flat part on the insulating film 38 as 40 nm, the thickness of such the TiN film deposited at an inner sidewall of the open part A is to be between 3 nm and 20 nm, and then the film thickness thereof becomes to be thinner toward a bottom of the open part. It is able to form easily in such the shape by controlling spattering conditions properly, such as a pressure, a substrate bias, a presence of a collimator, or the like.

Next, a process using an etch back is to be performed until the TiN film 32 on the insulating film 38 is completely removed, as shown in FIG. 7D. The TiN film 32 is to be retained only at the sidewall of the open part A by such the process, as shown with enlarging in FIG. 9B.

Figure 9B:
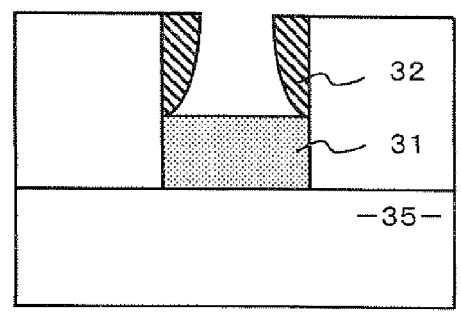
Figure 9C:
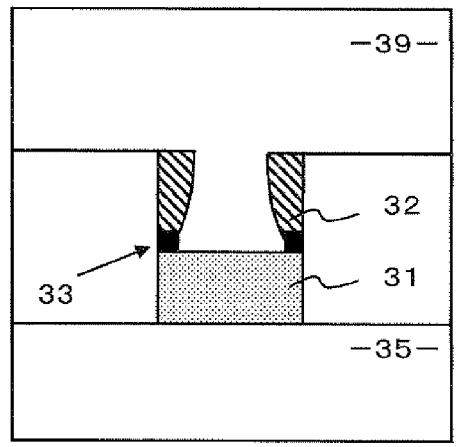

Next, an $SiO_2$ film (a third insulating film) 39 is to be deposited over the surface with a deposition thickness of 600 nm using a CVD method, as shown in FIG. 8E. Due to an oxidative atmosphere for a process to form such the $SiO_2$ film 39, a part of the retained TiN film 32 at the inner sidewall of the open part A cannot help but be oxidized at the period of depositing the $SiO_2$ film 39. According to the configuration of the present embodiment, the retained film thickness of the TiN film 32 is thinner toward the bottom of the open part A, as shown in FIG. 9B. Hence, a $TiO_2$ film is to be formed as the TiN film 32 located in the vicinity of the bottom of the open part A is oxidized in the process of forming the $SiO_2$ film 39. And then such the formed $TiO_2$ film is to be used as a material film for a variable resistor body. That is to say, a $TiO_2$ film 33 as a variable resistor body is to be formed at an interface part between the TiN film 32 and the lower electrode 31 (refer to FIG. 9C). Thus, there becomes provided a configuration in that a bump electrode material 32 and the lower electrode 31 are to be connected via the $TiO_2$ film 33.

Next, a surface of the $SiO_2$ film 39 is to be flattened and the TiN film 32 is to be exposed by polishing the $SiO_2$ film 39 using the CMP method to a top surface level of the TiN film 32, as shown in FIG. 8F. And then an upper electrode 34 is to be formed by patterning a material film (a second electrode film) to be the upper electrode wiring 34 and the bump electrode material 32 at a lower part thereof at the same time. This is to be an object for preventing an adjacent pair of the upper electrodes from shorting out due to the bump electrode material 32, because each of extending directions for the upper electrode wiring 34 and the bump electrode material 32 crosses each other.

Moreover, an interlayer insulating film 40 is to be deposited thereafter (refer to FIG. 8G), and then a contact wiring (not shown) and a metal wiring (not shown) are to be formed for the upper electrode wiring 34 and the lower electrode wiring 31 respectively.

According to the configuration of the present embodiment, the upper electrode wiring 34 and the TiN film 32 retained at the inside of the open part A are electrically connected. That is to say, the bump electrode material 32 is connected to the upper electrode 34 as shown in FIG. 6, and it comprises the variable resistor body 33 at an edge part in a downward direction therefrom. Therefore, the plane pattern diagram according to the present embodiment becomes to be similar to that of the first embodiment as shown in FIG. 5B, showing the configuration in that the bump electrode material is to be formed only in a partial region at an interface side of the region on a lower electrode wiring 123 and to be electrically connected to an upper electrode wiring, and then a region S2 (a shaded area in the figure) as a cross point region between such the bump electrode material and the upper electrode wiring 124 becomes to be an electrically contributing region of the variable resistor body.

According to such the variable resistive element formed thereby, it is able to reduce an area of a contact surface between the variable resistor body and any of the electrodes compared with that of the conventional configuration, as similar to that according to the first embodiment. Thus, it becomes able to reduce a current consumption, and it becomes possible to manufacture a memory element reproducibly with a stable switching operation without occurring a programming impossible, by configuring a nonvolatile memory device using such the element.

Here, according to the present embodiment, the oxidation to be progressed at the period of depositing the oxide film is used, however, it is not limited thereto, and it may be also available to use another oxidation method therefor, such as a thermal oxidation in an oxygen atmosphere, an oxidation in an oxygen plasma, an ozone oxidation, or the like.

The Third Embodiment

The third embodiment according to the present invention element and the present invention method (properly referred to as the present embodiment hereinafter) will be described in detail below with reference to FIG. 10 and FIG. 11. Here, a detailed description for a process which duplicates that of the first embodiment is properly omitted with mentioning that effect.

According to the above mentioned first and the second embodiment, the variable resistor body is formed by oxidizing the bump electrode material, however, the present invention element is to be formed using a method for depositing a variable resistor body directly onto a bump electrode material according to the present embodiment. The following is a description as an example for the case of applying the manufacturing method for a variable resistive element according to the present embodiment to a memory cell of 1R type.

FIG. 10 and FIG. 11 are views showing manufacturing processes for the present invention element according to the present embodiment, as shown by FIG. 10A to FIG. 11G in order of each manufacturing process (Those are separated into two views for convenience' sake due to page space). In FIG. 10 and FIG. 11, a cross sectional pattern diagram along the X-X' dashed line, that is to say, along the upper electrode wiring TE in FIG. 2 for showing the memory cell array of the 1R configuration, and a cross sectional pattern diagram along the Y-Y' dashed line, that is to say, along the lower electrode wiring BE in FIG. 2 are shown at the left side and the right side respectively therein.

First, by performing the processes as completely similar to that of the first embodiment as shown in FIG. 3A, a material film (a first electrode film) 41 to be a lower electrode wiring processed using a pattern of lower electrode wiring BE and an SiN film (a second insulating film) 47 are to be formed onto a base insulating film 45 on a semiconductor substrate 46, as shown in FIG. 10A. Moreover, an $SiO_2$ film (a first insulating film) 48 is to be deposited over the surface thereof.

Next, the $SiO_2$ film 48 is to be flattened until a surface of the SiN film 47 becomes exposed as shown in FIG. 10B, by performing the processes as completely similar to that of the first embodiment as shown in FIG. 3B.

Next, an open part A is to be formed on the lower electrode wiring 41 as shown in FIG. 10C, by performing the processes as completely similar to that of the first embodiment as shown in FIG. 3C.

Next, a TiN film 42 as one example for a bump electrode material (an electrode film for the bump electrode material) and then an $SiO_2$ film 49 are to be deposited over the surface thereof, as shown in FIG. 10D, by performing the processes as completely similar to that of the first embodiment as shown in FIG. 3D.

Next, the bump electrode material 42 comprised of the TiN film is to be formed as shown in FIG. 11E, by performing the processes as completely similar to that of the first embodiment as shown in FIG. 3E.

Next, a $TiO_2$ film 43 as one example of a material film for a variable resistor body (a variable resistor body film) 43 is to be deposited over the surface thereof, as shown in FIG. 11F. It is able to deposit the $TiO_2$ film 43 by applying a direct current (DC) power of 1.5 $kW/cm^2$ to a Ti target using a magnetron spattering method under the conditions of a gas flow rate of $Ar/O_2$=5 sccm/15 sccm and a pressure of between 3 and 15 mTorr, as one example of a deposition method therefor.

Next by performing the processes as completely similar to that of the first embodiment as shown in FIG. 3G, an upper electrode wiring 44 and an interlayer insulating film 50 are formed, and then a contact wiring (not shown) and a metal wiring (not shown) for the upper electrode wiring 44 and for the lower electrode wiring 41 are to be formed respectively.

According to the configuration of the present embodiment, there becomes provided a configuration in that the upper electrode wiring 44 and the bump electrode material 42 are to be connected via the variable resistor body 43, and the bump electrode material 42 is to be connected to the lower electrode 41. Therefore, the plane pattern diagram according to the present embodiment becomes to be similar to that of the first and the second embodiments as shown in FIG. 5B, showing the configuration in that the bump electrode material is to be formed only in a partial region at an interface side of the region on a lower electrode wiring 123 and to be electrically connected to an upper electrode wiring, and then a region S2 (a shaded area in the figure) at a cross point region between such the bump electrode material and the upper electrode wiring 124 becomes to be an electrically contributing region of the variable resistor body.

According to such the variable resistive element formed thereby, it is able to reduce an area of a contact surface between the variable resistor body and any of the electrodes compared with that of the conventional configuration, as similar to that according to the first and the second embodiments. Thus, it becomes able to reduce a current consumption, and it becomes possible to manufacture a memory element reproducibly with a stable switching operation without occurring a programming impossible, by configuring a nonvolatile memory device using such the element.

Here, the variable resistor body 43 is to be the titanium oxide formed using the spattering method according to the above description, however, the deposition method is not limited thereto, and it may be formed using the CVD method as well. In the case of forming thereof using the CVD method, it may be formed with using a material of such as $TiCl_4$, or an organo-metal of such as $Ti(OCH_3)_4$, $Ti(OC_2H_6)_4$, $Ti(O\text{-}i\text{-}C_3H_7)_4$, $Ti(O\text{-}n\text{-}C_4H_7)_4$, $Ti(O\text{-}n\text{-}C_4H_9)_4$, $Ti(O\text{-}sec\text{-}C_4H_9)_4$, $Ti(N(CH_3)_2)_4$, $Ti(N(C_2H_5)_2)_4$, or the like, by introducing into a reaction chamber using a carburetor for reacting with oxygen with a substrate heated at a temperature of between 250° C. and 500° C.

Moreover, not only the titanium oxide but also a titanium oxynitride film may be also applicable to the variable resistor body 43. For example, it is also possible to use a $TiO_{2-X}N_X$ film having a characteristic of variable electrical resistance using the spattering with a target of $TiO_2$ in a gaseous environment of $N_2/O_2/Ar$ by controlling properly a gas flow ratio therebetween.

The Fourth Embodiment

The fourth embodiment according to the present invention element and the present invention method (properly referred to as the present embodiment hereinafter) will be described in detail below with reference to FIG. 12 to FIG. 15. Here, a detailed description for a process which duplicates that of the first embodiment is properly omitted with mentioning that effect.

Figure 12:
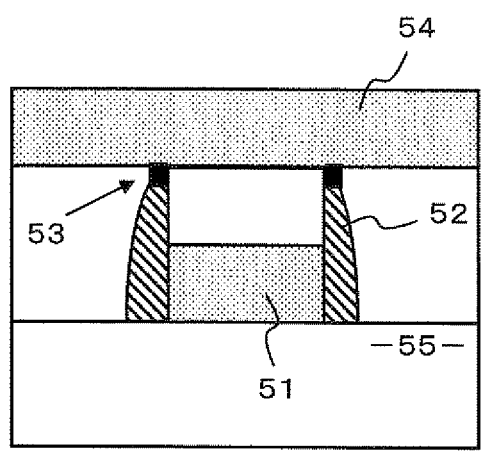
FIG. 12 is a brief cross sectional view showing a configuration of a variable resistive element according to the fourth embodiment of the present invention.

FIG. 12 is a cross sectional pattern diagram showing the present invention element according to the present embodiment. The present invention element according to the present embodiment comprises a configuration that a lower electrode wiring 51 and an upper electrode wiring 54 are formed on a base substrate 55, and a variable resistor body 53 as a memory material body is formed between the upper and the lower electrodes, wherein a bump electrode material 52 comprised of an electrically conductive material is connected to the lower electrode 51, and the bump electrode material 52 is connected to the upper electrode 54 via the variable resistor body 53, as shown in FIG. 12.

Next, the manufacturing method for the present invention element according to the present embodiment will be described in detail below, as an example for the case of applying to a memory cell of 1R type as shown in FIG. 2. FIG. 13 and FIG. 14 are views showing manufacturing processes for the present invention element according to the present embodiment, as shown by FIG. 13A to FIG. 14G in order of each manufacturing process (Those are separated into two views for convenience' sake due to page space). In FIG. 13 and FIG. 14, a cross sectional pattern diagram along the X-X' dashed line, that is to say, along the upper electrode wiring TE in FIG. 2 for showing the memory cell array of the 1R configuration, and a cross sectional pattern diagram along the Y-Y' dashed line therein, that is to say, along the lower electrode wiring BE are shown at the left side and the right side respectively therein.

First, a base insulating film 65 is to be formed on a semiconductor substrate 66 where peripheral circuits and the like (not shown) are properly formed. According to the present embodiment as well as the first embodiment, after depositing the BPSG film 65 with the film thickness of 1500 nm, a surface thereof is flattened by polishing the surface of the BPSG film 65 using the CMP method to be the thickness of 800 nm on a top surface of the semiconductor substrate 66. Next, a material film (a first electrode film) 61 to be a lower electrode wiring is to be deposited thereon. According to the present embodiment, a Ti film of 5 nm thickness, a TiN film of 20 nm thickness, an AlCu film of 200 nm thickness, another Ti film of 5 nm thickness, and another TiN film of 100 nm thickness are to be deposited in order using the spattering method respectively, as the multilayer structure of TiN/Ti/Al—Cu/TiN/Ti. Moreover, an SiN film (a first insulating film) 67 is to be deposited using the CVD method with the thickness of 150 nm on the material film 61 to be the lower electrode wiring. Next, the lower electrode wiring is to be formed as shown in FIG. 13A, by etching the SiN film 67 with a resist as a mask (not shown) patterned as the line and space (L/S) shape shown as the lower electrode wiring BE in FIG. 2 using the photolithography method, by removing the resist thereafter, and by etching the material film 61 to be the lower electrode wiring using the SiN film 67 as another mask thereafter.

Next, a TiN film (an electrode film for a bump electrode material) 62 as one example for a material film to be a bump electrode material is to be deposited using the spattering method with the thickness of 40 nm over the surface thereof, as shown in FIG. 13B. In this case, it is able to form the thickness of the TiN film 62 along a sidewall of the lower electrode 61 as approximately 20 nm for example.

Next, a process using the etch back is to be performed until the TiN film 62 on the base insulating film 65 and on the SiN film 67 is completely removed. The TiN film 62 is retained along the sidewalls of the lower electrode 61 and of the SiN film 67 by such the process, as shown in FIG. 13C.

Next, an $SiO_2$ film (a second insulating film) 68 is to be deposited using the CVD method with the thickness of 600 nm over the surface thereof, as shown in FIG. 13D.

Next, the $SiO_2$ film 68 is to be flattened and a part of the TiN film 62 is to be exposed by polishing the $SiO_2$ film 68 using the CMP method to the top surface level of the TiN film 62, as shown in FIG. 14E. Here, the flattening method is not limited to the CMP method, and it may be also available to use any proper flattening technology including such as the spin-on method, the spin-on method combined with the etch back method, or the like.

Next, a $TiO_2$ film 63 as one example for a variable resistor body is to be formed by thermally oxidizing the exposed part of the bump electrode material 62 comprised of the TiN film in the atmosphere including oxygen at the temperature of between 250 and 450° C., as shown in FIG. 14F.

Next, a material film (a second electrode film) 64 to be an upper electrode wiring is to be deposited over the surface thereof. According to the present embodiment, a TiN film of 20 nm thickness, an AlCu film of 200 nm thickness, a Ti film of 5 nm thickness, and another TiN film of 100 nm thickness are to be deposited in order using the spattering method respectively, as the multilayer structure of TiN/Ti/Al—Cu/TiN. Next, an upper electrode wiring 64 is to be formed by etching the material film 64 to be the upper electrode wiring with a resist as a mask (not shown) patterned as the line and space (L/S) shape shown as the upper electrode wiring TE in FIG. 2, using the photolithography method. Moreover, an interlayer insulating film 69 is to be deposited thereafter, and then a contact wiring (not shown) and a metal wiring (not shown) are to be formed for the upper electrode wiring 64 and the lower electrode wiring 61 respectively, as shown in FIG. 14G.

According to the configuration regarding the present embodiment, there is provided the configuration that the upper electrode wiring 54 and the bump electrode material 52 are to be connected via the variable resistor body 53, and then the bump electrode material 52 is to be connected to the lower electrode 51 at the sidewall thereof. According to such the variable resistive element formed thereby, it becomes able to reduce the area of the contact surface between the variable resistor body and any of the electrodes compared with that of the conventional configurations, as well as the above mentioned each of the embodiments.

Figure 15A:
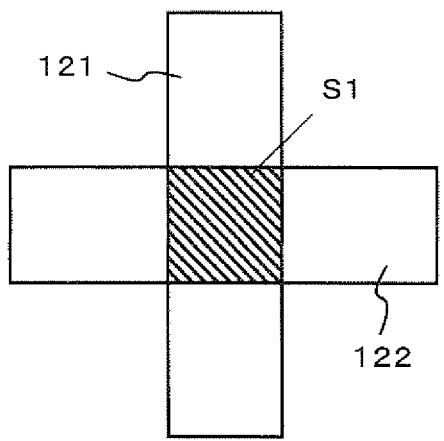
FIG. 15 is a plane pattern diagram showing an electrically contributing region of a variable resistor body according to a conventional configuration and the fourth embodiment of the present invention.
Figure 15B:
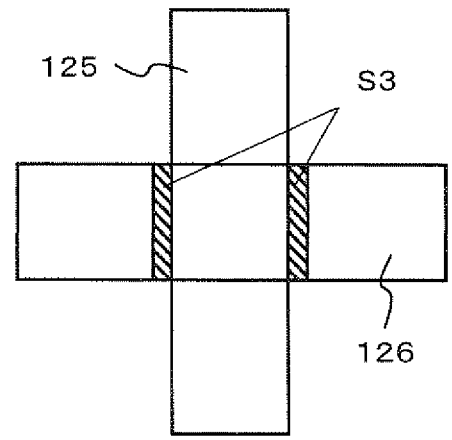

FIG. 15 is a plane pattern diagram of the variable resistive element according to the present embodiment compared with a variable resistive element of a conventional configuration. FIG. 15A shows the one of the conventional configuration, and FIG. 15B shows the configuration according to the present embodiment. Here, the configuration as shown in FIG. 15A is similar to that shown in FIG. 5A.

According to the variable resistive element regarding the present embodiment, there is provided the configuration that the bump electrode material is to be formed only at an outside region of the sidewall of a lower electrode wiring 125, and such the bump electrode material is to be connected to an upper electrode wiring 126. And then a region S3 (a shaded area in the figure) as the cross point region between such the bump electrode material and the upper electrode wiring 126 becomes to be the electrically contributing region of the variable resistor body.

The region S3 has the linear shape with the width of at least the film thickness of the bump electrode material, however, it is able to reduce an area of such the region compared with the region S1 regarding the conventional variable resistive element. Moreover, it is able to form the bump electrode material by using the self-aligned process, and then it is able to change arbitrarily such the area by controlling the film thickness thereof.

That is to say, it is able to reduce a contact area according to the configuration regarding the present embodiment compared with the contact area of the conventional configuration, as well as the configuration of the above mentioned each of the embodiments. Thus, it becomes able to reduce the current consumption, and it becomes possible to manufacture the memory element reproducibly with the stable switching operation without occurring the programming impossible, by configuring a nonvolatile memory device using such the element.

Here, the variable resistor body is formed by oxidizing the exposed part of the bump electrode material 62 according to the present embodiment, however, it may also available to form a variable resistor body onto the top surface of the bump electrode material 62 by depositing a $TiO_2$ film (variable resistor body film) for example as the material film for variable resistor body, as above mentioned in the third embodiment.

The Fifth Embodiment

The fifth embodiment according to the present invention element and the present invention method (properly referred to as the present embodiment hereinafter) will be described in detail below with reference to FIG. 16. Here, a detailed description for a process which duplicates that of the first embodiment is properly omitted with mentioning that effect.

According to the above mentioned each of the embodiments, there is described as one example for the case of applying to the memory cell of 1R type, however, a memory cell is not limited thereto. Regarding the present embodiment, a variable resistive element and its manufacturing method in the case of being applied to a memory cell of 1T/1R type will be described in detail below as another example.

FIG. 16 is a view showing manufacturing processes for the present invention element according to the present embodiment, as shown by FIG. 16A to FIG. 16H in order of each manufacturing process.

Figure 16A:
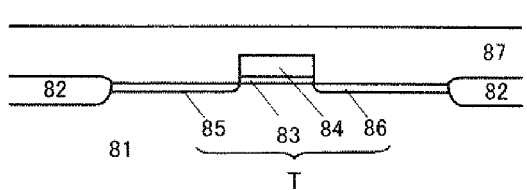
FIG. 16 is a brief cross sectional view showing a variable resistive element according to the fifth embodiment of the present invention in order of manufacturing process.

First, a selective transistor T is to be formed on a semiconductor substrate 81 in accordance with the following heretofore known processes, as shown in FIG. 16A. That is to say, the selective transistor T is to be formed on the semiconductor substrate 81 that an element isolation region 82 is formed, which is comprised of a gate insulating film 83, a gate electrode 84, a drain region 85 and a source region 86 as diffusion layers, and then a base interlayer insulating film 87 is to be formed thereunto. According to the present embodiment, after depositing a BPSG film with a film thickness of 1200 nm therefor, a surface thereof is to be flattened by polishing the surface of the BPSG film using the so-called CMP method until the thickness thereof becomes to be 400 nm on the gate electrode 84.

Figure 16B:
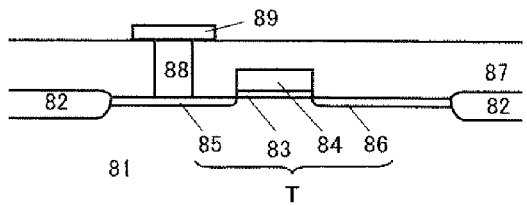

Next, a contact plug 88 is to be formed for connecting between a lower electrode 89 and the drain region 85, as shown in FIG. 16B. Such the contact plug 88 is to be formed in accordance with the following heretofore known processes of: etching the base interlayer insulating film 87 with a resist as a mask patterned using the photolithography method; opening a part to be a contact hole 88 reaching the drain region 85 in the selective transistor T; depositing an electrically conductive polysilicon film thereunto; removing completely the electrically conductive polysilicon film on the base interlayer insulating film 87 by polishing it using the CMP method; and retaining the electrically conductive polysilicon film only at an inside of the contact hole 88.

Next, a lower electrode 89 comprised of a TiN film is to be formed by depositing the TiN film (a first electrode film) using the spattering method to be a thickness of 150 nm, and by patterning it using the photolithography method.

Figure 16C:
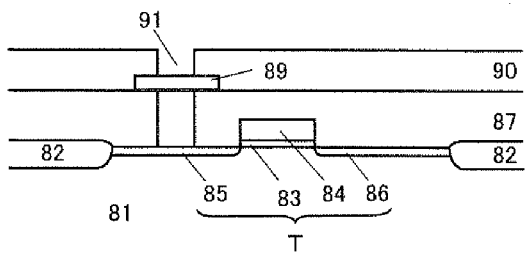

Next, an $SiO_2$ film (a first insulating film) 90 is to be deposited using the CVD method with the thickness of 600 nm over the surface thereof, and then a surface thereof is to be flattened by polishing the $SiO_2$ film 90 on the lower electrode 89 to be a thickness of 250 nm. Here, the flattening method is not limited to the CMP method, and it may be available to use any proper flattening technology including such as the spin-on method, the spin-on method combined with the etch back method, or the like. And then an open part 91 reaching the lower electrode 89 is to be formed as shown in FIG. 16C thereafter, by patterning the $SiO_2$ film 90 using the photolithography method.

Figure 16D:
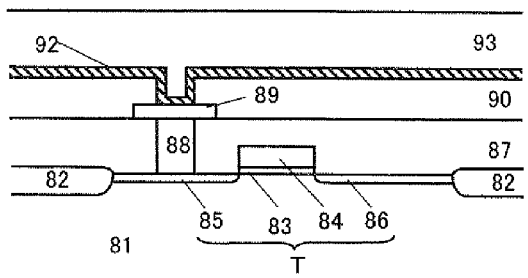

Next, a TiN film (an electrode film for a bump electrode material) 92 as one example for a material film to be a bump electrode material is to be deposited using the spattering method with the thickness of 40 nm over the surface thereof, as shown in FIG. 16D. In this case, it is able to form the TiN film 92 along a sidewall at an inside of the open part 91 with a thickness of approximately 20 nm for example. And then an $SiO_2$ film 93 is to be deposited using the CVD method with a thickness of 600 nm over the surface thereof.

Figure 16E:
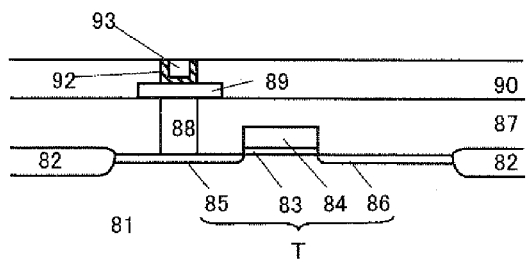

Next, the $SiO_2$ film 93 is to be flattened and the TiN film 92 is to be exposed by polishing the $SiO_2$ film 93 using the CMP method to a top surface level of the TiN film 92. And then a bump electrode material 92 comprised of the TiN film is to be formed by removing the TiN film 92 on the $SiO_2$ film 90 except that inside the open part 91 using the etch back method thereafter, as shown in FIG. 16E.

Figure 16F:
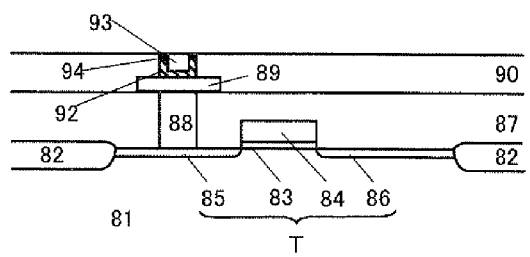

Next, a $TiO_2$ film 94 as one example for a variable resistor body is to be formed by thermally oxidizing an exposed part of the bump electrode material 92 comprised of the TiN film in the atmosphere including oxygen at a temperature of between 250 and 450° C., as shown in FIG. 16F.

Figure 16G:
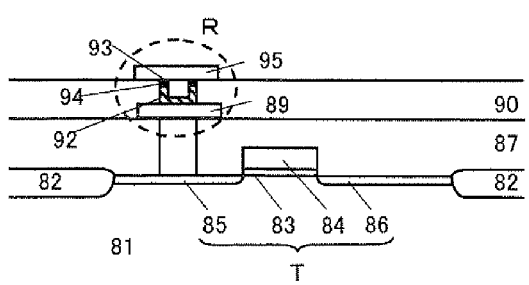

Next, a TiN film (a second electrode film) 95 as one example for a material film to be an upper electrode wiring is to be deposited over the surface thereof. According to the present embodiment, a TiN film is to be deposited using the spattering method with a film thickness of 150 nm. And then as shown in FIG. 16G, a variable resistive element R is to be formed, which is comprised of the upper electrode 95, the variable resistor body 94, and the lower electrode 89 connected to the bump electrode material 92, by processing the upper electrode 95 comprised of the TiN film, such as by patterning therefor with using the photolithography method.

Figure 16H:
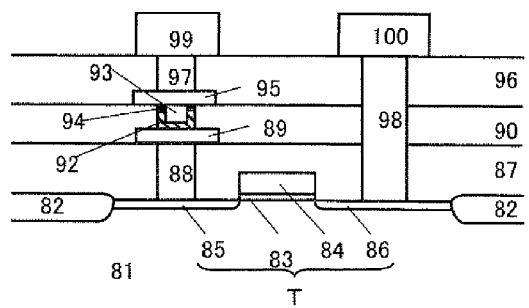

Next, an $SiO_2$ film 96 as an interlayer insulating film on the variable resistive element R is to be deposited using the CVD method, and then as shown in FIG. 16H, a bit wiring 99 for electrically connecting to the upper electrode 95 via a contact plug 97, and a source wiring 100 for electrically connecting to the source region 86 via a contact plug 98 are to be formed thereafter.

According to such the variable resistive element formed thereby, it becomes able to reduce an area of a contact surface between the variable resistor body and any of the electrodes compared with that of the conventional configurations. The following is a detailed description in this regard with reference to the drawings.

Figures 17A, 17B:
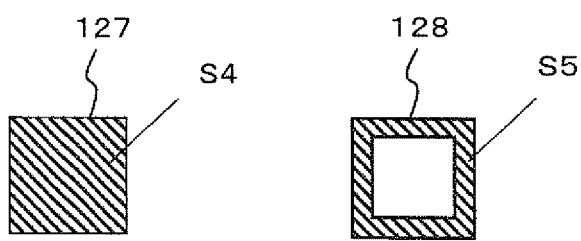
FIG. 17 is a plane pattern diagram comparing between a variable resistive element of a conventional configuration and a variable resistive element according to the fifth embodiment.

FIG. 17 is a plane pattern diagram of the variable resistive element according to the present embodiment compared with a variable resistive element of a conventional configuration, in the case of using the memory cell of 1T/1R type. FIG. 17A shows the one of the conventional configuration, and FIG. 17B shows the configuration according to the present embodiment.

In the case of the conventional configuration, an area of an electrically contributing region of the variable resistor body corresponds to the area of either one electrode of an upper electrode and a lower electrode regarding the structure shown in FIG. 37 for example, and corresponds to an area of an open part formed between an upper and a lower electrodes regarding the structure shown in FIG. 39. That is to say, a region of an open part 127 specified by a work dimension is almost coincident with an electrically contributing region S4 (a shaded area in the figure) of the variable resistor body, as shown in FIG. 17A.

On the contrary, according to the variable resistive element regarding the present embodiment, a region S5 (a shaded area in the figure) becomes to be the electrically contributing region of the variable resistor body, which is an overlapping part between such the bump electrode material and the upper electrode or the lower electrode, because the bump electrode material is to be formed along the inside region of the open part 128 as shown in FIG. 17B. Moreover, the region S5 has a square annular shape with a width of at least a film thickness of the bump electrode material, and it is able to reduce the area compared with the region S4 according to the conventional variable resistive element. Further, it is able to form the bump electrode material by using the self-aligned process, and then it is able to change arbitrarily such the area by controlling the film thickness thereof. Furthermore, it is also able to obtain the similar effect regardless of the planar shape of the bump electrode material, such as a rectangular annular shape, a round annular shape, or the like, based on the shape of the open part.

According to the present embodiment, there is described the method in which the bump electrode material is formed at the inside of the open part, however, it may be also able to comprise a configuration as another modified example that a bump electrode material is to be formed at a sidewall of a lower electrode by performing the processes as well as that of the fourth embodiment.

The Sixth Embodiment

The sixth embodiment according to the present invention element and the present invention method (properly referred to as the present embodiment hereinafter) will be described in detail below with reference to FIG. 18. Here, a detailed description for a process which duplicates that of the fifth embodiment is properly omitted with mentioning that effect.

FIG. 18 is a view showing manufacturing processes for the present invention element according to the present embodiment, as shown by FIG. 18A to FIG. 18G in order of each manufacturing process.

Figure 18A:
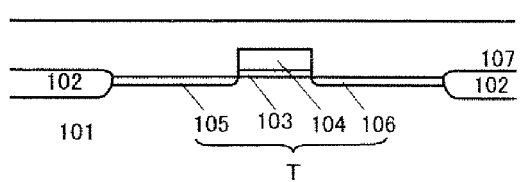
FIG. 18 is a brief cross sectional view showing a variable resistive element according to the sixth embodiment of the present invention in order of manufacturing process.

First, a selective transistor T is to be formed on a semiconductor substrate 101 by performing the processes as well as that of the fifth embodiment, as shown in FIG. 18A. That is to say, the selective transistor T is to be formed on the semiconductor substrate 101 that an element isolation region 102 is formed, which is comprised of a gate insulating film 103, a gate electrode 104, a drain region (a first electrode film) 105 and a source region 106 as diffusion layers, and then a base interlayer insulating film (a first insulating film) 107 is to be formed thereunto. According to the present embodiment, after depositing a BPSG film with a film thickness of nm therefor, a surface thereof is to be flattened by polishing the surface of the BPSG film using the so-called CMP method until the thickness thereof becomes to be 400 nm on the gate electrode 104.

Figure 18B:
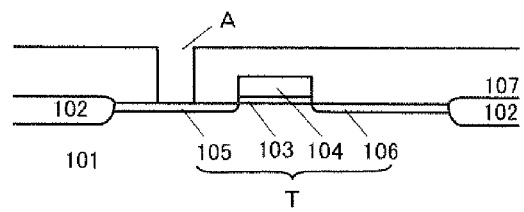

Next, an open part A as a contact hole reaching the drain region 105 is to be formed by etching the base interlayer insulating film 107 with a resist as a mask patterned using the photolithography method, as shown in FIG. 18B.

Figure 18C:
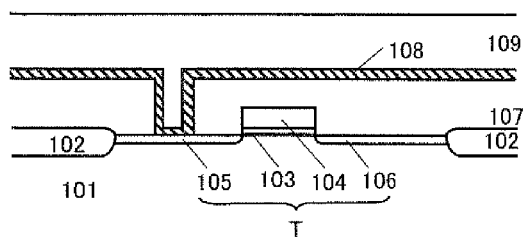

Next, a TiN film (an electrode film for a bump electrode material) 108 as one example for a material film to be a bump electrode material is to be deposited using the spattering method with a thickness of 20 nm over the surface thereof. According to the present embodiment, the thickness of the TiN film 108 formed at a sidewall of the open part A is to be approximately 20 nm. And then an $SiO_2$ film 109 is to be deposited using the CVD method with a thickness of 600 nm over the surface thereof, as shown in FIG. 18C.

Figure 18D:
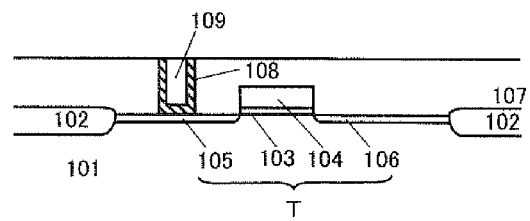

Next, the $SiO_2$ film 109 is to be flattened and the TiN film 108 is to be exposed by polishing the $SiO_2$ film 109 using the CMP method to a top surface level of the TiN film 108. And then a bump electrode material 108 comprised of the TiN film is to be formed by removing the TiN film 108 on the $SiO_2$ film 107 except that inside the open part A using the etch back method thereafter, as shown in FIG. 18D.

Figure 18E:
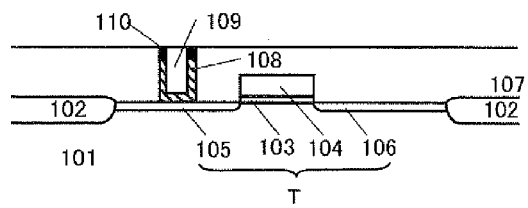

Next, a $TiO_2$ film 110 as one example for a variable resistor body is to be formed by thermally oxidizing an exposed part of the bump electrode material 108 comprised of the TiN film in the atmosphere including oxygen at a temperature of between 250 and 450° C., as shown in FIG. 18E.

Figure 18F:
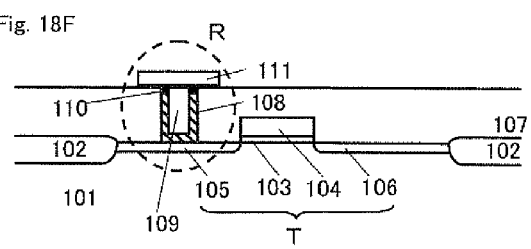

Next, a TiN film (a second electrode film) as one example for a material film to be an upper electrode wiring is to be deposited over the surface thereof. According to the present embodiment, a TiN film is to be deposited using the spattering method with a film thickness of 150 nm. And then as shown in FIG. 18F, a variable resistive element R is to be formed, which is comprised of the upper electrode 111, the variable resistor body 110, and a lower electrode connected to the bump electrode material 108, by processing the upper electrode 111 comprised of the TiN film, such as by patterning therefor with using the photolithography method. That is to say, according to the present embodiment, there is provided a configuration in that the drain region 105 in the transistor T assumes a role as the lower electrode.

Figure 18G:
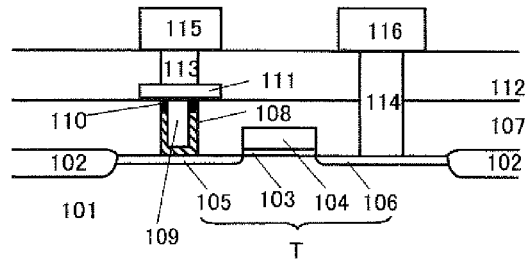

Next, an $SiO_2$ film 112 as an interlayer insulating film on the variable resistive element R is to be deposited using the CVD method, and then as shown in FIG. 18G, a bit wiring 115 for electrically connecting to the upper electrode 111 via a contact plug 113, and a source wiring 116 for electrically connecting to the source region 106 via a contact plug 114 are to be formed thereafter.

According to such the configuration as well as that of the fifth embodiment, an overlapping part between such the bump electrode material and the upper electrode or the lower electrode becomes to be an electrically contributing region of the variable resistor body, because the bump electrode material is to be formed along the inside of the open part. Such the region corresponds to a region S5 as shown in FIG. 17B. Such the region has a square annular shape with a width of at least a film thickness of the bump electrode material and it is able to reduce the area compared with the region S4 according to the conventional variable resistive element. Moreover, it is able to form the bump electrode material by using the self-aligned process, and then it is able to change arbitrarily such the area by controlling the film thickness thereof. Further, it is also able to obtain the similar effect regardless of the planar shape of the bump electrode material, such as a rectangular annular shape, a round annular shape, or the like, based on the shape of the open part.

The Seventh Embodiment

The seventh embodiment according to the present invention element and the present invention method (properly referred to as the present embodiment hereinafter) will be described in detail below with reference to FIG. 19 to FIG. 24. Here, a detailed description for a process which duplicates that of the first embodiment is properly omitted with mentioning that effect.

Figure 19:
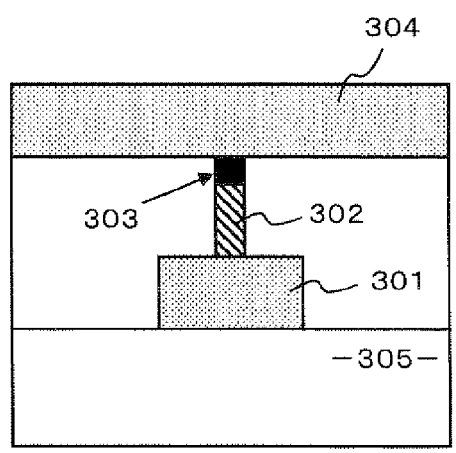
FIG. 19 is a brief cross sectional view showing a configuration of a variable resistive element according to the seventh embodiment of the present invention.

FIG. 19 is a cross sectional view showing the present invention element according to the present embodiment. The present invention element according to the present embodiment comprises a configuration that a lower electrode wiring 301 and an upper electrode wiring 304 are formed on a base substrate 305, and then a variable resistor body 303 as a memory material body is formed between the upper and the lower electrodes, wherein a bump electrode material 302 comprised of an electrically conductive material is connected to the lower electrode 301, and the variable resistor body 303 is formed on an apical part of the bump electrode material 302, as shown in FIG. 19.

Next, the manufacturing method for a variable resistive element according to the present embodiment will be described in detail below, as an example for the case of applying to a memory cell of 1R type. FIG. 20 to FIG. 22 are views showing manufacturing processes for the present invention element according to the present embodiment, as shown by FIG. 20A to FIG. 22I in order of each manufacturing process (Those are separated into three views for convenience' sake due to page space). In FIG. 20 to FIG. 22, a cross sectional pattern diagram along the X-X' dashed line, that is to say, along the upper electrode wiring TE in FIG. 2 for showing the memory cell array of the 1R configuration, and a cross sectional pattern diagram along the Y-Y' dashed line therein, that is to say, along the lower electrode wiring BE are shown at the left side and the right side respectively therein. Moreover, FIG. 23 is a plane pattern diagram showing a pattern layout of an open part WBE to be used in a manufacturing process as shown in FIG. 20C.

First, a base insulating film 315 is to be formed on a semiconductor substrate 316 where peripheral circuits and the like (not shown) are properly formed. According to the present embodiment as well as the first embodiment, after depositing the BPSG film 315 with a film thickness of 1500 nm, a surface thereof is flattened by polishing a surface of the BPSG film 315 using the CMP method to be a thickness of 800 nm on a top surface of the semiconductor substrate 316. Next, a material film (a first electrode film) 311 to be a lower electrode wiring is to be deposited thereon. According to the present embodiment, a Ti film of 5 nm thickness, a TiN film of 20 nm thickness, an AlCu film of 200 nm thickness, another Ti film of 5 nm thickness, and another TiN film of 105 nm thickness are to be deposited in order using the sputtering method respectively, as the multilayer structure of TiN/Ti/Al—Cu/TiN/Ti. Next, a lower electrode wiring 311 is to be formed as shown in FIG. 20A, by etching the material film 311 to be the lower electrode wiring with a resist as a mask (not shown) patterned as the line and space (L/S) shape shown as the lower electrode wiring BE in FIG. 2 using the photolithography method. Moreover, an $SiO_2$ film 317 is to be deposited using the CVD method with a thickness of 600 nm over the surface thereof.

Next, such the surface is to be flattened by polishing the $SiO_2$ film 317 using the CMP method to a top surface level of the lower electrode wiring 311. Moreover, an SiN film (a first insulating film) 318 is to be deposited using the CVD method with a thickness of 150 nm over the surface thereof, as shown in FIG. 20B.

Figure 23:
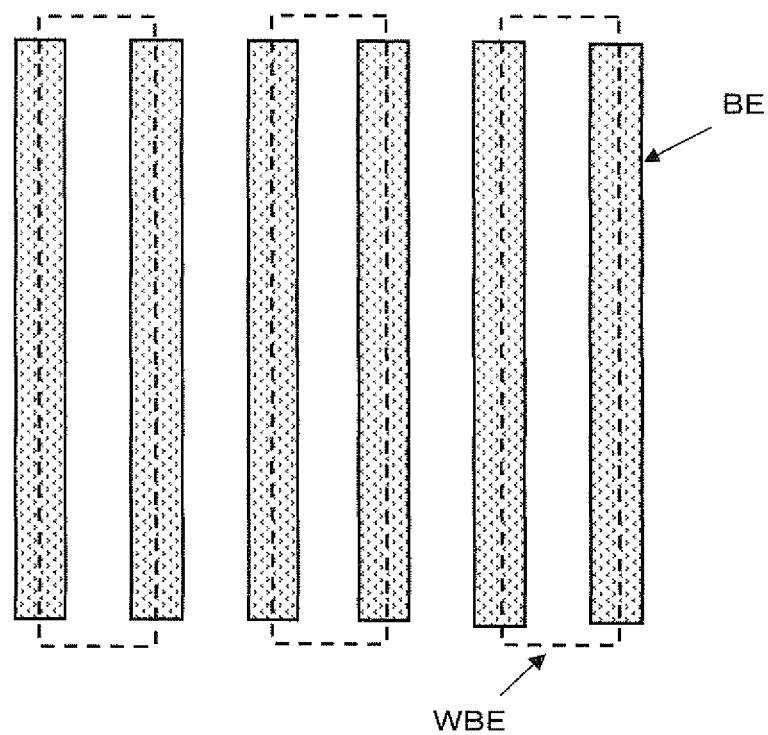
FIG. 23 is a plane pattern diagram showing a pattern layout of open parts regarding manufacturing processes of a variable resistive element according to the seventh embodiment of the present invention.

Next, an open part 319 is to be formed for between the adjacent pattern of the SiN film 318 as shown in FIG. 20C, by etching the SiN film 318 with a resist as a mask (not shown in FIG. 20) patterned with an open part of pattern shape shown as a region WBE surrounded by a dashed line in FIG. 23, using the photolithography method. In FIG. 23, a BE pattern is the configuration as similar to that of the lower electrode wiring BE as shown in FIG. 2, and the open part pattern WBE is the pattern to be extended toward the similar direction of the lower electrode wiring BE, wherein both sides at the long side are to be arranged on a region of any adjacent two of the lower electrode wirings BE respectively. Moreover, the open part pattern WBE is to be arranged iteratively, with twice the pitch of the lower electrode wirings BE, and in parallel to the lower electrode wiring BE. Here, the both sides at the long side (interfaces at the long side) of the open part pattern WBE are not required to be on central lines of the lower electrode wirings BE respectively, and they may exist anywhere as long as they are on each region of the lower electrode wirings BE respectively.

Next, a TiN film (an electrode film for a bump electrode material) 312 as a material film to be a bump electrode material is to be deposited using the sputtering method with a thickness of 40 nm over the surface thereof, as shown in FIG. 20D. In this case, it is able to form the TiN film along an inner side surface at an inside of the open part 319 with a thickness of 20 nm for example. Here, such the TiN film 312 is to be formed along the open part 319, and the inside of the open part 319 is not to be filled therewith.

Next, a process using the etch back is performed for the TiN film 312 to be removed completely from both surfaces of the insulating film 318 and the insulating film 317. Hence, the TiN film 312 is to be retained only along the sidewall at the inside of the open part 319 by such the process, as shown in FIG. 21E. Thus, a bump electrode material 312 comprised of the TiN film connected to the lower electrode wiring 311 is to be formed by such the process.

Next, an $SiO_2$ film (a second insulating film) 320 is to be deposited using the CVD method with a thickness of 600 nm over the surface thereof.

Next, the $SiO_2$ film 320 is to be flattened and an apical part of the TiN film 312 is to be exposed by polishing the $SiO_2$ film 320 using the CMP method to a top surface level of the SiN film 318, as shown in FIG. 21G. And then as a result of such the process, the insulating film 318 and the insulating film 320 become to be alternately arranged with sandwiching the bump electrode material 312 thereby, as shown in FIG. 21G as well.

Next, a $TiO_2$ film 313 is to be formed by thermal oxidation in an atmosphere including oxygen at a temperature of between 250 and 450° C. as one example for a variable resistor body formed by oxidizing an exposed apical part of the bump electrode material 312 comprised of the TiN film, as shown in FIG. 21H. According to the present embodiment, the variable resistor body is to be the $TiO_2$ film, however, it is also possible to form a $TiO_{2-x}N_x$ film having a characteristic of variable electrical resistance by controlling properly an oxidation condition, such as an oxidation temperature, an oxygen concentration, or the like. Moreover, according to the present embodiment, the variable resistor body is formed by thermally oxidizing the bump electrode material, however, it may be available to use another oxidation method as well as the above mentioned other embodiments, such as the oxidation in the oxygen plasma, the ozone oxidation, or the like. Or, it may be also available to deposit directly onto a bump electrode material by using the CVD method or the spattering method.

Next, a material film (a second electrode film) 314 to be an upper electrode wiring is to be deposited over the surface thereof. According to the present embodiment, a TiN film of 20 nm thickness, an AlCu film of 200 nm thickness, a Ti film of 5 nm thickness, and another TiN film of 100 nm thickness are to be deposited in order using the spattering method respectively, as the multilayer structure of TiN/Ti/Al—Cu/TiN. Next, an upper electrode wiring 314 is to be formed by etching the material film 314 to be the upper electrode wiring, the variable resistor body 313 and the bump electrode material 312, with a resist as a mask (not shown) patterned as the line and space (L/S) shape shown as the upper electrode wiring TE in FIG. 2, using the photolithography method. Moreover, an interlayer insulating film 321 is to be deposited thereafter, and then a contact wiring (not shown) and a metal wiring (not shown) are to be formed for the upper electrode wiring 314 and the lower electrode wiring 311 respectively, as shown in FIG. 22I. Here, according to the present embodiment for such the processes, the variable resistor body 313 and the bump electrode material 312 are also removed in addition to the upper electrode wiring 314, for preventing any adjacent pair of the BE wirings from shorting out due to the bump electrode material 312 formed along an inside of the open part pattern WBE as shown in FIG. 23. However, it may be also possible to etch only the upper electrode wiring 314 in the process for the upper electrode wiring as shown in FIG. 22I if at least a partial region of the bump electrode material 312 and the variable resistor body 313 is removed by patterning using the photolithography method and etching for example, which are retained at an arbitrary region except a memory cell array wherein none of the BE wirings are comprised.

According to such the variable resistive element formed thereby, it becomes able to reduce an area of a contact surface between the variable resistor body and any of the electrodes compared with that of the conventional configurations. The following is a detailed description in this regard with reference to the drawings.

Figure 24A:
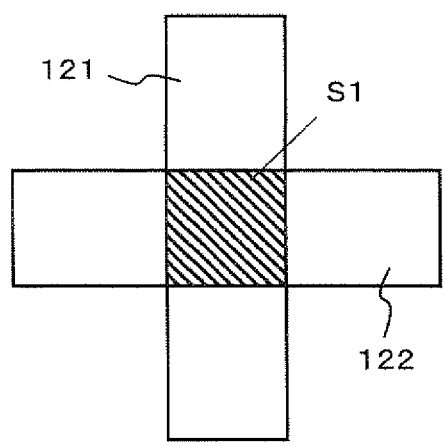
FIG. 24 is a plane pattern diagram showing an electrically contributing region of a variable resistor body according to a conventional configuration and the seventh embodiment of the present invention.
Figure 24B:
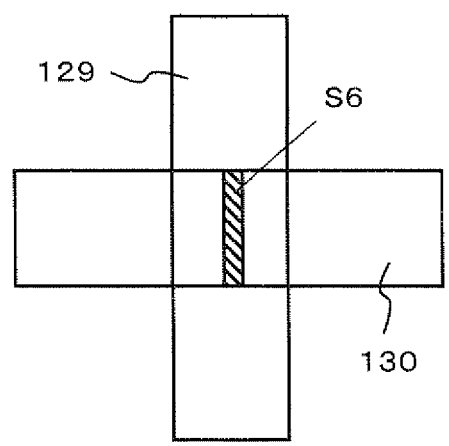

FIG. 24 is a plane pattern diagram of the variable resistive element according to the present embodiment compared with a variable resistive element of a conventional configuration. FIG. 24A shows the one of the conventional configuration, and FIG. 24B shows the configuration according to the present embodiment. Here, the configuration as shown in FIG. 24A is similar to that shown in FIG. 5A and FIG. 15A.

According to the variable resistive element regarding the present embodiment, there is provided the configuration that the bump electrode material is to be formed only at a partial region of an interface side for the open part pattern WBE as shown in FIG. 23 in a region on a lower electrode wiring 129, and it is to be electrically connected to the lower electrode wiring. And then a region S6 (the shaded area in the figure) as a cross point region between such the bump electrode material and an upper electrode wiring 130 becomes to be an electrically contributing region of the variable resistor body.

The region S6 has a linear shape with a width of at least the film thickness of the bump electrode material, however, it is able to reduce an area compared with the region S1 regarding the conventional variable resistive element. Moreover, it is able to form such the bump electrode material by using the self-aligned process, and then it is able to change arbitrarily such the area by controlling the film thickness thereof.

That is to say, it is able to reduce a contact area according to the configuration regarding the present embodiment compared with the contact area of the conventional configuration, as well as the configuration of the above mentioned each of the embodiments. Thus, it becomes able to reduce the current consumption, and it becomes possible to manufacture the memory element reproducibly with the stable switching operation without occurring the programming impossible, by configuring the nonvolatile memory device using such the element. Moreover, it becomes able to reduce the contract area further than that of the above mentioned first to the fourth embodiments wherein the contact area is two of the linear shape for one variable resistive element, because the contact area according to the configuration regarding the present embodiment is only one linear shape for one variable resistive element, by adding the photolithography process using the open part pattern WBE and the etching process.

According to the present embodiment, the insulating film 317 is to be the $SiO_2$ film and the insulating film 318 is to be the SiN film as to be dissimilar materials therebetween, because of ensuring an etching selectivity for the insulating film 317 at the period of the etching process for the insulating film 318 as shown in FIG. 20C. However, it may be available to use an SiN film for the insulating film 317, and an $SiO_2$ film for the insulating film 318. Or, it may be also applicable with combining properly films of dissimilar materials from insulating material alternatives including other insulating materials except the $SiO_2$ film and the SiN film. On the contrary, it is possible to use a similar material film for such the insulating films 317 and 318, such as the similar $SiO_2$ film for example, however, it is required to control the etching of the insulating film 318 for controlling a decrease in film thickness of the insulating film 317, and then it is more preferable to choose a different material therefrom.

Ditto, the insulating film 320 is to be the $SiO_2$ film according to the present embodiment, however, it may be available to use an SiN film or another insulating material film. However, it is more preferable to use a different material from that for the insulating film 318, for ensuring a polishing selectivity of the insulating film 320 for the insulating film 318 at the period of the CMP process therefor as shown in FIG. 21G.

Moreover, according to the present embodiment as well as the other embodiment, the material film 311 for the lower electrode wiring is to be the multilayer structure of TiN/Ti/Al—Cu/TiN/Ti, and the material film 312 for the bump electrode material is to be the TiN film. However, the film thickness for the TiN as the uppermost layer of the lower electrode wiring 311 is to be set with taking into consideration the decrease in film thickness thereof, because of occurring such the decrease in film thickness due to an over etching for such the TiN as the uppermost layer thereof at the period of the etching process for the TiN film 312 as shown in FIG. 21E. On the contrary, it is also possible to modify easily the manufacturing method to be such as a combination of dissimilar materials between the material of the uppermost layer of the lower electrode wiring 311 and the material film for the bump electrode material.

Further, the process for forming the variable resistor body film 313 according to the present embodiment is to be as shown in FIG. 21H, however, it is also possible to moodily easily such the process to be after that as shown in FIG. 20C. That is to say, it may be available to form a $TiO_2$ film to be a variable resistor body on an exposed surface of the lower electrode wiring 311 using the thermal oxidation method after the process as shown in FIG. 20C, and then to perform the following processes from FIG. 20D. As a result, the process as shown in FIG. 21H becomes unnecessary. In such a case, there is provided a configuration in that a variable resistor body is to be formed between a bump electrode material and a lower electrode wiring, and the bump electrode material is to be connected to an upper electrode wiring.

The Eighth Embodiment

The eighth embodiment according to the present invention element and the present invention method (properly referred to as the present embodiment hereinafter) will be described in detail below with reference to FIG. 25 to FIG. 27. Here, a detailed description for a process which duplicates that of the seventh embodiment is properly omitted with mentioning that effect.

Figure 25:
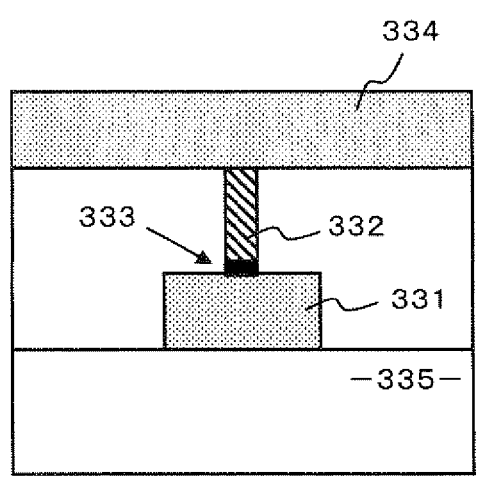
FIG. 25 is a brief cross sectional view showing a configuration of a variable resistive element according to the eighth embodiment of the present invention.

FIG. 25 is a cross sectional view showing the present invention element according to the present embodiment. The present invention element according to the present embodiment comprises a configuration that a lower electrode wiring 331 and an upper electrode wiring 334 are formed on a base substrate 335, and then a variable resistor body 333 as a memory material body is formed between the upper and the lower electrodes, wherein a bump electrode material 332 comprised of an electrically conductive material is connected to the upper electrode 334, and the bump electrode material 332 and the lower electrode 331 are facing via the variable resistor body 333, as shown in FIG. 25.

Next, the manufacturing method for a variable resistive element according to the present embodiment will be described in detail below, as an example for the case of applying to a memory cell of 1R type. FIG. 26 and FIG. 27 are views showing manufacturing processes for the present invention element according to the present embodiment, as shown by FIG. 26A to FIG. 27G in order of each manufacturing process (Those are separated into two views for convenience' sake due to page space). In FIG. 26 and FIG. 27, a cross sectional pattern diagram along the X-X' dashed line, that is to say, along the upper electrode wiring TE in FIG. 2 for showing the memory cell array of the 1R configuration, and a cross sectional pattern diagram along the Y-Y' dashed line therein, that is to say, along the lower electrode wiring BE are shown at the left side and the right side respectively therein.

First, by performing the processes as completely similar to that of the seventh embodiment as shown to FIG. 20C, a lower electrode wiring (a first electrode film) 341 processed using a pattern of lower electrode wiring BE and an SiO$_2$ film 347 implanted between each of the lower electrode wirings 341 are to be formed onto a base insulating film 345 on a semiconductor substrate 346, as shown in FIG. 26A. Moreover, an open part (a first open part) 349 is to be formed thereunto. Regarding a first insulating film processed using a pattern of open part WBE (corresponds to the insulating film 348 as shown in FIG. 26, and the insulating film 318 as shown in FIG. 20), the SiN film is to be used according to the seventh embodiment, however, such the film is to be an Al$_2$O$_3$ film 348 according to the present embodiment. That is to say, the Al$_2$O$_3$ film 348 is to be deposited using the spattering method with a thickness of 150 nm over the surface thereof, and then an open part 349 is to be formed for between the adjacent pattern of the Al$_2$O$_3$ film 348, by etching such the film with a resist as a mask patterned with the open part pattern WBE using the photolithography method.

Next, an SiO$_2$ film (a dummy film) 350 as an insulating material is to be deposited using the CVD method with a thickness of 25 nm over the surface thereof, as shown in FIG. 26B. In this case, it is able to form the SiO$_2$ film 350 along an inner side surface of the open part 349 with a thickness of 20 nm for example. Here, such the SiO$_2$ film 350 is to be formed along the open part 349, and an inside of the open part 349 is not to be filled therewith.

Next, a process using the etch back is to be performed until the SiO$_2$ film 350 on the insulating film 348 and on the insulating film 347 is completely removed. Hence, the SiO$_2$ film 350 is retained only along a side surface of the open part 349 (or a sidewall of the Al$_2$O$_3$ film 348) by such the process, as shown in FIG. 26C. And then an SiN film (a second insulating film) 351 is to be deposited using the CVD method with a thickness of 600 nm over the surface thereof.

Next, the SiN film 351 is to be flattened and an apical part of the SiO$_2$ film 350 formed along an inner side surface of the open part 349 is to be exposed by polishing the SiN film 351 using the CMP method to a top surface level of the Al$_2$O$_3$ film 348, as shown in FIG. 26D. And then as a result of such the process, the insulating film 348 and the insulating film 351 become to be alternately arranged with sandwiching the SiO$_2$ film 350 thereby, as shown in FIG. 26D as well.

Next, only the SiO$_2$ film 350 is to be removed selectively for the Al$_2$O$_3$ film 348, the SiN film 351 and for the lower electrode wiring 341, by using the wet etching method with a hydrofluoric acid, as shown in FIG. 27E. According to such the process, only a partial region on a top surface of the lower electrode wiring 341 is to be exposed by a thickness of the SiO$_2$ film 350 formed along an inner side surface of the open part 349, and then an open part (a second open part) 352 is to be formed with a height of a thickness of the Al$_2$O$_3$ film 348 or that of the SiN film 351.

Next, a TiO$_2$ film 343 is to be formed by thermal oxidation in an atmosphere including oxygen at a temperature of between 250 and 450° C. as one example for a variable resistor body formed by oxidizing an exposed part on a top surface of the lower electrode wiring 341 at an inside of the open part 352, as shown in FIG. 7F. According to the present embodiment, the variable resistor body is to be the TiO$_2$ film, however, it is also possible to form a TiO$_{2-x}$N$_x$ film having a characteristic of variable electrical resistance by controlling properly an oxidation condition, such as an oxidation temperature, an oxygen concentration, or the like. Moreover, according to the present embodiment, the variable resistor body is formed by thermally oxidizing a partial region of the lower electrode wiring 341, however, it may be also available to use another oxidation method as well as the above mentioned other embodiments, such as the oxidation in the oxygen plasma, the ozone oxidation, or the like.

Next, a material film (a second electrode film) 344 to be an upper electrode wiring is to be deposited over the surface thereof, as shown in FIG. 27G. According to the present embodiment, a TiN film of 20 nm thickness, an AlCu film of 200 nm thickness, a Ti film of 5 nm thickness, and another TiN film of 100 nm thickness are to be deposited in order using the spattering method respectively, as the multilayer structure of TiN/Ti/Al—Cu/TiN. The material film 344 to be the upper electrode wiring is to be implanted into the open part 352 by such the process, so that a bump electrode material 342 comprised of a material film 344 to be an upper electrode wiring is to be formed. Here, the upper electrode wiring 344 is shown as a shadow area using dots and the bump electrode material 342 is shown as a shaded area in FIG. 27G for convenience' sake, however, such the parts are the identical material film to be deposited at the identical process according to the present embodiment.

Next, an upper electrode wiring 344 is to be formed by etching the material film 344 to be the upper electrode wiring, the variable resistor body and the bump electrode material 342 with a resist as a mask (not shown) patterned as the line and space (L/S) shape shown as the upper electrode wiring TE in FIG. 2, using the photolithography method. Moreover, an interlayer insulating film 353 is to be deposited thereafter, and then a contact wiring (not shown) and a metal wiring (not shown) are to be formed for the upper electrode wiring 344 and the lower electrode wiring 341 respectively.

According to the configuration regarding the present embodiment, there is provided a configuration that the bump electrode material 332 and the lower electrode 331 are facing via the variable resistor body 333, and a bump electrode material 332 is to be connected to the upper electrode 334, as shown in FIG. 25. Therefore, the plane pattern diagram becomes to be similar to that of the seventh embodiment as shown in FIG. 24B, showing the configuration in that the bump electrode material is to be formed only at a partial region of an interface side for the open part pattern WBE as shown in FIG. 23, and then it becomes to be electrically connected to the upper electrode wiring. Therefore, the region S6 (the shaded area in FIG. 24) as the cross point region between such the bump electrode material and the lower electrode wiring 130 becomes to be the electrically contributing region of the variable resistor body.

According to such the variable resistive element formed thereby, it is able to reduce an area of a contact surface between the variable resistor body and any of the electrodes compared with that of the conventional configuration, as similar to that according to the seventh embodiment. Thus, it becomes able to reduce a current consumption, and it becomes possible to manufacture a memory element reproducibly with a stable switching operation without occurring a programming impossible, by configuring a nonvolatile memory device using such the element.

According to the present embodiment, the dummy film formed on the open part 349 is to be the SiO$_2$ film 350, however, it is not limited thereto, and it may be also available to use another material film. Moreover, such the dummy film is not required to be the insulating material film because it is to be removed at the process as shown in FIG. 27E, and it may be an electrically conductive material film as well. However, it is desirable to use a material to be able to remove by etching selectively for the insulating film 348, the insulating film 351 and for the lower electrode wiring 341. Moreover, such the selective etching is to be the wet etching by using the acid treatment according to the present embodiment, however, the present invention is not limited thereto.

Moreover, the insulating film 347, the insulating film 348 and the insulating film 351 are not limited to the materials according to the present embodiment, as well as that according to the seventh embodiment. However, it is more preferable to select a material individually, for such as the insulating film 348 different from that for the insulating film 347, and for the insulating film 351 different from that for the insulating film 348. As another example for taking into consideration the above mention, it may be also available to comprise a configuration in that the insulating film 348 is to be an SiN film, the insulating film 351 is to be an SiO$_2$ film, and the insulating film 350 is replaced with an amorphous Si (α-Si) film as a non-insulated material, and then the α-Si film 350 is to be removed by dry etching using a reactive ion etching (RIE) method at the process as shown in FIG. 27E.

Further, as a modified example of the present embodiment, it may be also possible to modify easily the process as implanting the inside of the open part 352 by depositing a material film for a bump electrode material over the surface thereof, after the process as shown in FIG. 27E, and then forming the bump electrode material at the inside of the open part 352 by using the etch back or the CMP. Next, a variable resistor body is to be formed at an apical part of the bump electrode material by oxidizing a top surface thereof, and then an electrode film for comprising an upper electrode is to be deposited thereafter. In such a case, the bump electrode material is to be connected to the lower electrode, and the variable resistor body is to be formed at the apical part of the bump electrode material. Hence, there is provided a configuration regarding a structure of cross sectional shape therefor as becoming to be similar to that in FIG. 19.

Furthermore, as another modified example of the present embodiment, it may be also possible to modify easily the process as implanting the inside of the open part 352 by depositing a material film for a bump electrode material over the surface thereof, after the process as shown in FIG. 27F, and then forming the bump electrode material at the inside of the open part 352 by using the etch back or the CMP. Next, an electrode film for comprising an upper electrode is to be deposited onto a top surface of the bump electrode material thereafter. In such a case, there is provided a configuration in that a variable resistor body is to be formed at a bottom edge of the bump electrode material, and then the upper electrode is to be formed at an upper part of the bump electrode material. Hence, there is provided a configuration regarding a structure of cross sectional shape therefor as becoming to be similar to that in FIG. 25.

The Ninth Embodiment

The ninth embodiment according to the present invention element and the present invention method (properly referred to as the present embodiment hereinafter) will be described in detail below with reference to FIG. 28 to FIG. 32. Here, a detailed description for a process which duplicates that of the seventh embodiment is properly omitted with mentioning that effect.

Figure 28A:
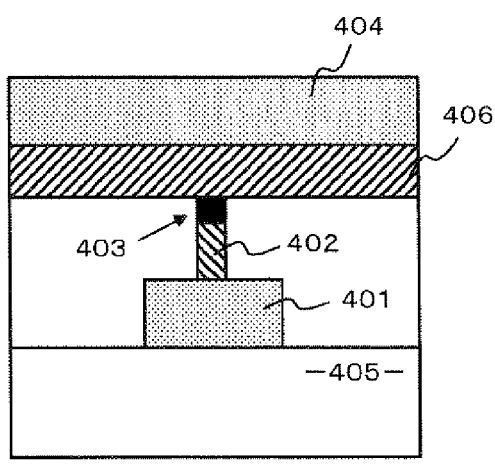
FIG. 28 is a brief cross sectional view showing a configuration of a variable resistive element according to the ninth embodiment of the present invention.
Figure 28B:
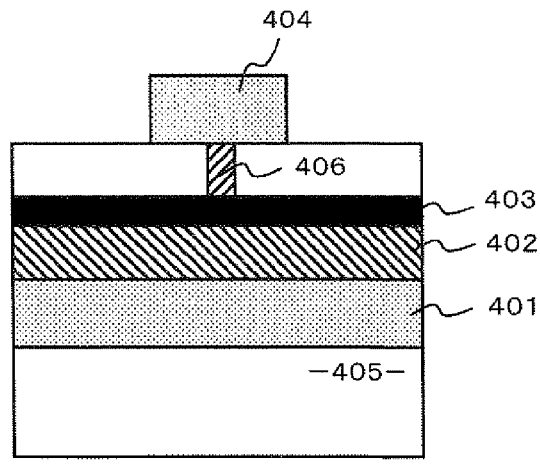

FIG. 28 is a cross sectional view showing the present invention element according to the present embodiment: FIG. 28A is a cross sectional view in a parallel direction of an upper electrode wiring 404; and FIG. 28B is a cross sectional view in a parallel direction of a lower electrode wiring 401. The present invention element according to the present embodiment comprises a configuration that the lower electrode wiring 401 and the upper electrode wiring 404 are formed on a base substrate 405, and then a variable resistor body 403 as a memory material body is formed between the upper and the lower electrodes, wherein a first bump electrode material 402 comprised of an electrically conductive material is connected to the lower electrode 401, a second bump electrode material 406 comprised of an electrically conductive material is connected to the upper electrode 404, the first bump electrode material 402 and the second bump electrode material 406 are facing via the variable resistor body 403, as shown in FIG. 28.

Next, the manufacturing method for a variable resistive element according to the present embodiment will be described in detail below, as an example for the case of applying to a memory cell of 1R type. FIG. 29 and FIG. 30 are views showing manufacturing processes for the present invention element according to the present embodiment, as shown by FIG. 29A to FIG. 30G in order of each manufacturing process (Those are separated into two views for convenience' sake due to page space). In FIG. 29 and FIG. 30, a cross sectional pattern diagram along the X-X' dashed line, that is to say, along the upper electrode wiring TE in FIG. 2 for showing the memory cell array of the 1R configuration, and a cross sectional pattern diagram along the Y-Y' dashed line therein, that is to say, along the lower electrode wiring BE are shown at the left side and the right side respectively therein.

Figure 31:
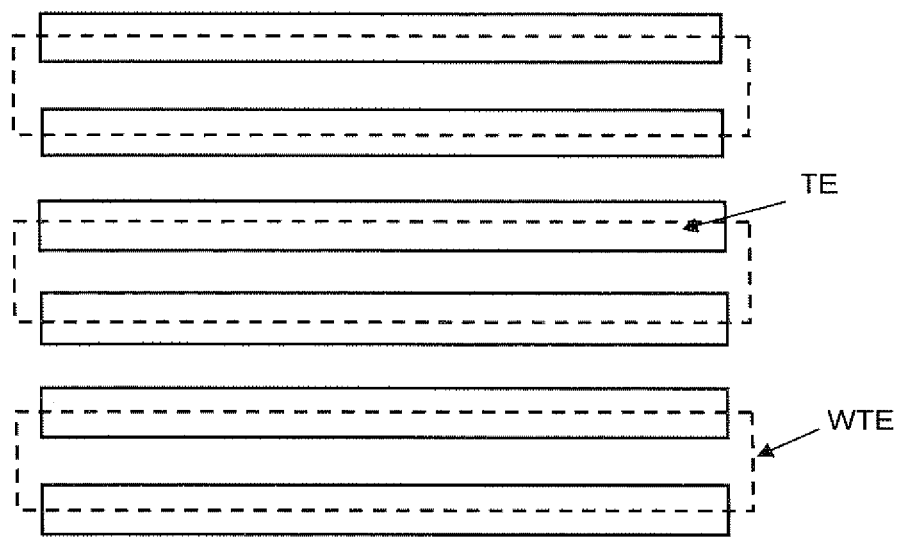
FIG. 31 is a plane pattern diagram showing a pattern layout of open parts regarding manufacturing processes of a variable resistive element according to the ninth embodiment of the present invention.

Moreover, FIG. 31 is a plane pattern diagram showing a pattern layout of an open part WTE to be used in a manufacturing process as shown in FIG. 29B.

First, by performing the processes as completely similar to that of the seventh embodiment as shown to FIG. 21H, a lower electrode wiring (a first electrode film) 411 processed using a pattern of lower electrode wiring BE and then an SiO$_2$ film 417 implanted between each of the lower electrode wirings 411 are to be formed onto a base insulating film 415 on a semiconductor substrate 416, as shown in FIG. 29A. Moreover, a first bump electrode material 412 is to be formed thereunto, which is connected to a partial region of a top surface of the lower electrode wiring 411, and comprised of a TiN film (an electrode film for a first bump electrode material). And then a TiO$_2$ film 413 as one example for a variable resistor body is to be formed by oxidizing an exposed apical part of such the first bump electrode material 412.

Here, in the present invention element according to the present embodiment, the two bump electrode materials are facing via the variable resistor body as above mentioned. As described later, such the bump electrode materials are formed by extending along a sidewall of an insulating film comprising individual open parts (an inner sidewall of an open part) respectively. For clarifying a relation between such the bump electrode material and a location in which such the bump electrode material is formed, there is described only for the present embodiment in that an insulating film comprising an open part for a first bump electrode material to be formed (a first open part) is referred to as a first insulating film, and another insulating film comprising an open part for a second bump electrode material to be formed (a second open part) is referred to as a second insulating film. And then an insulating film to be deposited for an object of filling the open part after forming the bump electrode material is referred to as a filler insulating film. That is to say, a insulating film to be deposited for an object of filling the inside of the first open part after forming the first bump electrode material is referred to as a first filler insulating film, and another insulating film to be deposited for an object of filling the inside of the second open part after forming the second bump electrode material is referred to as a second filler insulating film.

That is to say, the SiN film 318 according to the seventh embodiment corresponds to the first insulating film according to the present embodiment, and the open part 319 therein corresponds to the first open part according to the present embodiment. Moreover, the first bump electrode material 412 according to the present embodiment is to be formed so as to extend upward along an inner sidewall of such the first open part.

Moreover, an insulating film for filling the first open part after forming the first bump electrode material corresponds to the above mentioned first filler insulating film, which corresponds to the SiO$_2$ film 320 according to the seventh embodiment.

Next, an Al$_2$O$_3$ film (a second insulating film) 418 is to be deposited using the spattering method with a thickness of 150 nm over the surface thereof. And then an open part (a second open part) 419 is to be formed for between the adjacent pattern of the Al$_2$O$_3$ film 418 as shown in FIG. 29B, by etching the Al$_2$O$_3$ film 418 with a resist as a mask (not shown in FIG. 29) patterned with an open part of pattern shape shown as a region WTE surrounded by a dashed line in FIG. 31, using the photolithography method. In FIG. 31, a TE pattern is the configuration as similar to that of the upper electrode wiring TE as shown in FIG. 2, and the open part pattern WTE is the pattern to be extended toward the similar direction of the upper electrode wiring TE, wherein both sides at the long side are to be arranged on a region of any adjacent two of the upper electrode wirings TE respectively. Moreover, the open part pattern WTE is to be arranged iteratively, with twice the pitch of the upper electrode wirings TE, and in parallel to the upper electrode wiring TE. Here, the both sides at the long side (interfaces at the long side) of the open part pattern WTE are not required to be on central lines of the upper electrode wirings TE respectively, and they may exist anywhere as long as they are inside the upper electrode wirings TE respectively.

Next, a TiN film (an electrode film for a second bump electrode material) 420 as a material film to be a second bump electrode material is to be deposited using the spattering method with a thickness of 40 nm over the surface thereof, as shown in FIG. 29C. In this case, it is able to form the TiN film 420 along an inner side surface at an inside of the open part 419 with a thickness of 20 nm for example. Here, such the TiN film 420 is to be formed along the open part 419, and the inside of the open part 419 is not to be filled therewith.

Next, a process using the etch back is performed for the TiN film 420 to be removed completely from a surface of the insulating film 418. Hence, the TiN film 420 is to be retained only at an inner side surface of the open part 419, as shown in FIG. 29D. Thus, the second bump electrode material 420 comprised of the TiN film is to be formed by such the process.

Next, an inside of the open part 419 is to be filled by depositing an SiO$_2$ film (a second filler insulating film) 421 thereunto using the CVD method with a thickness of 600 nm over the surface thereof.

Next, a surface of the SiO$_2$ film 421 is to be flattened and an apical part of the TiN film 420 as the second bump electrode material is to be exposed by polishing the SiO$_2$ film 421 using the CMP method to a top surface level of the Al$_2$O$_3$ film 418, as shown in FIG. 30F.

Next, a material film (a second electrode film) 414 to be an upper electrode wiring is to be formed over the surface thereof. According to the present embodiment, a TiN film of 20 nm thickness, an AlCu film of 200 nm thickness, a Ti film of 5 nm thickness, and another TiN film of 100 nm thickness are to be deposited in order using the spattering method respectively, as the multilayer structure of TiN/Ti/Al—Cu/TiN. Next, an upper electrode wiring 414 is to be formed by etching the material film 414 to be the upper electrode wiring and the second bump electrode material 420 with a resist as a mask (not shown) patterned as the line and space (L/S) shape shown as the upper electrode wiring TE in FIG. 2, using the photolithography method. Moreover, an interlayer insulating film 422 is to be deposited thereafter, and then a contact wiring (not shown) and a metal wiring (not shown) are to be formed for the upper electrode wiring 414 and the lower electrode wiring 411 respectively, as shown in FIG. 30G.

According to such the variable resistive element formed thereby, it becomes able to reduce an area of a contact surface between the variable resistor body and any of the electrodes compared with that of the conventional configurations. The following is a detailed description in this regard with reference to the drawings.

Figure 32A:
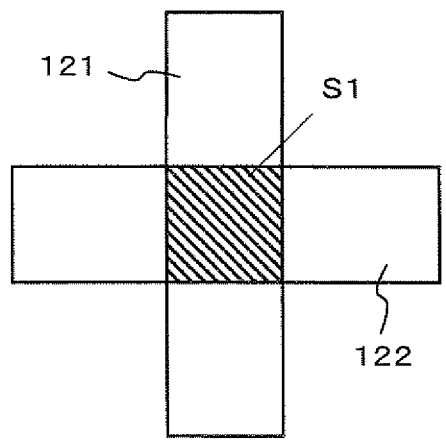
FIG. 32 is a plane pattern diagram showing an electrically contributing region of a variable resistor body according to a conventional configuration and the ninth embodiment of the present invention.
Figure 32B:
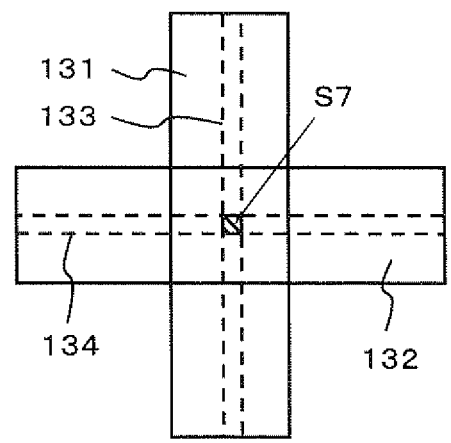

FIG. 32 is a plane pattern diagram of the variable resistive element according to the present embodiment compared with a variable resistive element of a conventional configuration. FIG. 32A shows the one of the conventional configuration, and FIG. 32B shows the configuration according to the present embodiment. Here, the configuration as shown in FIG. 32A is similar to those shown in FIG. 5A, FIG. 15A and FIG. 24A.

According to the variable resistive element regarding the present embodiment, there is provided a configuration that the first bump electrode material is to be formed only at a partial region of an interface side for the open part pattern WBE as shown in FIG. 23 in a region on a lower electrode wiring 131, and it is to be electrically connected to the lower electrode wiring 131 (a region 133 surrounded by a dashed line in FIG. 32), and then the second bump electrode material is to be formed only at a partial region of an interface side for the open part pattern WTE as shown in FIG. 31 in a region on a upper electrode wiring 132, and it is to be electrically connected to the upper electrode wiring 132 (a region 134 surrounded by a dashed line in FIG. 32). Therefore, a region S7 (a shaded area in the figure) as a cross point region between the region 133 for the first bump electrode material and the region 134 for the second bump electrode material becomes to be an electrically contributing region of the variable resistor body.

The region S7 has the rectangular shape with one side length of at least the film thickness of the first bump electrode material and the other side length of at least the film thickness of the second bump electrode material, however, it is able to reduce an area of such the region compared with the region S1 regarding the conventional variable resistive element. Moreover, it is able to form the first and the second bump electrode materials by using the self-aligned process, and then it is able to change arbitrarily such the area by controlling the film thickness thereof.

That is to say, it is able to reduce a contact area according to the configuration regarding the present embodiment compared with the contact area of the conventional configuration, as well as the configuration of the above mentioned each of the embodiments. Thus, it becomes able to reduce the current consumption, and it becomes possible to manufacture the memory element reproducibly with the stable switching operation without occurring the programming impossible, by configuring the nonvolatile memory device using such the element. Moreover, it becomes able to reduce the contract area more than that of the seventh and the eighth embodiments, by adding the photolithography process for the open part pattern WTE and the etching process.

Here, according to the present embodiment, the insulating films under the upper electrode wiring 414 are to be the $Al_2O_3$ film 418 and the $SiO_2$ film 421, however, it is not limited thereto, and it may be available to use other material films therefor respectively. However, it is more preferable to use a different material for the insulating film 418 from that for the insulating film 421, for ensuring a polishing selectivity of the insulating film 421 for the insulating film 418 at the period of the CMP process therefor as shown in FIG. 30F.

Moreover, according to the present embodiment, the variable resistor body film 413 is to be formed at the apical part of the first bump electrode material 412 at the process as shown in FIG. 29A, however, it is also available to adopt easily a modified example in that such the film is to be deposited after the process for the $Al_2O_3$ film 418. FIG. 33 is a view showing manufacturing processes for the present modified example, as shown by FIG. 33A to FIG. 33D in order of each manufacturing process. In FIG. 33, a cross sectional pattern diagram along the X-X' dashed line, that is to say, along the upper electrode wiring TE in FIG. 2 for showing the memory cell array of the 1R configuration, and a cross sectional pattern diagram along the Y-Y' dashed line therein, that is to say, along the lower electrode wiring BE are shown at the left side and the right side respectively therein.

First, by performing the processes as completely similar to that of the seventh embodiment as shown to FIG. 21G, a lower electrode wiring (a first electrode film) 411 processed using a pattern of lower electrode wiring BE and an $SiO_2$ film 417 implanted between each of the lower electrode wirings 411 are to be formed onto a base insulating film 415 on a semiconductor substrate 416, as shown in FIG. 33A. Moreover, a first bump electrode material 412 is to be formed thereunto, which is connected to a partial reason of a top surface of the lower electrode wiring 411, and comprised of a TiN film (an electrode film for a first bump electrode material).

Next, an $Al_2O_3$ film (a second insulating film) 423 is to be deposited using the spattering method with a thickness of 150 nm over the surface thereof. And then an open part (a second open part) 424 is to be formed for between the adjacent pattern of the $Al_2O_3$ film 423 as shown in FIG. 33B, by etching the $Al_2O_3$ film 423 with a resist as a mask (not shown in FIG. 33) patterned with an open part of pattern shape shown as the region WTE surrounded by the dashed line in FIG. 31, using the photolithography method.

Next, a $TiO_2$ film 425 is to be formed by thermal oxidation in an atmosphere including oxygen at a temperature of between 250 and 450° C. as one example for a variable resistor body formed by oxidizing an exposed apical part on a top surface of the first bump electrode material 412 at an inside of the open part 424, as shown in FIG. 33C.

Hereinafter, by performing the processes as similar to that as shown from FIG. 29C through FIG. 30G, a second bump electrode material 426 comprised of a TiN film (an electrode film for a second bump electrode material) along an inner side surface of the open part 424, an $SiO_2$ film (a second filler insulating film) 427 for filling the open part (the second open part) 424 formed on the variable resistor body 425 between the adjacent pair of the second bump electrode materials 426, an upper electrode wiring (a second electrode film) 428 and an interlayer insulating film 429 are to be formed, as shown in FIG. 33D. Thus, it becomes able to form a variable resistive element according to the modified example regarding the present embodiment.

Here, regarding the present embodiment, it is desirable to add a process for removing at least a partial region of the first bump electrode material 412 by patterning using the photolithography method and the etching method, which are retained at an arbitrary region except a memory cell array wherein none of the BE wirings are comprised, for preventing any adjacent pair of the BE wirings from shorting out due to the first bump electrode material 412 formed along the inside of the open part pattern WBE as shown in FIG. 23. Such the process may be added at any one of the steps after forming the first bump electrode material 412 but before the process as shown in FIG. 30E.

Moreover, according to the present embodiment regarding the process as shown in FIG. 30G, the second bump electrode material 420 are also etched to be removed in addition to the upper electrode wiring 414, for preventing any adjacent pair of the TE wirings from shorting out due to the second bump electrode material 420 formed along the inside of the open part pattern WTE as shown in FIG. 36. However, it may be also possible to etch only the upper electrode wiring 414 in the process for the upper electrode wiring, if at least a partial region of the second bump electrode material 420 is removed by patterning using the photolithography method and the etching method for example, which are retained at an arbitrary region except a memory cell array, wherein none of the TE wirings are comprised.

Further, according to the present embodiment, the bump electrode material formed by performing the processes as completely similar to that of the seventh embodiment as shown to FIG. 21G is to be the first bump electrode material, however, it is also possible to be easily a bump electrode material formed by performing the processes as completely similar to that of the second embodiment as shown to FIG. 11E. In such a case, an area of an electrically contributing region of a variable resistor body becomes to be two times larger than that of the region described with reference to FIG. 32 because the area is separated into two places. However, it becomes able to be unnecessary to add the above mentioned process for removing the first bump electrode material retained at an arbitrary region except a memory cell array, because the first bump electrode material is not formed along an inside of an open part pattern WBE.

The Tenth Embodiment

The tenth embodiment according to the present invention element and the present invention method (properly referred to as the present embodiment hereinafter) will be described in detail below with reference to FIG. 34 to FIG. 37. Here, a detailed description for a process which duplicates that of the first embodiment is properly omitted with mentioning that effect.

Figure 34:
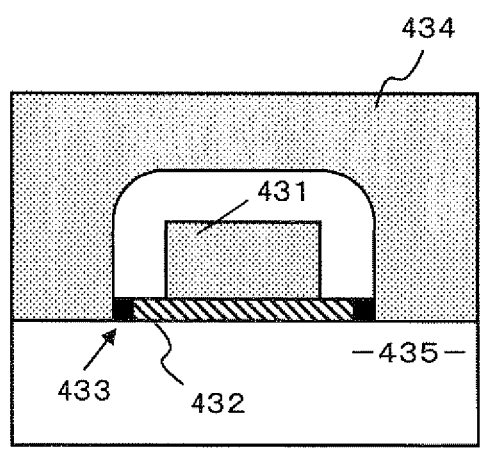
FIG. 34 is a brief cross sectional view showing a configuration of a variable resistive element according to the tenth embodiment of the present invention.

FIG. 34 is a cross sectional view showing the present invention element according to the present embodiment. The present invention element according to the present embodiment comprises a configuration that a lower electrode wiring 431 and an upper electrode wiring 434 are formed on a base substrate 435, and then a variable resistor body 433 as a memory material body is formed between the upper and the lower electrodes, wherein a bump electrode material 432 comprised of an electrically conductive material is connected to the lower electrode 431, and the variable resistor body 433 is formed on an apical part of the bump electrode material 432, as shown in FIG. 34. Moreover, different from the variable resistive element according to the above mentioned each of the embodiments, the bump electrode material 432 is to be extended in a plane parallel direction to the base substrate 435, and a contact surface between the variable resistor body 433 and the upper electrode film 434 is to be formed so as to be approximately perpendicular to the base substrate 435.

Next, the manufacturing method for a variable resistive element according to the present embodiment will be described in detail below, as an example for the case of applying to a memory cell of 1R type. FIG. 35 and FIG. 36 are views showing manufacturing processes for the present invention element according to the present embodiment, as shown by FIG. 35A to FIG. 36F in order of each manufacturing process (Those are separated into two views for convenience' sake due to page space). In FIG. 35 and FIG. 36, a cross sectional pattern diagram along the X-X' dashed line, that is to say, along the upper electrode wiring TE in FIG. 2 for showing the memory cell array of the 1R configuration, and a cross sectional pattern diagram along the Y-Y' dashed line therein, that is to say, along the lower electrode wiring BE are shown at the left side and the right side respectively therein.

First, a base insulating film 445 is to be formed on a semiconductor substrate 446 that peripheral circuits and the like (not shown) are properly formed. According to the present embodiment as well as the first embodiment, after depositing the BPSG film 445 with the film thickness of 1500 nm, a surface thereof is flattened by polishing the surface of the BPSG film 445 using the CMP method to be the thickness of 800 nm on a top surface of the semiconductor substrate 446. Next, a material film (an electrode film for a bump electrode material) 442 to be a bump electrode material, a material film (a first electrode film) 441 to be a lower electrode wiring, and then an SiO$_2$ film (a first insulating film) 447 are to be deposited in order thereon. According to the present embodiment, a TiN film 442 is to be deposited using the spattering method with a thickness of 20 nm for the material film to be the bump electrode material, and then for the material film 441 to be a lower electrode wiring, a Ti film of 5 nm thickness, a TiN film of 20 nm thickness, an AlCu film of 200 nm thickness, another Ti film of 5 nm thickness, and another TiN film of 100 nm thickness are to be deposited in order using the spattering method respectively, as the multilayer structure of TiN/Ti/Al—Cu/TiN/Ti. Moreover, the SiO$_2$ film 447 is to be deposited using the CVD method with the thickness of 150 nm thereunto. Next, a lower electrode wiring 441 is to be formed as shown in FIG. 35A, by etching the SiO$_2$ film 447 with a resist as a mask (not shown) patterned as the line and space (L/S) shape shown as the lower electrode wiring BE in FIG. 2, using the photolithography method, and by etching the material film 441 to be the lower electrode wiring using the SiO$_2$ film 447 as another mask thereafter.

Next, an SiO$_2$ film (a second insulating film) 448 is to be deposited using the CVD method with a thickness of 150 nm over the surface thereof.

Next, a process using the etch back is to be performed until the SiO$_2$ film 448 on the TiN film 442 is completely removed, as shown in FIG. 35C. The SiO$_2$ film 448 is retained as a sidewall spacer shape at a side surface of the lower electrode wiring 441 by such the process, that is, a sidewall film is to be formed.

Next, a bump electrode material 442 comprised of the TiN film and connected to the lower electrode wiring 441 is to be formed at a bottom part of the SiO$_2$ film 448 of the sidewall spacer shape, by etching the TiN film 442 with using the SiO$_2$ film 447 and the SiO$_2$ film 448 of the sidewall spacer shape as masks, as shown in FIG. 35D.

Next, a TiO$_2$ film 443 is to be formed by thermal oxidation in an atmosphere including oxygen at a temperature of between 250 and 450° C. as one example for a variable resistor body formed by oxidizing an exposed apical part of the bump electrode material 442 comprised of the TiN film, as shown in FIG. 36E. According to the present embodiment, the variable resistor body is to be the TiO$_2$ film, however, it is also possible to form a TiO$_{2-x}$N$_x$ film having a characteristic of variable electrical resistance by controlling properly an oxidation condition, such as an oxidation temperature, an oxygen concentration, or the like. Moreover, according to the present embodiment, the variable resistor body is formed by thermally oxidizing the bump electrode material, however, it may be available to use another oxidation method as well as the above mentioned other embodiments, such as the oxidation in the oxygen plasma, the ozone oxidation, or the like. Or, it may be also available to deposit directly onto a bump electrode material by using the CVD method or the spattering method.

Next, a material film (a second electrode film) 444 to be an upper electrode wiring is to be deposited over the surface thereof. According to the present embodiment, a TiN film of 20 nm thickness, an AlCu film of 200 nm thickness, a Ti film of 5 nm thickness, and another TiN film of 100 nm thickness are to be deposited in order using the spattering method respectively, as the multilayer structure of TIN/Ti/Al—Cu/TiN. Next, an upper electrode wiring 444 is to be formed by etching the material film 444 to be the upper electrode wiring with a resist as a mask (not shown) patterned as the line and space (L/S) shape shown as the upper electrode wiring TE in FIG. 2, using the photolithography method. Moreover, an interlayer insulating film 449 is to be deposited thereafter, and then a contact wiring (not shown) and a metal wiring (not shown) are to be formed for the upper electrode wiring 444 and the lower electrode wiring 441 respectively, as shown in FIG. 36F.

According to such the variable resistive element formed thereby, it becomes able to reduce an area of a contact surface between the variable resistor body and any of the electrodes compared with that of the conventional configurations. The following is a detailed description in this regard with reference to the drawings.

Figure 37A:
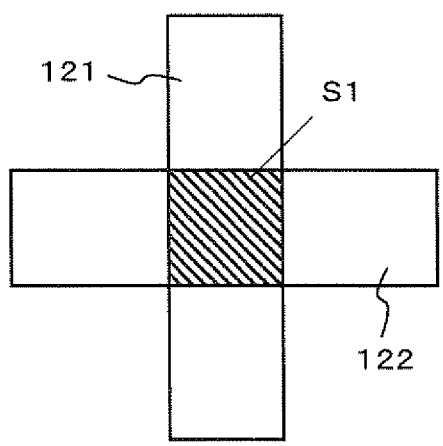
FIG. 37 is a plane pattern diagram showing an electrically contributing region of a variable resistor body according to a conventional configuration and the tenth embodiment of the present invention.
Figure 37B:
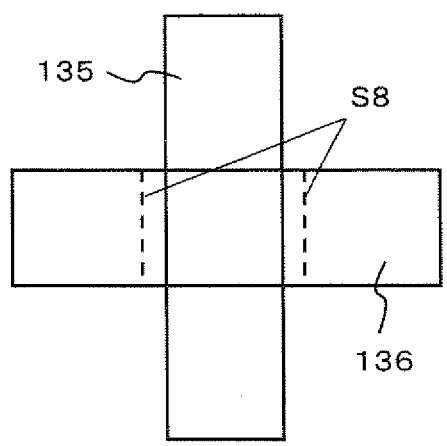

FIG. 37 is a plane pattern diagram of the variable resistive element according to the present embodiment compared with a variable resistive element of a conventional configuration. FIG. 37A shows the one of the conventional configuration, and FIG. 37B shows the configuration according to the present embodiment. Here, the configuration as shown in FIG. 37A is similar to that shown in FIG. 5A, FIG. 15A, FIG. 24A and FIG. 32A.

According to the variable resistive element regarding the present embodiment, there is provided a configuration in that the bump electrode material connected to the lower electrode wiring 135 is extended in a plane parallel direction to a position to be alienated outside with a distance of the film thickness of the sidewall shape for the insulating film 448 from an interface side for the lower electrode wiring 135, and then a region S8 (a shaded area in the figure) as a cross point region between such the bump electrode material and an upper electrode wiring 136 becomes to be an electrically contributing region of the variable resistor body. The region S8 in FIG. 37 has a linear shape with a width of at least the film thickness of the bump electrode material in a perpendicular direction to the page (in a vertical direction to the substrate surface), however, it is able to reduce an area of such the region compared with the region S1 regarding the conventional variable resistive element. Moreover, it is able to form the bump electrode material by using the self-aligned process, and then it is able to change arbitrarily such the area by controlling a thickness of a film to be deposited onto the base substrate. Further, it is possible to set such the film thickness thinner than the film thickness of the lower electrode wiring 135.

That is to say, it is able to reduce a contact area according to the configuration regarding the present embodiment compared with the contact area of the conventional configuration, as well as the configuration of the above mentioned each of the embodiments. Thus, it becomes able to reduce the current consumption, and it becomes possible to manufacture the memory element reproducibly with the stable switching operation without occurring the programming impossible, by configuring a nonvolatile memory device using such the element.

Here, according to the above mentioned present embodiment, there is described as one example for the case of applying to a variable resistive element comprising a memory cell of 1R type, however, it is also available to apply the variable resistive element according to the present invention to a memory cell of 1T/1R type. That is to say, it is possible to apply the variable resistive element easily to a memory cell of 1T/1R type, by pattering the insulating film 447 and the material film 441 to be the lower electrode wiring so as to be an isolated rectangular shape at the process as shown in FIG. 35A, by pattering the material film 444 to be the upper electrode wiring so as to be an isolated rectangular shape as well at the process as shown in FIG. 36F, and forming properly a selective transistor, a contact plug for electrically connecting to the lower electrode, and wirings, such as a source wiring, a bit wiring, or the like, in the memory cell, using the method as similar to that for the fifth embodiment.

Figure 37C:
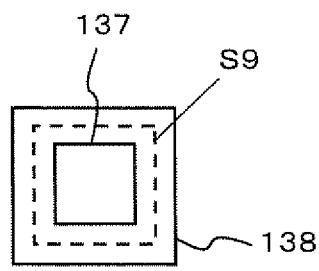

FIG. 37C is a plane pattern diagram showing a configuration to be applied to a variable resistive element comprising a memory cell of 1T/1R type. According to such the variable resistive element, there is provided a configuration in that the bump electrode material connected to a lower electrode wiring 137 of an isolated rectangular shape is extended in a plane parallel direction to a position to be alienated outside with the distance of the film thickness of the sidewall shape for the insulating film 448 from the lower electrode wiring 137, and then a region S9 (a shaded area in the figure) as a cross point region between such the bump electrode material and an upper electrode wiring 138 becomes to be an electrically contributing region of the variable resistor body. The region S9 in FIG. 37 is to be formed with an annular shape so as to surround the lower electrode, and has a width of at least the film thickness of the bump electrode material in a perpendicular direction to the page (in a vertical direction to the substrate surface). Moreover, it is able to form the bump electrode material by using the self-aligned process, and then it is able to change arbitrarily such the area by controlling a film thickness of a film to be deposited onto the base substrate. Further, it is possible to set such the film thickness thinner than the film thickness of the lower electrode wiring 137.

The Eleventh Embodiment

The eleventh embodiment according to the present invention element and the present invention method (properly referred to as the present embodiment hereinafter) will be described in detail below with reference to FIG. 38 to FIG. 41. Here, a detailed description for a process which duplicates that of the first embodiment is properly omitted with mentioning that effect.

Figure 38:
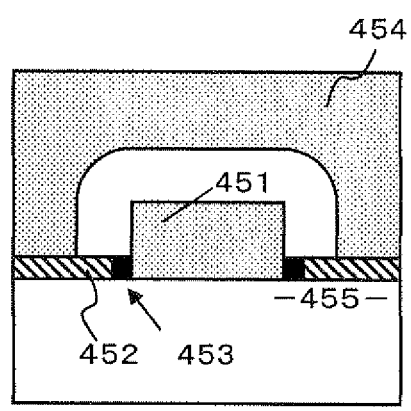
FIG. 38 is a brief cross sectional view showing a configuration of a variable resistive element according to the eleventh embodiment of the present invention.

FIG. 38 is a cross sectional view showing the present invention element according to the present embodiment. The present invention element according to the present embodiment comprises a configuration that a lower electrode wiring 451 and an upper electrode wiring 454 are formed on a base substrate 455, and then a variable resistor body 453 as a memory material body is formed between the upper and the lower electrodes, wherein a bump electrode material 452 comprised of an electrically conductive material is connected to the upper electrode 454, and the variable resistor body 453 is formed on an apical part of the bump electrode material 452, as shown in FIG. 38. Moreover, as well as the variable resistive element according to the tenth embodiment, the bump electrode material 452 is to be extended in a plane parallel direction to the base substrate 455, and a contact surface between the variable resistor body 453 and the lower electrode 451 is to be formed so as to be approximately perpendicular to the base substrate 455.

Next, the manufacturing method for a variable resistive element according to the present embodiment will be described in detail below, as an example for the case of applying to a memory cell of 1R type. FIG. 39 and FIG. 40 are views showing manufacturing processes for the present invention element according to the present embodiment, as shown by FIG. 39A to FIG. 40G in order of each manufacturing process (Those are separated into two views for convenience' sake due to page space). In FIG. 39 and FIG. 40, a cross sectional pattern diagram along the X-X' dashed line, that is to say, along the upper electrode wiring TE in FIG. 2 for showing the memory cell array of the 1R configuration, and a cross sectional pattern diagram along the Y-Y' dashed line therein, that is to say, along the lower electrode wiring BE are shown at the left side and the right side respectively therein. Moreover, FIG. 41 is a plane pattern diagram showing a pattern layout of a wiring pattern RBE to be used in a manufacturing process as shown in FIG. 39A.

First, a base insulating film 465 is to be formed on a semiconductor substrate 466 where peripheral circuits and the like (not shown) are properly formed. According to the present embodiment as well as the first embodiment, after depositing the BPSG film 465 with the film thickness of 1500 nm, a surface thereof is flattened by polishing the surface of the BPSG film 465 using the CMP method to be the thickness of 800 nm on a top surface of the semiconductor substrate 466. Next, a material film (an electrode film for a bump electrode material) 462 to be a bump electrode material, and then an SiN film (a dummy film) 467 are to be deposited in order thereupon. According to the present embodiment, a TiN film 462 is to be deposited using the spattering method with a thickness of 20 nm for the material film to be the bump electrode material, and then the SiN film 467 is to be deposited using the CVD method with a thickness of 300 nm thereunto.

Figure 41:
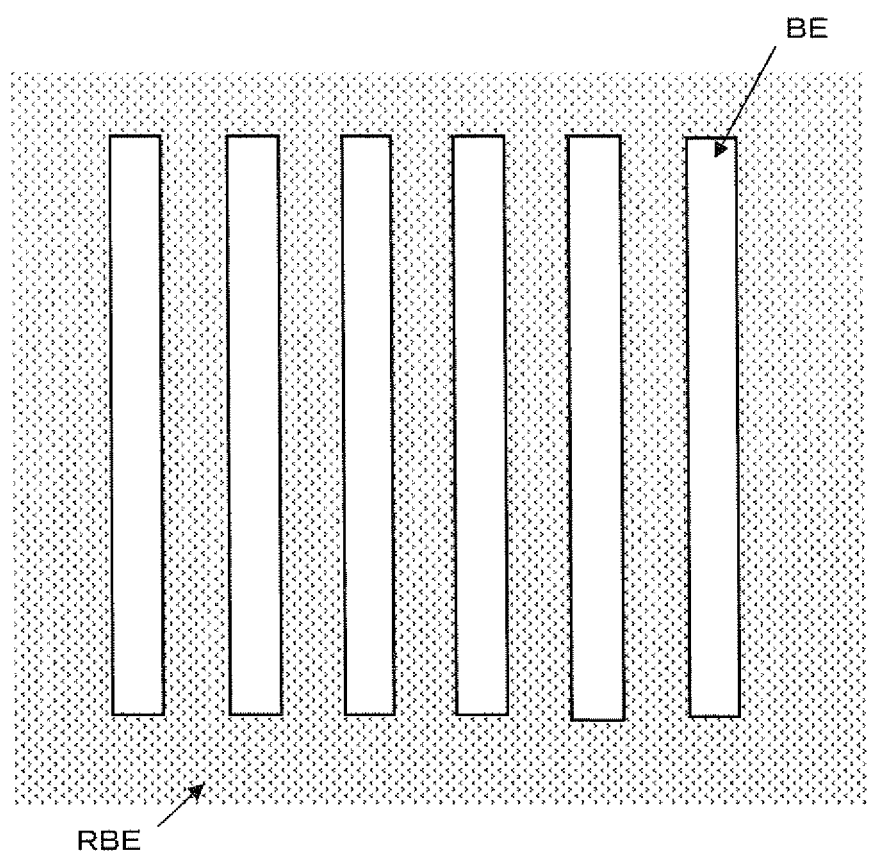
FIG. 41 is a plane pattern diagram showing a layout of a BE pattern regarding manufacturing processes of a variable resistive element according to the eleventh embodiment of the present invention.
Figure 42:
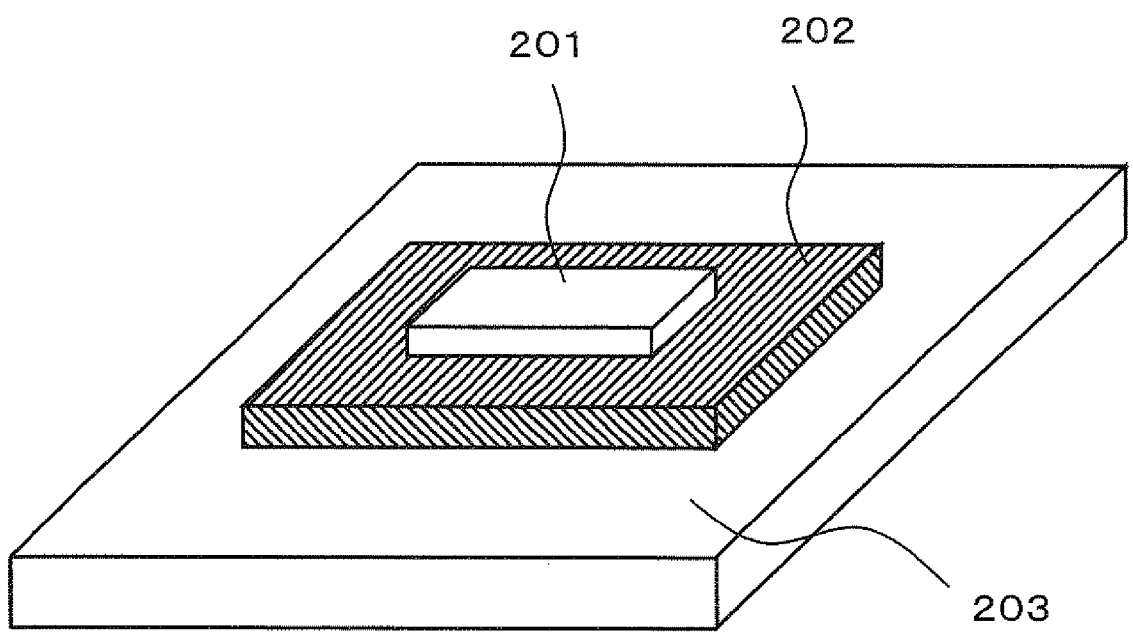
FIG. 42 is a diagrammatic perspective view showing a basic structure of a conventional variable resistive element.
Figure 43:
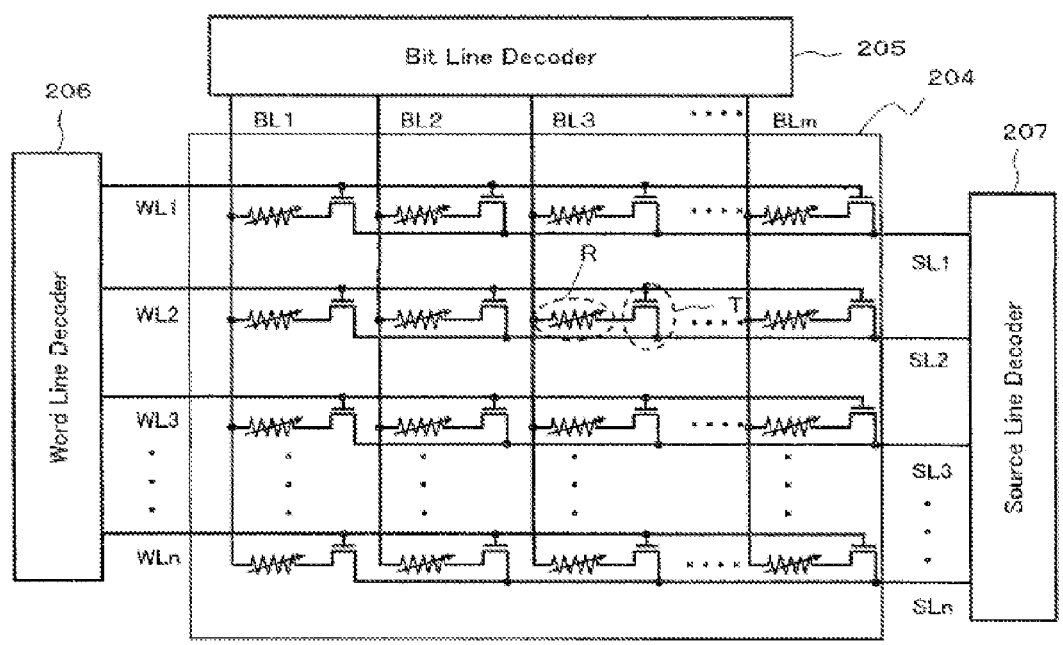
FIG. 43 is a circuit diagram schematically showing one configuration example of a memory cell array using memory cells of 1T/1R type comprising one selective transistor and one variable resistive element.
Figure 44:
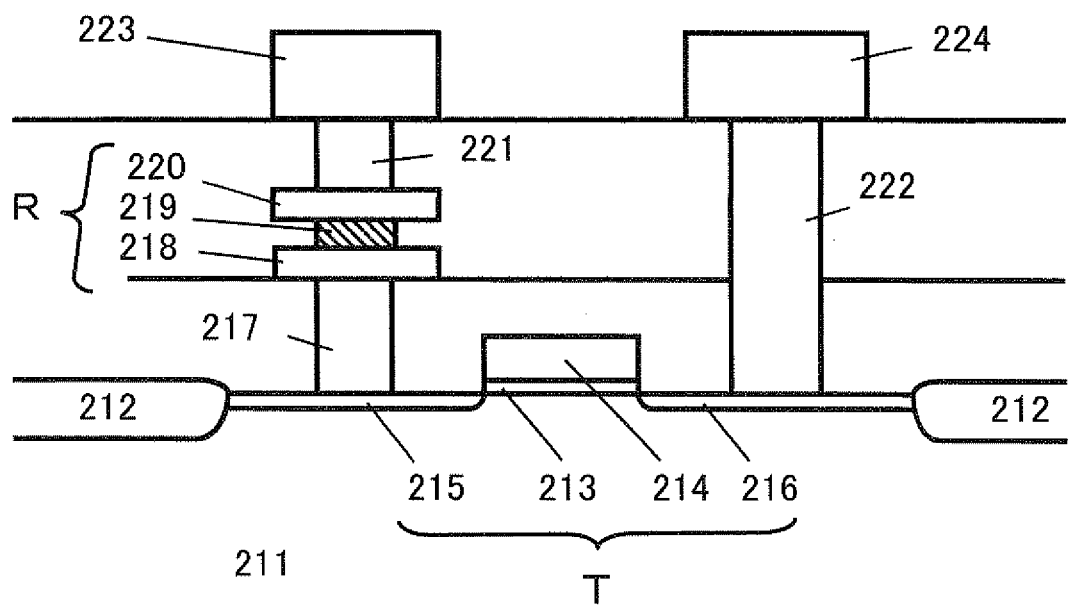
FIG. 44 is a cross sectional pattern diagram showing one configuration example of a conventional memory cell structure of 1T/1R type.
Figure 45:
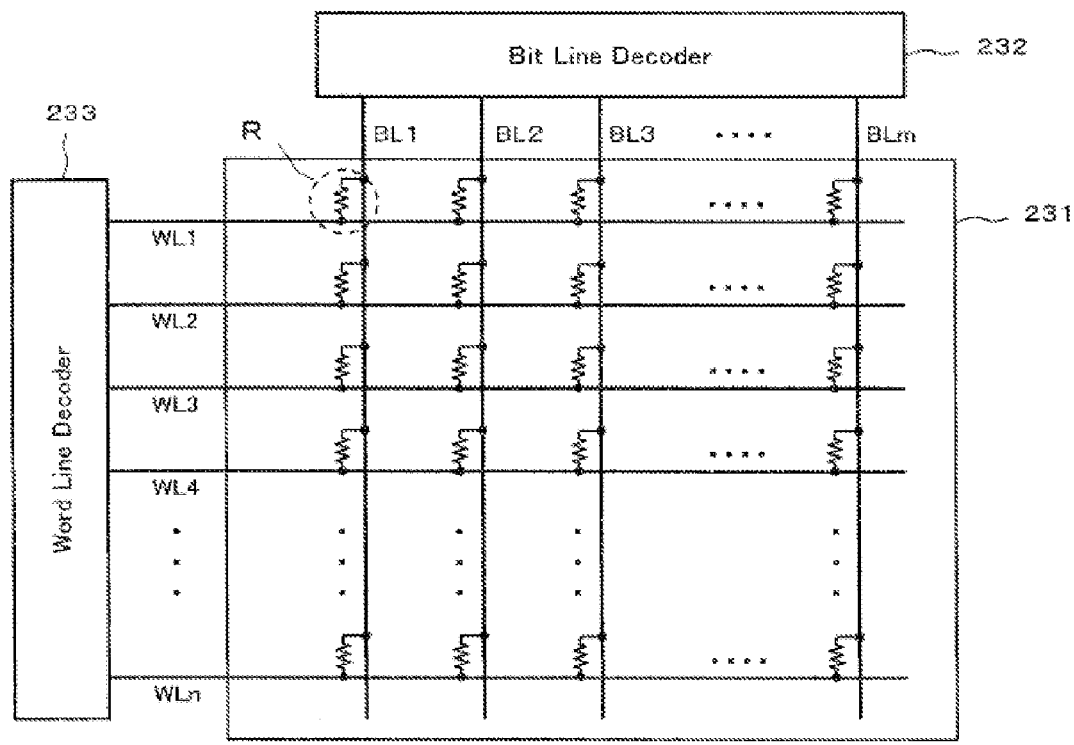
FIG. 45 is a circuit diagram schematically showing one configuration example of a memory cell array using memory cells of 1R type comprising one variable resistive element.
Figure 46:
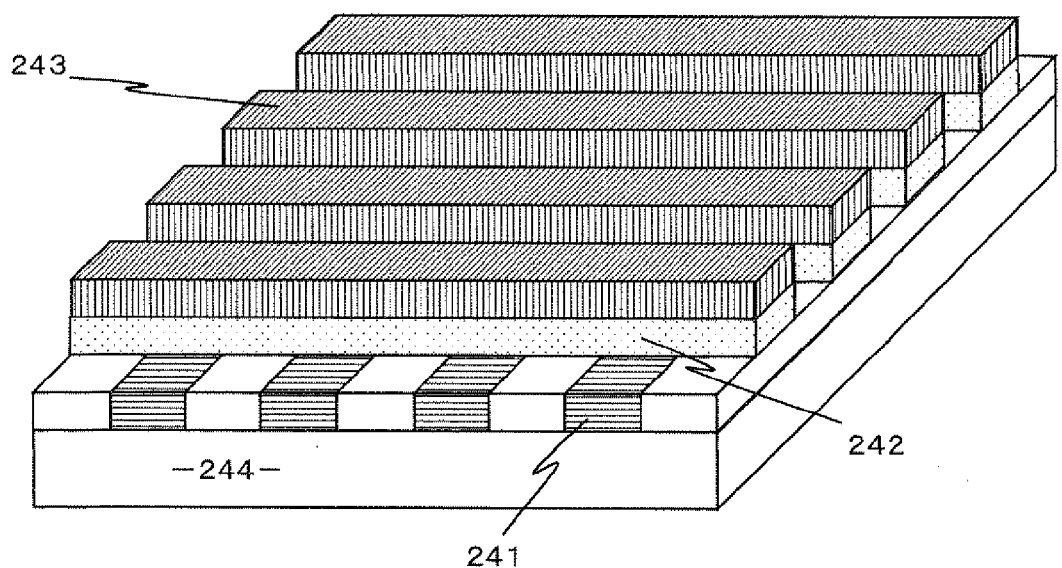
FIG. 46 is a diagrammatic perspective view schematically showing one configuration example of a conventional memory cell structure of 1R type.

Next, a bump electrode material 462 is to be formed as shown in FIG. 39A, by etching the SiN film 467 with a resist as a mask (not shown in FIG. 39) patterned as a wiring pattern RBE shown in FIG. 41, using the photolithography method, and by etching the TiN film 462 using the SiN film 467 as another mask thereafter. In FIG. 41, a BE pattern is the configuration as similar to that of the lower electrode wiring BE as shown in FIG. 2, and the wiring pattern RBE (a shadow area in the figure) is defined as a region where the BE pattern is reversed.

Next, a $TiO_2$ film 463 is to be formed by thermal oxidation in an atmosphere including oxygen at a temperature of between 250 and 450° C. as one example for a variable resistor body formed by oxidizing an exposed apical part of the bump electrode material 462 comprised of the TiN film. According to the present embodiment, the variable resistor body is to be the $TiO_2$ film, however, it is also possible to form a $TiO_{2-x}N_x$ film having a characteristic of variable electrical resistance by controlling properly an oxidation condition, such as an oxidation temperature, an oxygen concentration, or the like. Moreover, according to the present embodiment, the variable resistor body is formed by thermally oxidizing the bump electrode material, however, it may be available to use another oxidation method as well as the above mentioned other embodiments, such as the oxidation in the oxygen plasma, the ozone oxidation, or the like. Next, a material film (a first electrode film) 461 to be a lower electrode wiring is to be deposited thereafter, as shown in FIG. 39B. According to the present embodiment, a Ti film of 5 nm thickness, a TiN film of 20 nm thickness, an AlCu film of 200 nm thickness, another Ti film of 5 nm thickness, and another TiN film of 100 nm thickness are to be deposited in order using the spattering method respectively, as the multilayer structure of TiN/Ti/Al—Cu/TiN/Ti.

Next, a surface thereof is to be flattened by polishing the material film 461 to be a lower electrode wiring using the CMP method to a top surface level of the SiN film 467. Moreover, a lower electrode wiring 461 is to be formed by the etch back for the material film 461 to be the lower electrode wiring with reducing the film thickness thereof, and then a stepped part 468 is to be formed between the lower electrode wiring 461 and the SiN film 467, as shown in FIG. 39C. According to the present embodiment, the stepped part 468 with a height of 100 nm is to be formed, by etching further 100 nm after the surface thereof is to be flattened.

Next, an $SiO_2$ film (a first insulating film) 469 is to be deposited using the CVD method with a thickness of 600 nm over the surface thereof, as shown in FIG. 39D.

Next, the stepped part 468 is to be implanted and a surface thereof is to be flattened by polishing the $SiO_2$ film 469 using the CMP method to a top surface level of the SiN film 467, as shown in FIG. 40E.

Next, only the SiN film 467 is to be removed selectively for the $SiO_2$ film 469, the lower electrode wiring 441 and for the TiN film 462, by using the wet etching method with heated phosphoric acid, and an open part is to be formed. And then an $SiO_2$ film (a second insulating film) 470 of a sidewall spacer shape is to be formed at a side surface of the lower electrode wiring 461, as shown in FIG. 40F, by performing a process using the etch back, after depositing the $SiO_2$ film 470 using the CVD method with a thickness of 150 nm over the surface.

Next, a material film (a second electrode film) 464 to be an upper electrode wiring is to be deposited over the surface. According to the present embodiment, a TiN film of 20 nm thickness, an AlCu film of 200 nm thickness, a Ti film of 5 nm thickness, and another TiN film of 100 nm thickness are to be deposited in order using the spattering method respectively, as the multilayer structure of TiN/Ti/Al—Cu/TiN. Next, an upper electrode wiring 464 is to be formed by etching the material film 464 to be the upper electrode wiring and the bump electrode material 462 with a resist as a mask (not shown) patterned as the line and space (L/S) shape shown as the upper electrode wiring TE in FIG. 2, using the photolithography method. Moreover, an interlayer insulating film 471 is to be deposited thereafter, and then a contact wiring (not shown) and a metal wiring (not shown) are to be formed for the upper electrode wiring 464 and the lower electrode wiring 461 respectively, as shown in FIG. 40G.

According to the configuration regarding the present embodiment, it is able to form an electrically contributing region of the variable resistor body as a linear shape with a width of at least a film thickness of the bump electrode material, as well as that according to the tenth embodiment, and then it is able to reduce an area of such the region compared with that regarding the conventional variable resistive element. Moreover, it is able to form the bump electrode material by using the self-aligned process, and then it is able to change arbitrarily such the area by controlling a thickness of a film to be deposited onto the base substrate. Further, it is possible to set such the film thickness thinner than the film thickness of the lower electrode wiring.

That is to say, it is able to reduce a contact area according to the configuration regarding the present embodiment compared with the contact area of the conventional configuration, as well as the configuration of the above mentioned each of the embodiments. Thus, it becomes able to reduce the current consumption, and it becomes possible to manufacture the memory element reproducibly with the stable switching operation without occurring the programming impossible, by configuring a nonvolatile memory device using such the element.

According to the present embodiment, the dummy film 467 is to be the SiN film, however, it is not limited thereto, and it may be also available to use any other material films properly. Moreover, such the dummy film is not required to be the insulating material film because it is to be removed in the manufacturing process, and it may be an electrically conductive material film as well. However, it is desirable to use a material which can be removed by etching selectively for the insulating film 469, the lower electrode wiring 461 and for the bump electrode material 462. Moreover, such the selective etching is to be the wet etching by using the acid treatment according to the present embodiment, however, the present invention is not limited thereto.

Moreover, according to the above mentioned present embodiment, there is described as an example for the case of applying to a variable resistive element comprising a memory cell of 1R type, however, it may be also available to apply the variable resistive element according to the present invention to a memory cell of 1T/1R type.

Thus, according to the present invention element described following the first to the eleventh embodiments, it is not necessary to reduce the line width of the upper electrode or of the lower electrode, because there is provided the configuration in that the area of the electrically contributing region of the variable resistor body is to be reduced by using the bump electrode material to be connected to the upper electrode or the lower electrode. And then according to the present invention element, it becomes able to avoid the problem that the wiring resistance of the upper electrode or of the lower electrode is increased, which may occur in the case of solving the conventional problems by reducing the line width of the upper electrode or of the lower electrode beyond a limitation of an exposure technology using some sort of method. This indicates that the present invention element is more effective for the memory cell array configuration of 1R type, wherein it is required to comprise a longer electrode wiring length corresponding to an integration of more memory cells.

Moreover, according to the present invention element, it becomes able to avoid the problem that the wiring resistance of the upper electrode or of the lower electrode is increased, which may occur in the case of solving the conventional problems by forming the film thickness thinner for the upper electrode or for the lower electrode and by using only the side surface thereof using some sort of method. This indicates by the same token that the present invention element is more effective for the memory cell array configuration of 1R type, wherein it is required to comprise the longer electrode wiring length corresponding to the integration of more memory cells.

As above mentioned, according to the variable resistive element and its manufacturing method of the present invention, it is able to form a variable resistor body film by a thermal processing step of oxidation as a general process in manufacturing processes for semiconductor, and then it is not required a particular equipment for such a deposition thereof, because it is able to select a transition metal or a nitride of a transition metal element for a material film for a bump electrode material, and then because it is able to use an oxide of the transition metal element or an oxynitride of the transition metal element formed by oxidizing one end part thereof respectively as a variable resistor body. Moreover, a matching property with an existing CMOS process is high, and then it is easy to manufacture thereof, because any novel metal is not necessarily required as the material film for a bump electrode material.

Moreover, there is obtained an advantage that it becomes easy for designing processes with using a titanium based material which has been conventionally used in general purpose in semiconductor processes, by choosing a titanium nitride for a material film of the above mentioned bump electrode material, and by choosing a titanium oxide or a titanium oxynitride as an oxide material or an oxynitride material of such the material film for the variable resistor body.

Further, there is obtained an advantage of reducing the fluctuation in resistance value regarding the variable resistor body, as an additional function according to the present invention. It may be inferable that an effect from a local filament part in the variable resistor is cleared away according to the variable resistive element regarding the present invention, by reducing the area of the electrically contributing region of the variable resistor body, and then that the fluctuation may be improved because an intrinsic property (a property inherent to the film) of the variable resistor appears thereby, compared with the conventional variable resistive element in that such the local filament part effects dominantly for the variation in resistance value, as described in the nonpatent document 2. Thus, it becomes possible to control a variation in resistance value within a further smaller range for the resistance value according to the variable resistive element regarding the present invention.

Still further, according to the above mentioned each of the embodiments regarding the present invention, there is described the electrically contributing region of the variable resistor body based on the expression "linear shape" or "annular shape", however, these are not strictly limited as a linear shape or a rectangular annular shape respectively. That is to say, it is also possible to modify using such as a curve, a polygonal line, combination of those, or the like, instead of a straight line. And even in a case of using a half circle, a U-shape, or a letter "L" shape, if it is a configuration for reducing an area of an electrically contributing region of a variable resistor body, the effectiveness of the present invention is not negatively influenced thereby. Or, it may be also available to use a round shape or a shape of an ellipse instead of the rectangular annular shape, or a polygon instead of a quadrangle, and then it is also possible to modify such the annular shape to be configured with a polygonal line or a curve.

Furthermore, according to the above mentioned each of the embodiments regarding the present invention, a control element in the memory cell of 1T/1R type is to be a MOS transistor, however, even if it is to be another control element, such as a diode element or the like, it does not hinder at all the application of the variable resistive element according to the present invention. Moreover, it is also possible to be a memory cell comprising a configuration in that diodes are to be series connected to a cross point structure region, for reducing a parasitic current in the memory cell of 1R type. Such the diode generally has a structure in which it is connected to a variable resistor body as a memory material body in series outside of an upper electrode or of a lower electrode, however, it may be also available to be a configuration in that a diode is to be arranged between a variable resistor body and an upper electrode, or between a variable resistor body and a lower electrode. Further, it is available for a diode to use a material exhibiting such as a PN diode characteristic or a Schottky diode characteristic, a varistor of such as ZnO or $Bi_2O_3$, or the like.

Here, according to the above mentioned each of the embodiments regarding the present invention, there is described using the TiN film for the electrically conductive material as the bump electrode material, however, it is not limited thereto. For example, a transition metal of such as Ti, Ni, Zn, V, Nb, or the like, is to be used for a bump electrode material, and then it is available to use an oxide of the transition metal element formed by oxidizing one apical part thereof, for a variable resistor body. Moreover, a nitride of a transition metal element as electrically conductive, such as ZnN, WN, or the like, is to be used for a bump electrode material, and then it is available to use an oxide of the transition metal element or an oxynitride of the transition metal element formed by oxidizing one apical part thereof, for a variable resistor body.

Further, in addition to such the materials, a novel metal of such as Pt, Ir, Ru, Os, Rh, Pd, or the like, a metal element of such as Al or the like, or other sort of alloys may be also available for a material film for a bump electrode material. However, it is required to form a variable resistor body by using a deposition method for such the metal materials. Therefore, it is more preferable to use the above mentioned transition metal or the nitride of the transition metal element as electrically conductive for a material film for a bump electrode material, for leveraging an advantage as one aspect according to the present invention that a variable resistor body is to be formed by oxidizing one apical part of a bump electrode material.

Still further, according to the above mentioned each of the embodiments regarding the present invention, the variable resistor body is to be the TiO$_2$ film, however, a variable resistor body film is not limited thereto. For example, it is able to use an oxide of other transition metal elements or an oxynitride of other transition metal elements formed by oxidizing respectively the above mentioned transition metals or nitrides of the transition metal elements except the Ti and the TiN. Or, it is also available to form a perovskite-type oxide of such as the PCMO film or the like directly onto a bump electrode material.

Still further, according to the above mentioned each of the embodiments regarding the present invention, the upper electrode and the lower electrode are to be the TiN film, or the film of multilayer structure comprised of the TiN film, Ti film and the Al—Cu film, however, it is not limited thereto. For example, it is possible to select arbitrarily from other transition metals, an alloy including such the elements, a novel metal of such as Pt, Ir, Ru, Os, Rh, Pd, or the like, a metal element of such as Al or the like, or other sort of alloys and the like.

Furthermore, according to the above mentioned each of the embodiments regarding the present invention, there is described such as the titanium nitride is to be the TiN, the titanium oxide is to be the TiO$_2$, the titanium oxynitride is to be the TiO$_{2-x}$N$_x$, or the like, however, such the description is an abbreviation, and a composition ratio for each of the elements is not exactly defined thereby. In particular, the titanium oxide and the titanium oxynitride can be applied as a variable resistor body to the present invention, as long as they comprise a composition ratio for a variable resistance property therein. Furthermore, each of the described dimensions is one example for describing the manufacturing processes according to each of the embodiments, and it is not limited to such the dimensions.

Industrial Applicability

The variable resistive element and its manufacturing method according to the present invention are applicable to a nonvolatile semiconductor memory device.

The invention claimed is:

1. A variable resistive element comprising:
   a variable resistor body provided between two electrodes, in which an electrical resistance of between the two electrodes is changed by applying a voltage pulse between the two electrodes; and
   a bump electrode material making contact with either one of the two electrodes and extending toward the other one of the two electrodes, wherein
   the bump electrode material is extended along a sidewall of an insulating film formed between the two electrodes, and formed so as to project toward the other one of the two electrodes with an annular or a plurally-separated linear shape,
   the variable resistor body is formed between a projecting portion of the bump electrode material and the other one of the two electrodes, and
   has an annular or a plurally-separated linear shape depending on a shape of the bump electrode material,
   wherein the overall shape of the variable resistor body is annular or a plurally-separated linear shape; and
   the variable resistor body consists of a material formed by oxidizing the bump electrode material.

2. The variable resistive element according to claim 1, wherein the insulating film is formed on a lower electrode of the two electrodes, and the bump electrode material is extended along an outer sidewall of the insulating film.

3. The variable resistive element according to claim 1, wherein a lower electrode as an electrode formed at a lower region regarding the two electrodes is a diffusion layer formed on a semiconductor substrate.

4. The variable resistive element according to claim 1, wherein the bump electrode material is formed using a transition metal or a nitride of a transition metal element.

5. The variable resistive element according to claim 1, wherein the bump electrode material is a titanium nitride.

6. The variable resistive element according to claim 1, wherein the variable resistor body is formed by oxidizing a part of the bump electrode material.

7. The variable resistive element according to claim 1, wherein the variable resistor body is formed of an oxide of a transition metal element or an oxynitride of a transition metal element.

8. The variable resistive element according to claim 7, wherein the variable resistor body is a titanium oxide or a titanium oxynitride.

9. A manufacturing method for a variable resistive element, the variable resistive element according to claim 1, the method comprising:
   a first step of forming a lower electrode as an electrode to be formed at a lower region regarding the two electrodes by depositing an electrode material onto a substrate to form a first electrode film;
   a second step of forming a first insulating film on the lower electrode, the first insulating film having an open part reaching a top surface of the lower electrode;
   a third step of forming a bump electrode material contacting to at least a partial region of the lower electrode and extending upward along an inner sidewall of the open part formed at the second step;
   a fourth step of forming the variable resistor body at an apical part of the bump electrode material by oxidizing an exposed part of the bump electrode material; and
   a fifth step of forming an upper electrode as an electrode to be formed at an upper region regarding the two electrodes by depositing an electrode material to form a second electrode film.

10. The manufacturing method according to claim 9, wherein the third step comprises steps of:
    forming an electrode film for a bump electrode material by depositing an electrically conductive material onto the open part and the first insulating film;
    depositing a third insulating film onto the electrode film for the bump electrode material;
    removing the third insulating film until a top surface of the electrode film for the bump electrode material is exposed; and forming the bump electrode material connecting to the lower electrode inside the open part by removing the electrode film for the bump electrode material layered at a region other than a region on the open part.

11. The manufacturing method according to claim 9, wherein the third step further comprises:
    a sixth step of forming an electrode film for a bump electrode material by depositing an electrically conductive material onto the open part and the first insulating film; and a step of forming the bump electrode material along a sidewall of the open part by removing the electrode film for the bump electrode material layered on the first insulating film.

12. The manufacturing method according to claim 11, wherein the sixth step includes depositing the electrode film for the bump electrode material inside the open part so that a film thickness of the electrode film for the bump electrode material becomes thinner toward a top surface of the lower electrode.

13. The manufacturing method according to claim 12, wherein
the fourth step comprises a step of forming a third insulating film on the open part and the first insulating film, and the step of forming the third insulating film includes forming the variable resistor body by oxidizing a region of the bump electrode material formed along the sidewall of the open part at the third step, the region having a thin film thickness in a vicinity of a top surface of the lower electrode.

14. The manufacturing method according to claim 9, further comprising a step of forming the variable resistor body by forming the bump electrode material and depositing a variable resistor body material onto at least the bump electrode material to form a variable resistor body film.

15. The manufacturing method according to claim 9, further comprising a step of forming the variable resistor body by forming the bump electrode material and oxidizing an exposed part of the bump electrode material.

16. The manufacturing method according to claim 9, wherein the bump electrode material is a titanium nitride.

17. The manufacturing method according to claim 9, wherein the variable resistor body is a titanium oxide or a titanium oxynitride.

18. A manufacturing method for a variable resistive element, the variable resistive element according to claim 1, the method comprising:
a first step of forming a lower electrode as an electrode to be formed at a lower region regarding the two electrodes by depositing a first electrode film, which is to be the lower electrode, onto a substrate, by depositing a first insulating film onto the first electrode film, and by processing the first electrode film and the first insulating film;
a second step of forming a bump electrode material contacting to at least a partial region of the lower electrode and extending upward along an outer sidewall of the lower electrode and an outer sidewall of the first insulating film;
a third step of forming the variable resistor body at an apical part of the bump electrode material; and a fourth step of forming an upper electrode as an electrode to be formed at an upper region regarding the two electrodes by depositing an electrode material to layer a second electrode film.

19. The manufacturing method according to claim 18, wherein the second step comprises steps of:
forming an electrode film for a bump electrode material by depositing an electrically conductive material over a whole surface including a top surface of the first insulating film; and
forming the bump electrode material along the outer sidewall of the first electrode film and the outer sidewall of the first insulating film by removing the electrode film for the bump electrode material formed at a region other than the outer sidewall of the first electrode film and the outer sidewall of the first insulating film.

20. The manufacturing method according to claim 18, wherein the third step comprises steps of:
depositing a second insulating film over a whole surface including a top surface of the first insulating film; and
flattening a second insulating film until a top surface of the electrode film for the bump electrode material is exposed.

21. The variable resistive element according to claim 1, wherein the annular or the plurally-separated linear shaped part of the variable resistor body contacts with the other one of the two electrodes directly or indirectly via a diode.

* * * * *

UNITED STATES PATENT AND TRADEMARK OFFICE
CERTIFICATE OF CORRECTION

PATENT NO.         : 8,497,492 B2
APPLICATION NO.    : 12/298818
DATED              : July 30, 2013
INVENTOR(S)        : Hosoi et al.

Page 1 of 1

It is certified that error appears in the above-identified patent and that said Letters Patent is hereby corrected as shown below:

On Title Page 2, Item (56), under "OTHER PUBLICATIONS", in Column 2, Line 1, delete "Electic" and insert -- Electric --, therefor.

In the Specification

In Column 30, Line 9, delete "thickness of nm" and insert -- thickness of 1200 nm --, therefor.

In Column 32, Line 35, delete "TiN film along" and insert -- TiN film 312 along --, therefor.

In Column 37, Line 1, delete "resistor body" and insert -- resistor body 343 --, therefor.

Signed and Sealed this
Twenty-sixth Day of August, 2014

Michelle K. Lee
*Deputy Director of the United States Patent and Trademark Office*